(12) United States Patent
Kumar et al.

(10) Patent No.: US 12,174,530 B1
(45) Date of Patent: Dec. 24, 2024

(54) NANO-PATTERNING METHODS INCLUDING: (1) PATTERNING OF NANOPHOTONIC STRUCTURES AT OPTICAL FIBER TIP FOR REFRACTIVE INDEX SENSING AND (2) PLASMONIC CRYSTAL INCORPORATING GRAPHENE OXIDE GAS SENSOR FOR DETECTION OF VOLATILE ORGANIC COMPOUNDS

(71) Applicant: Iowa State University Research Foundation, Inc., Ames, IA (US)

(72) Inventors: Ratnesh Kumar, Ames, IA (US);
Shawana Tabassum, Ames, IA (US);
Liang Dong, Ames, IA (US)

(73) Assignee: Iowa State University Research Foundation, Inc., Ames, IA (US)

( * ) Notice: Subject to any disclaimer, the term of this patent is extended or adjusted under 35 U.S.C. 154(b) by 688 days.

(21) Appl. No.: 16/946,028

(22) Filed: Jun. 3, 2020

Related U.S. Application Data

(62) Division of application No. 15/791,174, filed on Oct. 23, 2017, now Pat. No. 10,725,373.
(Continued)

(51) Int. Cl.
*G03F 7/00* (2006.01)
*B29C 41/42* (2006.01)
(Continued)

(52) U.S. Cl.
CPC ............ *G03F 7/0002* (2013.01); *B29C 41/42* (2013.01); *G02B 1/02* (2013.01); *G02B 1/045* (2013.01);
(Continued)

(58) Field of Classification Search
CPC .... G03F 7/0002; G03F 7/2012; G03F 7/2014; B29C 41/42; G02B 1/02; G02B 1/045; H01L 21/027
See application file for complete search history.

(56) References Cited

U.S. PATENT DOCUMENTS 9,861,710 B1    1/2018  Ruckh et al.
2006/0292033 A1*  12/2006  Blok ................... G01N 27/126
                                                    422/504
(Continued)

FOREIGN PATENT DOCUMENTS

EP         2720027 A1 *  4/2014  ......... G01N 21/7743
WO   WO-2008018923 A2 *  2/2008  ......... B81C 1/00031

OTHER PUBLICATIONS

Hernaez et al, Jan. 14, 2017, Optical Fibre Sensors Using Graphene-Based Materials: A Review; Sensors (Year: 2017).*
(Continued)

*Primary Examiner* — Nathan L Van Sell
(74) *Attorney, Agent, or Firm* — McKee, Voorhees & Sease, PLC

(57) ABSTRACT

A technique, and its applications, for high resolution, rapid, and simple nanopatterning. The general method has been demonstrated in several forms and applications. One is patterning nanophotonic structures at an optical fiber tip for refractive index sensing. Another is patterning nanoresonator structures on a sensor substrate for plasmonic effect related detection of VOCs. In the latter example, a graphene oxide coated plasmonic crystal as a gas sensor capable of identifying different gas species using an array of such structures. By coating the surface of multiple identical plasmonic crystals with different thicknesses of Graphene-Oxide (GO) layer, the effective refractive index of the GO layer on each plasmonic crystal is differently modulated
(Continued)

Figure 1:
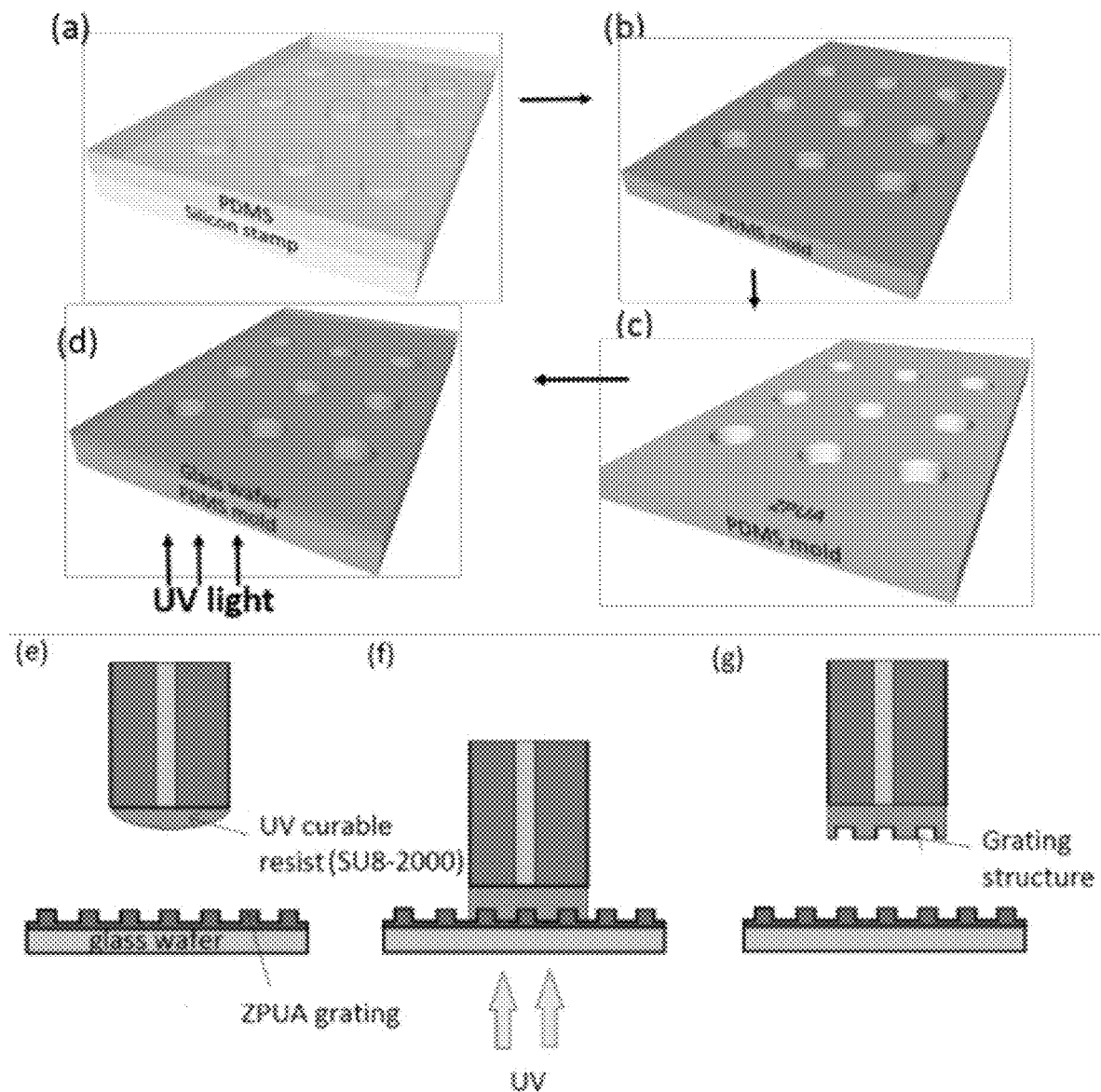

when exposed to a specific gas. Identification of various gas species is accomplished using pattern recognition algorithm.

13 Claims, 24 Drawing Sheets
(22 of 24 Drawing Sheet(s) Filed in Color)

Related U.S. Application Data

(60) Provisional application No. 62/411,402, filed on Oct. 21, 2016.

(51) Int. Cl.
*G02B 1/02* (2006.01)
*G02B 1/04* (2006.01)
*G03F 7/20* (2006.01)
*H01L 21/027* (2006.01)

(52) U.S. Cl.
CPC .......... *G03F 7/2012* (2013.01); *G03F 7/2014* (2013.01); *H01L 21/027* (2013.01)

(56) References Cited

U.S. PATENT DOCUMENTS

| | | | |
|---|---|---|---|
| 2008/0014632 A1* | 1/2008 | Cunningham | G01N 33/552 435/288.7 |
| 2009/0067774 A1* | 3/2009 | Magnusson | B82Y 20/00 385/10 |
| 2009/0166903 A1 | 7/2009 | Kim et al. | |
| 2009/0264317 A1 | 10/2009 | Ofir et al. | |
| 2009/0281250 A1 | 11/2009 | DeSimone et al. | |
| 2009/0325816 A1 | 12/2009 | Mirkin et al. | |
| 2010/0221847 A1 | 9/2010 | Cunningham et al. | |
| 2011/0039033 A1 | 2/2011 | Merschrod et al. | |
| 2011/0182805 A1 | 7/2011 | DeSimone et al. | |
| 2011/0210468 A1 | 9/2011 | Shannon et al. | |
| 2012/0288227 A1* | 11/2012 | Kim | G01N 21/7703 427/535 |
| 2013/0148194 A1* | 6/2013 | Altug | G01N 21/658 977/932 |
| 2014/0038849 A1 | 2/2014 | Mirkin et al. | |
| 2014/0070082 A1 | 3/2014 | Guo et al. | |
| 2014/0318596 A1* | 10/2014 | Juluri | H01L 31/022466 136/255 |
| 2015/0272903 A1 | 10/2015 | Amsden et al. | |
| 2015/0369744 A1* | 12/2015 | Yang | B82Y 40/00 356/301 |
| 2016/0231233 A1* | 8/2016 | Wang | G01N 21/554 |
| 2018/0274026 A1 | 9/2018 | Brown et al. | |

OTHER PUBLICATIONS

Anker et al., "Biosensing with plasmonic nanosensors", Nature Materials, vol. 7, pp. 442-453, Jun. 2008.

Hagleitner et al., "Smart single-chip gas sensor microsystem", Nature, vol. 414, pp. 293-296, Nov. 2001.

Patel et al., "Chemicapacitive microsensors for volatile organic compound detection", Sensors and Actuators B, vol. 96, pp. 541-553, Jul. 22, 2003.

Tabassum et al., "Patterning of nanophotonic structures at optical fiber tip for refractive index sensing", 2016 IEEE Sensors conference, Orlando, FL, 4 pages, date of conference Oct. 30, 2016.

Tabassum et al., "Plasmonic Crystal Gas Sensor Incorporating Graphene Oxide for Detection of Volatile Organic Compounds", MEMS Conference, Shanghai, China, 4 pages, date of conference Jan. 24, 2016.

Tabassum et al., "Plasmonic Crystal Gas Sensor Incorporating Graphene Oxide for Detection of Volatile Organic Compounds", 4.07 Gas and Chemical Sensors, MEMS Conference, Shanghai, China, 2 pages, date of conference Jan. 24, 2016.

* cited by examiner

NANO-PATTERNING METHODS INCLUDING: (1) PATTERNING OF NANOPHOTONIC STRUCTURES AT OPTICAL FIBER TIP FOR REFRACTIVE INDEX SENSING AND (2) PLASMONIC CRYSTAL INCORPORATING GRAPHENE OXIDE GAS SENSOR FOR DETECTION OF VOLATILE ORGANIC COMPOUNDS

CROSS-REFERENCE TO RELATED APPLICATIONS

This is a divisional application of U.S. Ser. No. 15/791,174 filed on Oct. 23, 2017, which claims the benefit of U.S. provisional application Ser. No. 62/411,402, filed Oct 21, 2016, which are herein incorporated by reference in their entireties.

GOVERNMENT RIGHTS CLAUSE

This invention was made with Government support under Grant Number CCF1331390 awarded by the National Science Foundation. The government has certain rights in the invention.

I. BACKGROUND OF THE INVENTION

A. Field of the Invention

The present invention relates to nano-patterning and graphene oxide (GO) layering on functional surfaces and devices including improved fabrication methods and applications.

In one non-limiting example, the patterning is at the tip of an optic fiber for waveguide and remote sensing functionalities in gaseous, e.g., volatile organic compounds (VOCs) or aqueous medium. The absorbed VOCs on the GO layer, alter the guided mode resonance leading to detection.

In another non-limiting example, the patterning is a sensor and, in particular, relates to detection of volatile organic compounds (VOCs) and, in further particular, to methods and apparatus utilizing graphene oxide layer to absorb gas-phase unknowns and use surface plasmon resonance techniques to detect the presence of even minute quantities of one or more target VOCs, and includes techniques of fabricating such sensors.

B. Problems in the State of the Art

The ability to create high-resolution nanopatterns on surfaces or devices is highly desirable. Yet the minute scale provides significant challenges to that goal. Room for improvement in this area of technology exists.

One example is in the area of optical fibers. The potential benefits of being able to fabricate high resolution nanopatterns on cross-sectional surfaces of optical fibers opens up many possibilities in the context of remote sensing. However, reported attempts can be complex and resource intensive.

Another example relates to chemical detection. Gas phase chemical detection has been researched based on many sensing mechanisms, such as electrical conductance change (B. Bott et al. 1984); sensor bending due to change in surface stress (H. P. Lang et al. 1998); resonant frequency shift due to gas absorption at carbon nanotube wall (S. Chopra et al. 2002); and resonance frequency shift of mechanical components due to absorbing analyte gases by the sensing material (C. Hagleitner et al. 2001).

Plasmonic structures have been used in liquid phase biological and chemical detection (J. N. Anker et al. 2008), where the optical resonance frequency of the plasmonic structure shifts due to specific binding between receptor and specific analyte molecules.

Using plasmonic structures for sensing of gases can be possible by using suitable adsorption materials capable of providing large changes in refractive index when responding to subtle concentration variations of a target gas.

II. SUMMARY OF INVENTION

The invention includes techniques of nanopatterning that can be less complex as well as high resolution and rapid. It also can be utilized to create nanopatterns for a variety of applications.

A first aspect of the invention patterns nanostructures on the cleaved facet of an optical fiber. The technique can result in a guided mode resonant (GMR) device. One use is in remote sensing based on refractive index changes for presence of subtle concentrations of analytes at the fiber tip. A fabrication technique allows the designer flexibility in the form factor of the nanostructures and spacing over the pattern to tune the pattern for refractive index modulation with different detection devices. Non-limiting examples are diffraction gratings, photonic crystals, and nanophotonic resonators. The fabrication technique is a simple, efficient way to inscribe high resolution nanophotonic patterns on cleaved facets of optical fiber using UV assisted nanoimprinting lithography.

Another aspect of the invention patterns a silica wafer surface. We have developed a graphene oxide (GO) coated plasmonic crystal as a gas sensor capable of identifying different gas species using an array of such structures. By coating the surface of multiple identical plasmonic crystals with different thicknesses of GO layer, the effective refractive index of the GO layer on each plasmonic crystal is differently modulated when exposed to a specific gas. Identification of various gas species is accomplished using a pattern recognition algorithm. A fabrication technique allows the designer flexibility in the form factor of the nanostructures and spacing over the pattern in combination with selective of coating surfaces to detect different species in gaseous/aqueous form through tuning of refractive index via design of the nanostructure and its modulation under exposure to varying concentrations of species. The fabrication technique is a simple, efficient way to produce high resolution nanophotonic patterns on a silica wafer surface using UV assisted nanoimprinting lithography, and uses GO or other gaseous/aqueous specific coatings to absorb the species of interest and uses surface plasmon resonance to detect it. We have incorporated GO to a nanopatterned GMR and plasmonic structures to make it suited to gas sensing. GO, due to their exceptional optical, electrical, chemical properties, and high surface-area-to-volume ratio, enables sensing of subtle concentration of gases.

A. Objects, Features, Aspects and Advantages

A principle object, feature, aspect, or advantage of the present invention is methods, apparatus, and systems for nanopatterning that is high resolution and rapid, and which improves over or solves problems and deficiencies in the state of the art.

Another aspect is application of the nanopatterning techniques for a variety of functional surfaces including but not limited to tunable waveguides and remote sensing.

Further objects, features, aspects, or advantages of the present invention include methods, apparatus, and systems as above-described which provide for:
  a. high resolution nano-scale patterns;
  b. rapid fabrication relative to reported techniques;
  c. application in different ways to different functions, including a variety of sensing, monitoring, or optical techniques based on creating nano-scale resonator structures, including but not limited to agricultural, environmental, and health monitoring;
  d. in the context of fiber optic patterning for refractive index sensing, includes:
    i. intrinsic optical beam alignment;
    ii. simplified and efficient process, but also high resolution at nano-scale, fabrication on a fiber tip;
    iii. optical refractive index modulation and GMR shift;
    iv. ability to coat the nanopattern with materials allowing, e.g., the nanopatterned tip to function as a guide mode resonant (GMR) device and adsorb VOCs on the GO layer for remote fiber-optic sensors with intrinsic optical beam alignment for detecting presence of subtle concentration of analytes at the fiber tip;
    v. efficient discrimination of concentrations of a VOCs, even at minute levels;
    vi. efficient discrimination of plural VOCs;
    vii. flexible, economical, and reproducible fabrication;
    viii. flexibility is design for different applications;
    ix. ability to tune the sensor including by modulating the refractive index of the GO coating and varying the optical properties of the GMR structure;
  e. in the context of sensor patterning for use of the plasmonic effect in, e.g., volatile organic compound sensing includes:
    i. simplified and efficient process, but also high resolution at nano-scale, fabrication on a functional surface;
    ii. plasmonic resonance to monitor surround refractive index changes;
    iii. selective coatings for surface binding and refractive index modulation;
    iv. selective detection, with sensitivity and specificity, of different species in gaseous/aqueous form with subtle variations in concentration;
    v. efficient discrimination of concentrations of a VOCs, even at minute levels;
    vi. efficient discrimination of plural VOCs;
    vii. flexible, economical, and reproducible fabrication;
    viii. flexibility is design for different applications;
    ix. ability to tune the sensor including by modulating the refractive index of the GO coating and varying the optical properties of the plasmonic structure.

B. Aspects

1. Generalized

As mentioned, a general aspect of the invention comprises nanopatterning techniques of high resolution and made comparatively rapidly with a simpler combination of steps than reported techniques. The techniques use UV-assisted nanoimprinting lithography with specific starting materials and specific ordered arrangement of processing steps to produce high resolution patterns at nanoscale dimensions on a variety of functional surfaces. The benefits have great implications for a number of applications.

2. Optical Fiber Refractive Index Sensing Specific Example

For example, nanopatterning optical fiber tips in such a way implicates a number of potential benefits which will be discussed further in more detail later. The nanopatterned fiber can be used as a refractive index sensor or in other ways taking advantage of the integrated nanopattern and GMR layer (a layer to achieve optical resonances).

An aspect of the invention includes use of the technique to inscribe or form high resolution nanophotonic patterns on cleaved facets of optical fibers. This makes optical refractive index modulation possible with different detection devices, including but not limited to diffraction gratings, photonic crystals, and nanophotonic resonators.

In one example, first, a negative of the ultimate desired tip nanopattern is created as follows. A starting nanopattern is imprinted into PDMS by a high resolution stamp. The PDMS imprint is thermally cured and removed from the stamp. A normally liquid phase, UV curable elastomer material with high transparency and refractive index control (e.g. PP1-ZPUA) is poured on the PDMS mold and a glass wafer placed over the combination to encase the curable elastomer in the mold. The optical-quality elastomer is UV-cured in the glass-covered PDMS mold forming a rigid, a high resolution reverse of the PDMS mold pattern in the elastomer. The elastomer/glass combination is removed from the PDMS mold to expose the high resolution negative of the final intended nanopattern. Second, a positive of the cured elastomer/glass template nanopattern is created at a fiber optic tip as follows. The tip is dipped into a UV curable photo resist liquid (e.g. SU8-2000), a volume of which adheres to the fiber tip surface. Third, a positive nanopattern at the fiber tip is created from the negative glass/cured elastomer. The fiber with the photoresist at the tip is pressed (e.g. perpendicularly) against the negative pattern on the cured/hardened elastomer/glass combination in a controlled manner such that the positive nanopattern is imposed into the photo resist. The photo resist is UV-cured to both put it into a hardened state and promote good adhesion to the fiber tip. The imposed nanopattern is thus a high resolution grating structure integrated with the fiber optic with intrinsic beam alignment with the optical properties of the optical fiber.

3. Volatile Organic Compound Sensing

By further non-limiting example, nanopatterning other sensor surfaces provides at least similar benefits, as will be discussed in further detail later. The optical features of the nanopattern can be used for a variety of sensor functions, including refractive index modulation associated with detection of chemical species. As will be appreciated, the nanopatterning can comprise forming discrete groups of nanostructures spatially separated across the substrate, each group forming a separate sensor element.

An aspect of the invention comprises fabricating a sensor surface by, first, creating a high resolution negative of the final desired nanopattern in a PDMS mold. Second, small volumes of UV-curable elastomer material with high transparency and refractive index control (e.g. PP1-ZPUA) are deposited on and adhered to the top of a substrate. The PDMS mold is imposed over and into the curable elastomer on the substrate to encase and mold a high resolution positive of the nanostructure of the PDMS mold. The locations of the nanostructured elastomer are then UV-cured to form the positive cured pattern of nanostructures on the substrate. Then, overlayers or deposits of other materials to these nanostructures can functionalize them for sensing/detecting functions. In one example, metallic material is placed at least over the distal portions of the formed nanostructures to take advantage of, for example, plasmonic effect. In another example, a further placement of a coating or layer that selectively absorbs or traps chemical species of interest can be added.

In one implementation of such a functionalized nanopatterned surface, the sensor surface is exposed to an environment of interest. The sensor surface comprises a plasmonic structure or crystal overlaid with a selective surface. One example of the selective surface is graphene oxide. Other selective coatings, layers, or surfaces are possible. The sensor surface is illuminated. Reflected light from the sensor surface is analyzed for plasmonic response indicative of the presence of a species of interest (e.g. a VOC) absorbed by the selective surface (e.g. GO). In one example, the plasmonic structure is a predesigned array of nanoposts of certain periodicity and form factor. At least portions of each nanopost has a metallic portion applied to it. The selective surface such as GO is placed over at least some of the metal. The refractive index of the GO can be modulated by controlling the thickness of the GO. The optical response of the plasmonic structure can be tuned by selection of the form factor, periodicity, and metallization of the nanostructures. This combination promotes efficient, economical, and reproducible sensors capable of sensing minute quantities or concentrations of target species such as VOCs.

In another aspect, a sensor used with the method described above can include the following. An array of nanoposts of a polymeric material is formed on a substrate. In one example, the array is formed by replica molding of a polymeric material on a substrate of silicone. In one form, metal is coated across the array and includes covering of tops of the nanoposts and areas between, as well as the posts themselves. GO is then coated over the metal. In another example, just the tops of the posts have metal. In another example, the tops of the posts have metal and nanoholes are formed in a metal layer between the posts.

In another aspect of the invention, the sensor is fabricated by creating a highly accurate master mold with the negative of the nanoposts. Multiple arrays of nanoposts can be formed from the master mold by replica molding of a polymeric solution. The array can be fixed to a substrate. Metal can be applied to at least portions of the nanoposts by a variety of techniques. GO can be placed over the metal by a variety of techniques. Modulation of thickness of the GO can be by drop casting or other techniques.

In another aspect of the invention, a system comprises a set of such plasmonic crystal sensors, as above described, integrated with a housing or chamber to which the plural sensors are exposed to an environment for testing for the presence of target VOCs in gaseous state. Each sensor has a different thickness GO layer. Also integrated in the system is a source of illumination including optics to focus the illumination on each sensor, a collector of reflected light from each illuminated sensor, and a processor to analyze the reflected light from the plural sensors. The processor would analyze the reflected light, as modulated by the different thickness GO coatings on each sensor, for a signature indicative of a target VOC. The processor would compare the signals from each sensor to reference patterns related to a target VOC to confirm presence of the target VOC.

In another aspect of the invention, multiple identical plasmonic crystals, each with a different thickness GO overlay, comprise a sensor system. The effective refractive index of each GO layer of each crystal is modulated when exposed to an unknown gas or gases. Pattern recognition is used to identify one or more VOCs in the unknown gas(es).

III. BRIEF DESCRIPTION OF DRAWINGS

The patent or application file contains at least one drawing executed in color. Copies of this patent or patent application publication with color drawing(s) will be provided by the Office upon request and payment of the necessary fee.

FIG. 1: Fabrication process. (a) PDMS is poured on the silicon stamp and then thermally cured. (b) PDMS is peeled off the stamp. (c) ZPUA is poured on the PDMS mold. (d) The PDMS mold is pressed against the glass wafer and exposed to UV radiation. (e) The fiber tip is dipped into SU8-2000. (f) The fiber is pressed against the grating structure and is subject to UV irradiation. (g) The mold is released from the fiber tip.

Figure 2:
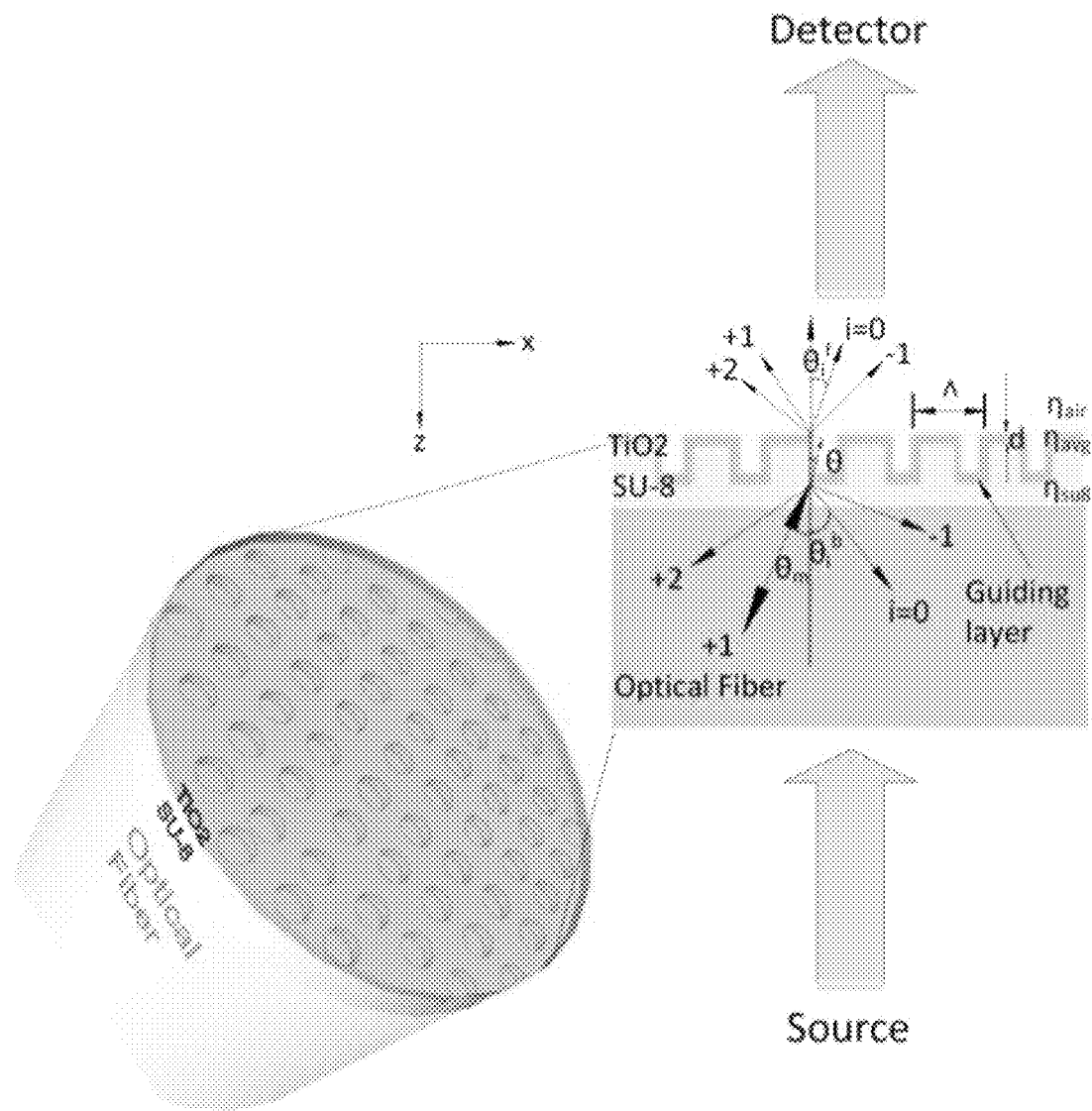

FIG. 2: Schematic representation of planar waveguide-grating at the optical fiber tip, where the angles, Om is of incident light, $\theta_i^b$ is of the ith backward-diffracted wave, and $\theta_i^f$ is of the ith forward-diffracted wave.

Figure 3:
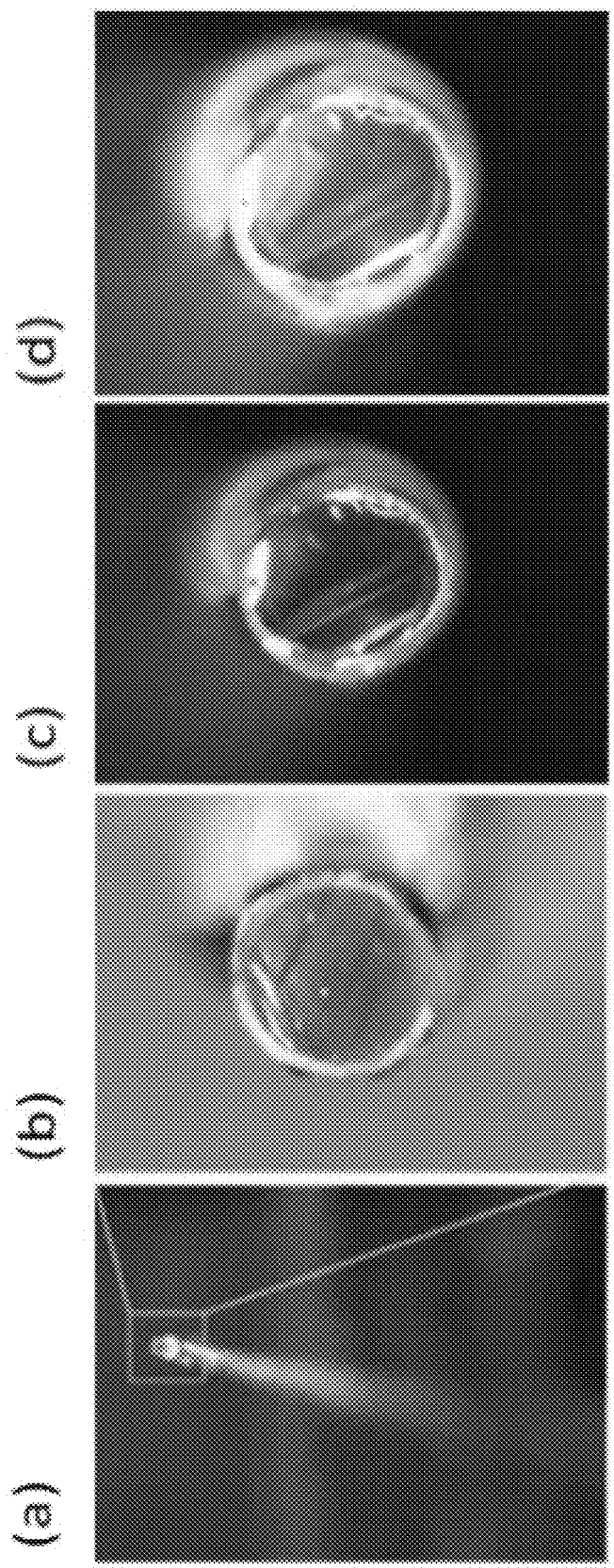

FIG. 3: (a) Optical image of a multimode fiber with the tip patterned with nanostructures. (b, c, d) Reflective colors from the 2D GMR patterns at the fiber tip for different incidence angles of light.

Figure 4:
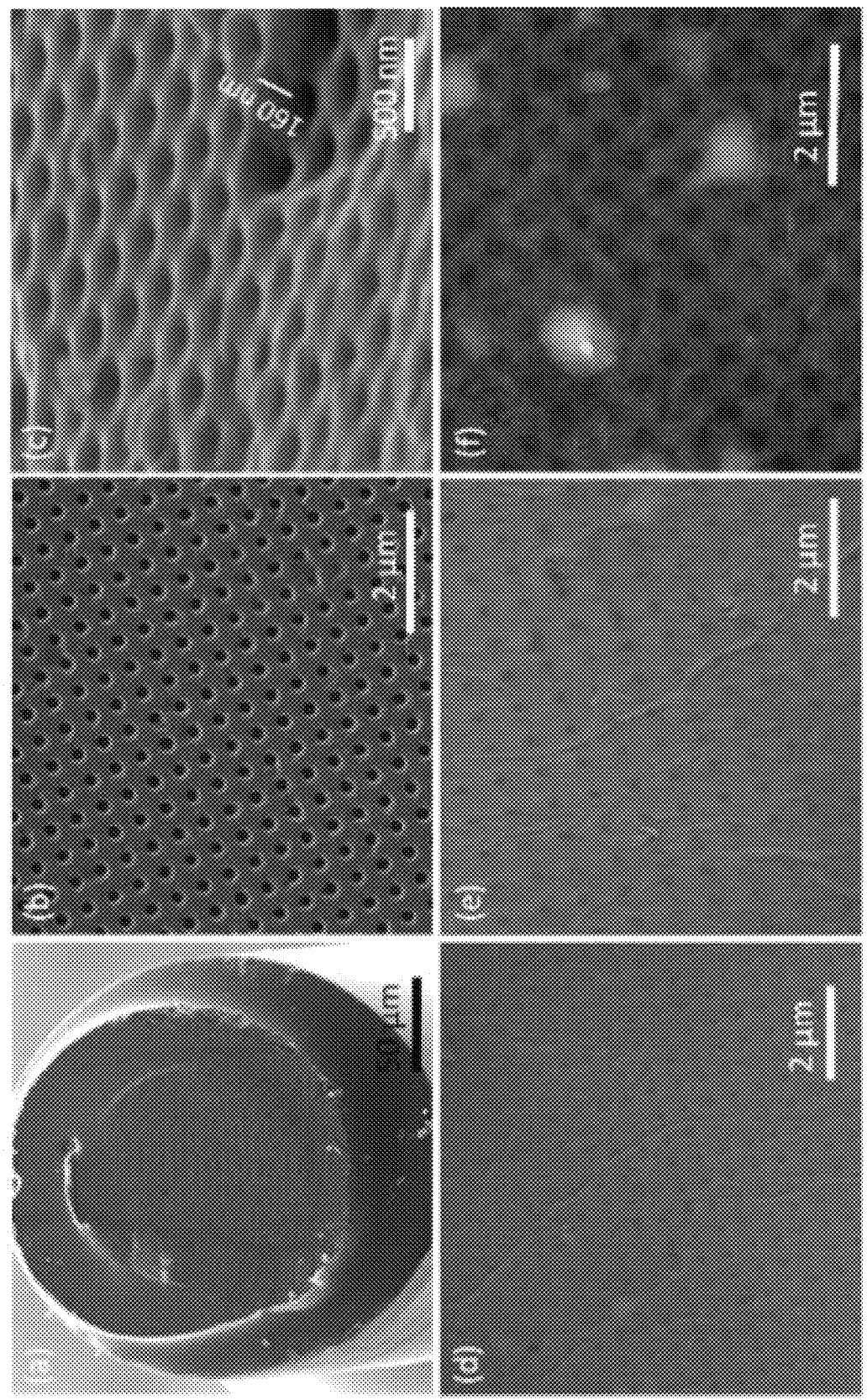

FIG. 4: SEM analysis of the fiber tip: (a) optical fiber tip patterned with nanoholes, (b) zoomed-in top-view SEM image of bare (without GO/$TiO_2$ coating) nanoholes in (a), (c) coverage and thickness of $TiO_2$ coating on the nanoholes, (d-f) GO/$TiO_2$ coated nanoholes at the tips of three identical optical fibers.

Figure 5:
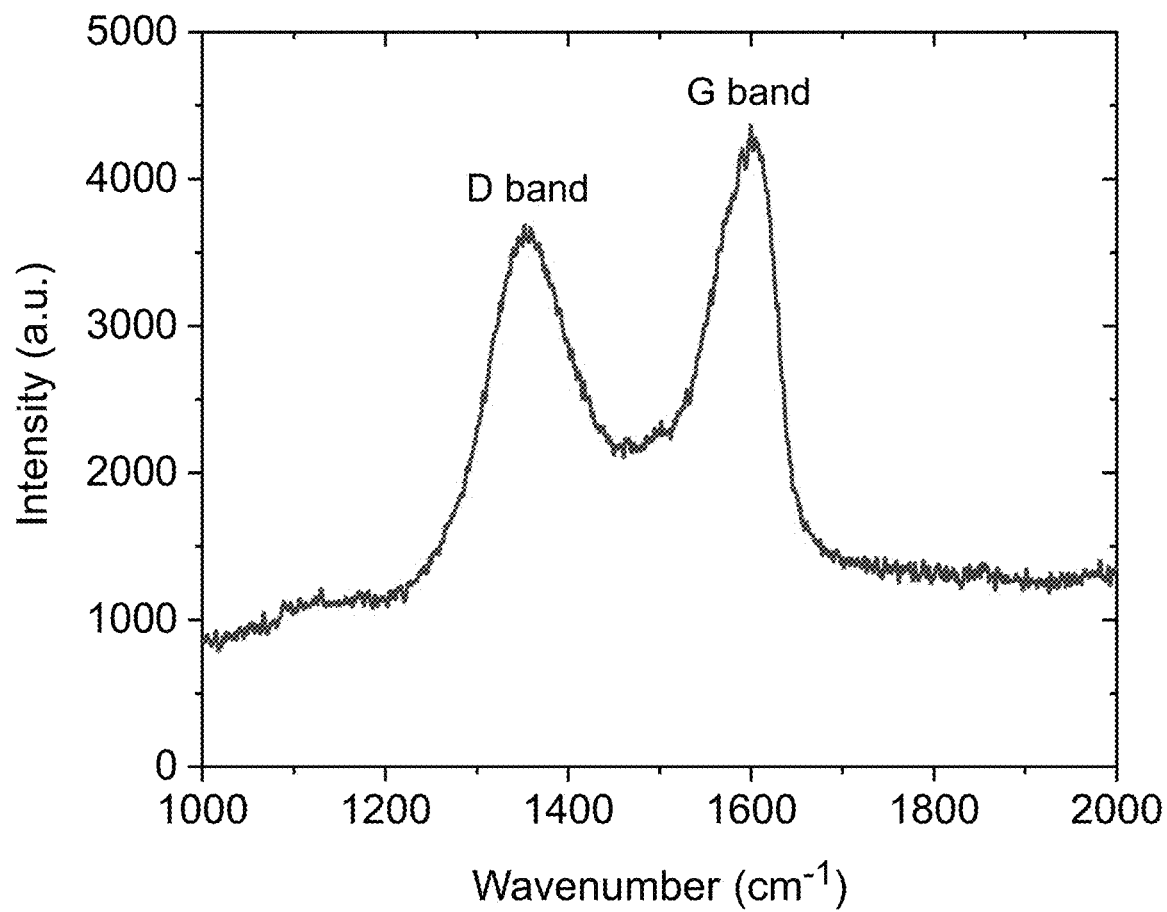

FIG. 5: Raman spectrum of Graphene oxide.

Figure 6:
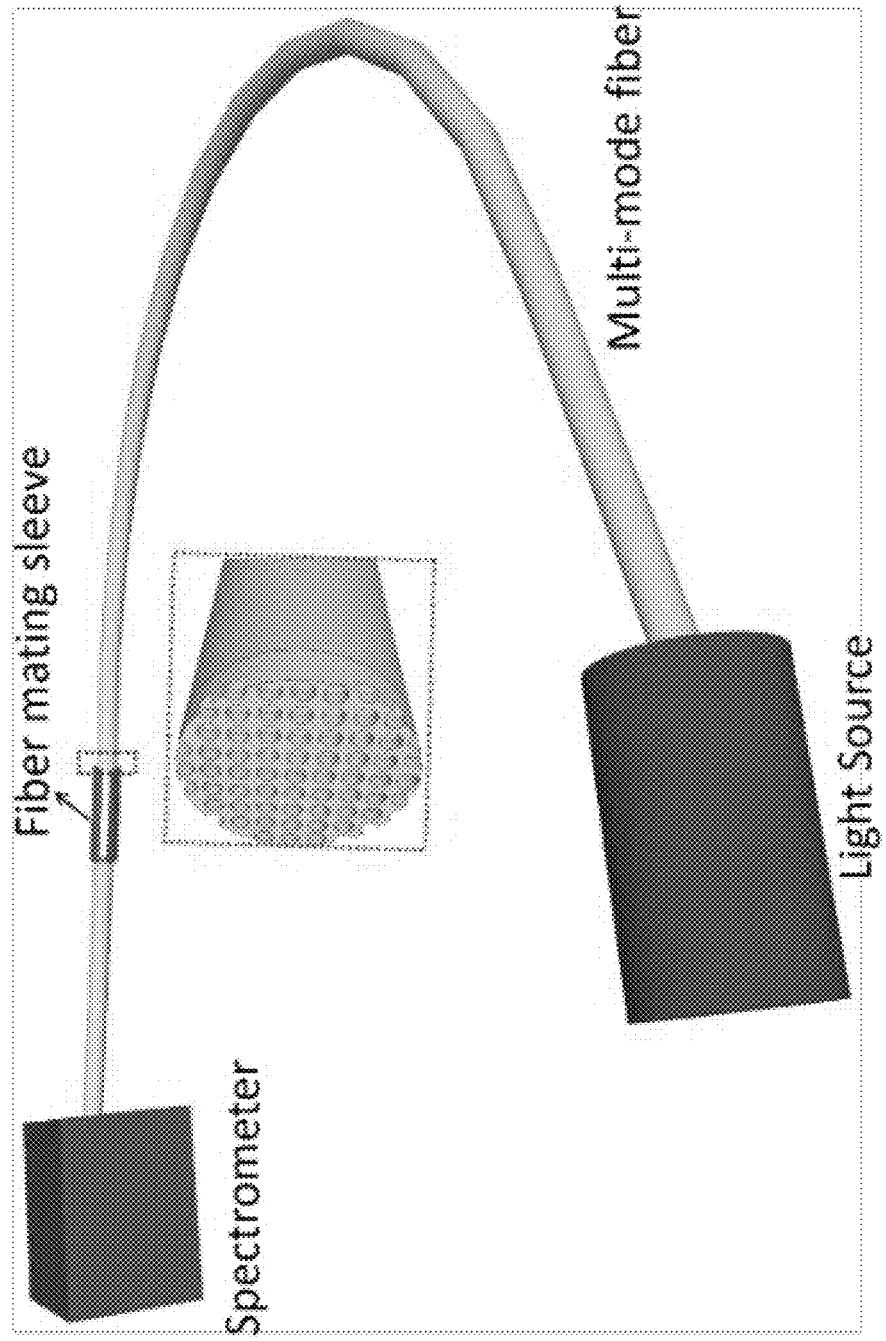

FIG. 6: Optical setup for transmission measurement.

Figure 7:
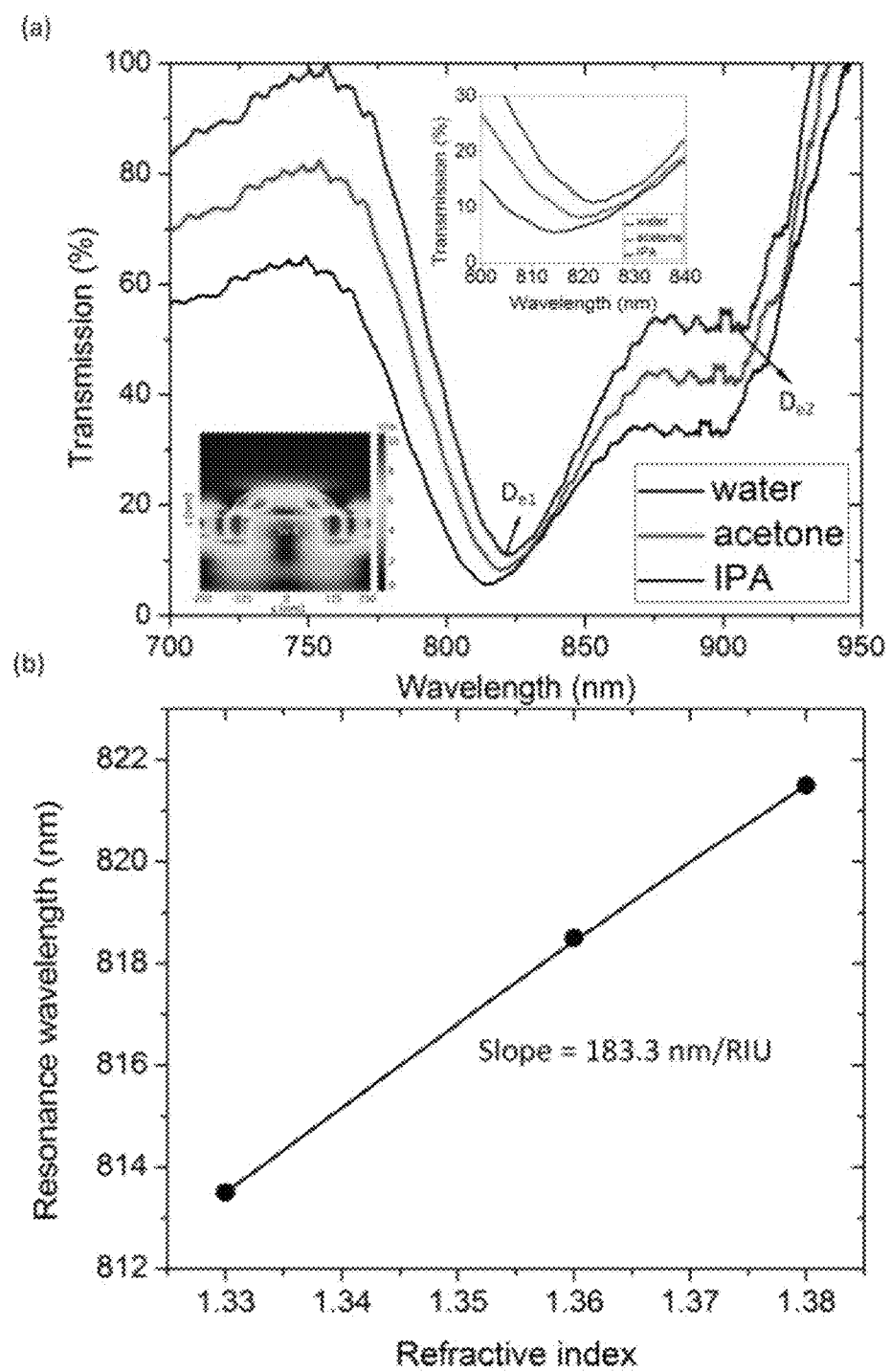

FIG. 7: (a) Experimental transmittance of the device with surrounding water, acetone and IPA. Insets show the close-up of the resonance shift (upper right corner) and field distribution at the resonance mode of the GMR structure (lower left corner). (b) Refractive index sensitivity curve.

Figure 8:
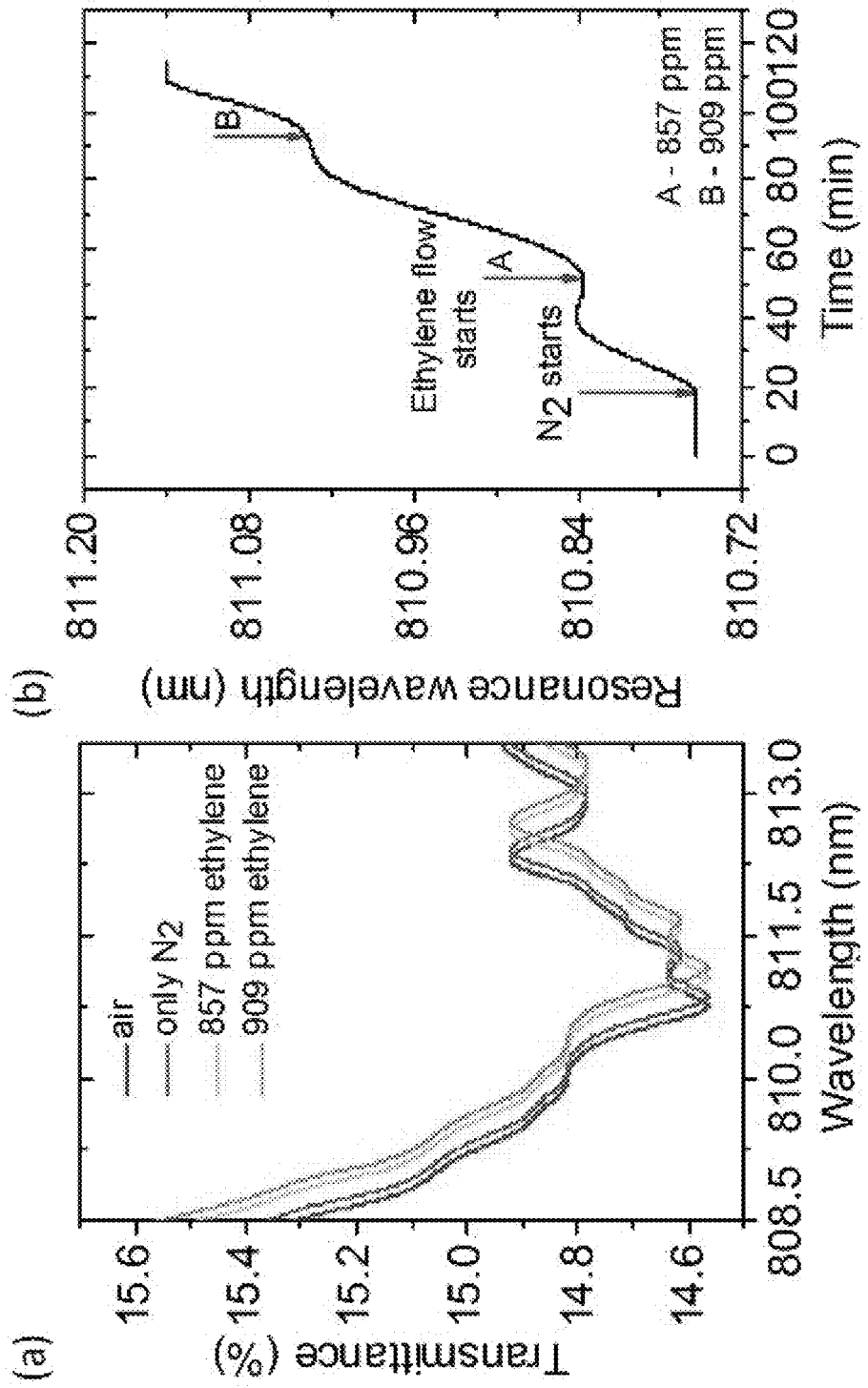

FIG. 8: (a) Transmittance spectra of GMR gas sensor (without any GO coating) at fiber tip when exposed to gaseous ethylene and (b) Monitoring real-time sensing of ethylene with the sensor.

Figure 9:
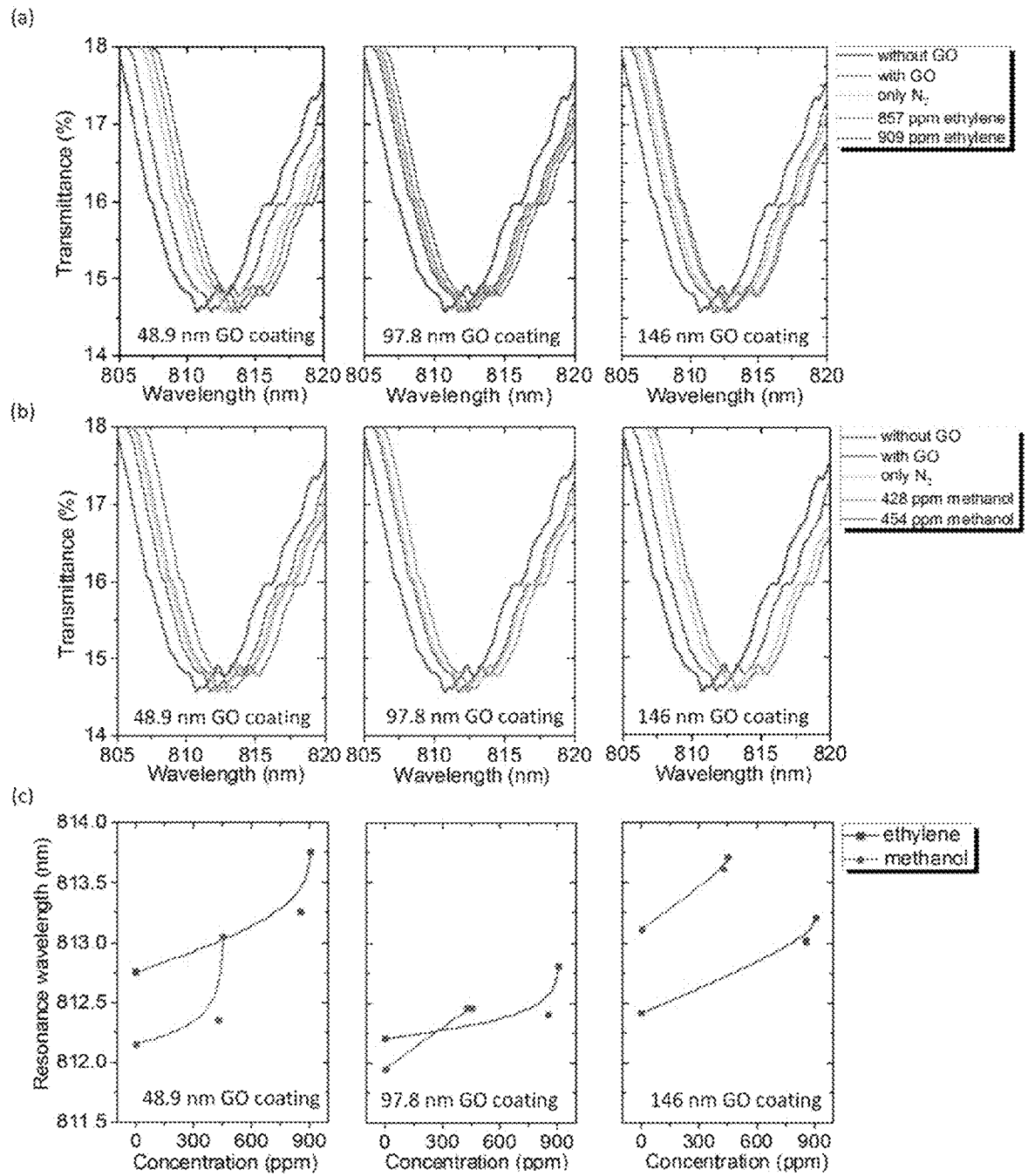

FIG. 9: Transmittance spectra of fiber tip gas sensors with three different thicknesses of GO when exposed to gaseous (a) ethylene and (b) methanol. (c) Resonance wavelength shifts of three fiber tip gas sensors with different thicknesses of GO as a function of concentration of gaseous ethylene and methanol.

Figure 10:
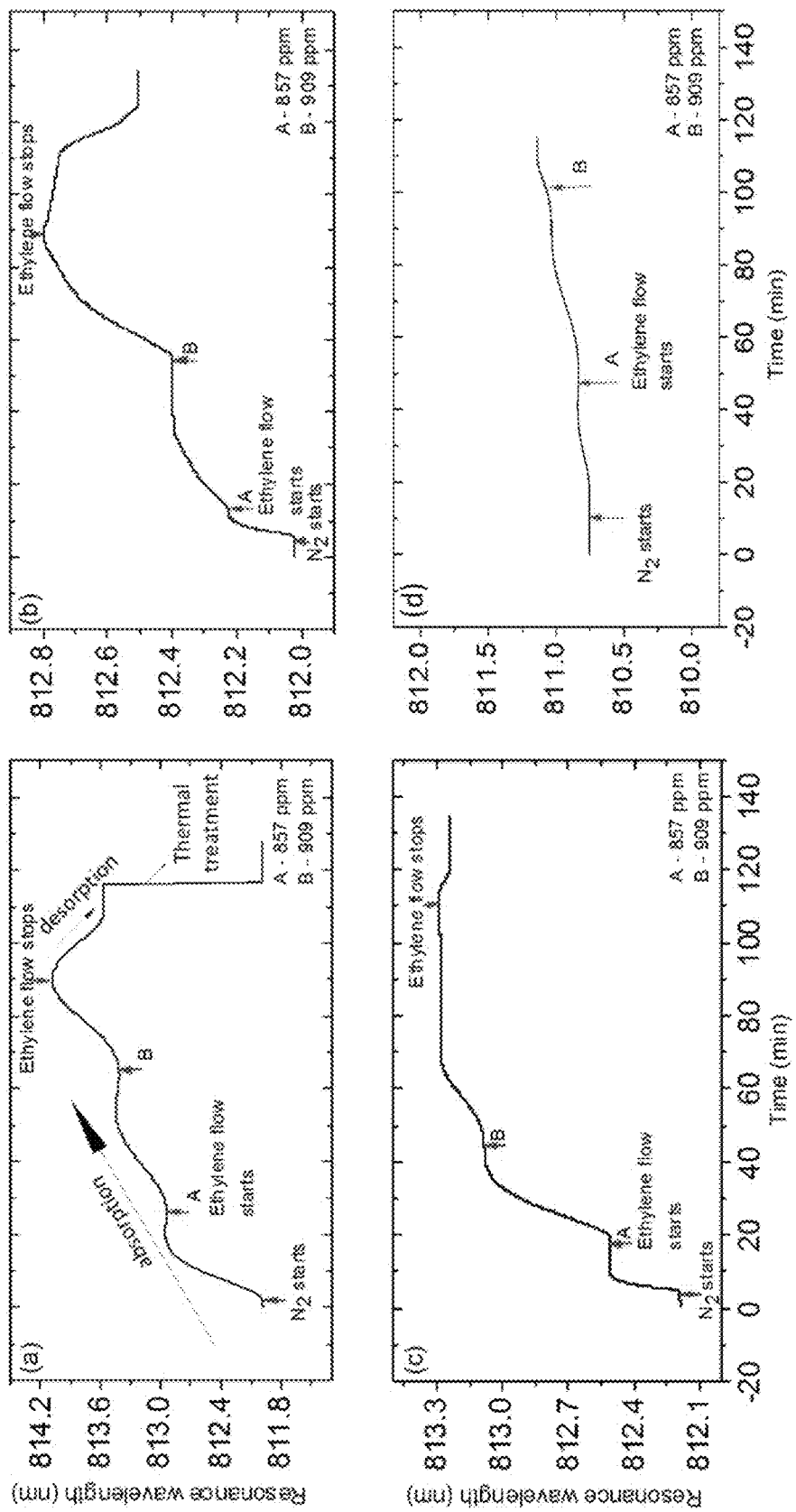

FIG. 10: A 2 hr exposure test for gaseous ethylene with (a) 48.9 nm, (b) 97.8 nm, (c) 146 nm GO coating and (d) without any GO coating. A and B denote the instants when 857 ppm and 909 ppm of gaseous ethylene were introduced in the chamber.

Figure 11:
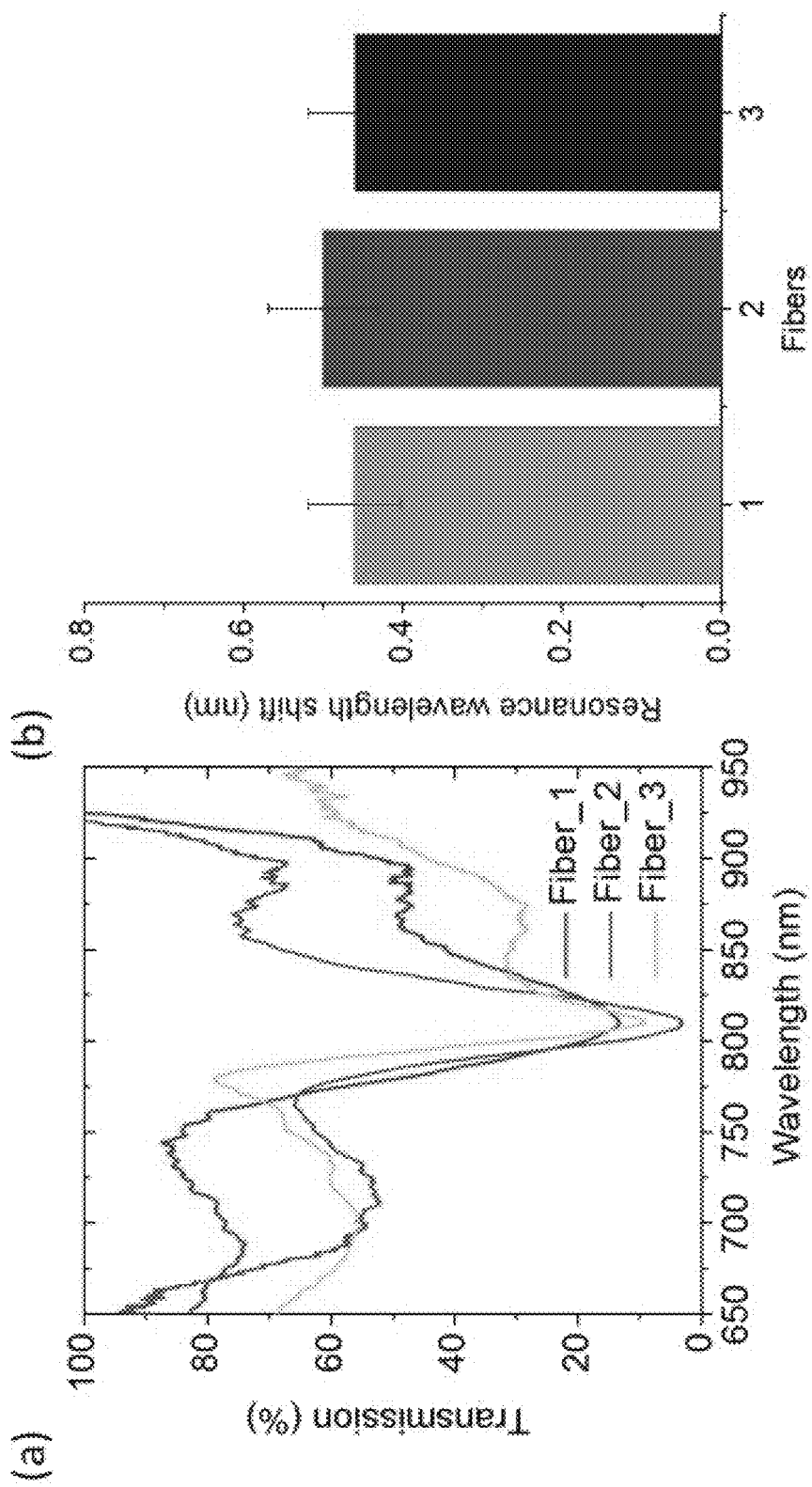

FIG. 11: (a) Transmittance spectra and (b) histogram data along with error bars for three identical 48.9 nm GO coated fiber-tip sensors when exposed to 857 ppm ethylene gas.

Figure 12:
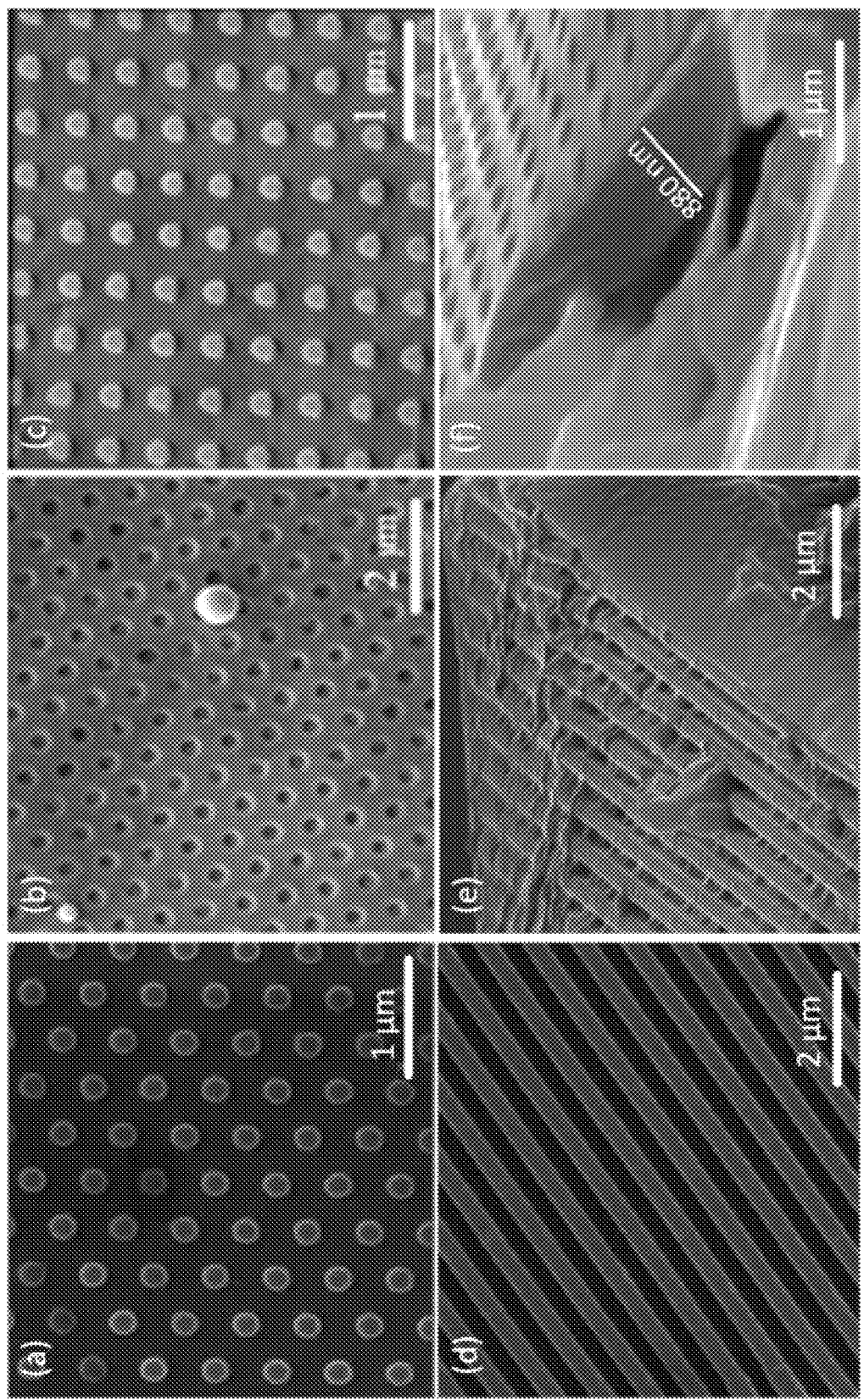

FIG. 12: To demonstrate reproducibility of our approach and also to conduct structural optimization for the purposes of sensing, different nanopatterns were formed at the fiber tip: (a) nanoposts with a triangular lattice (b) nanoholes with a triangular lattice, (c) nanoposts with a square lattice, (d) linear nanostamps. (e) 75° side-view of the linear stamps, (f) 75° side-view of nanoposts with square lattice showing the remaining polymer (SU8) thickness underneath the nanoposts.

Figure 13:
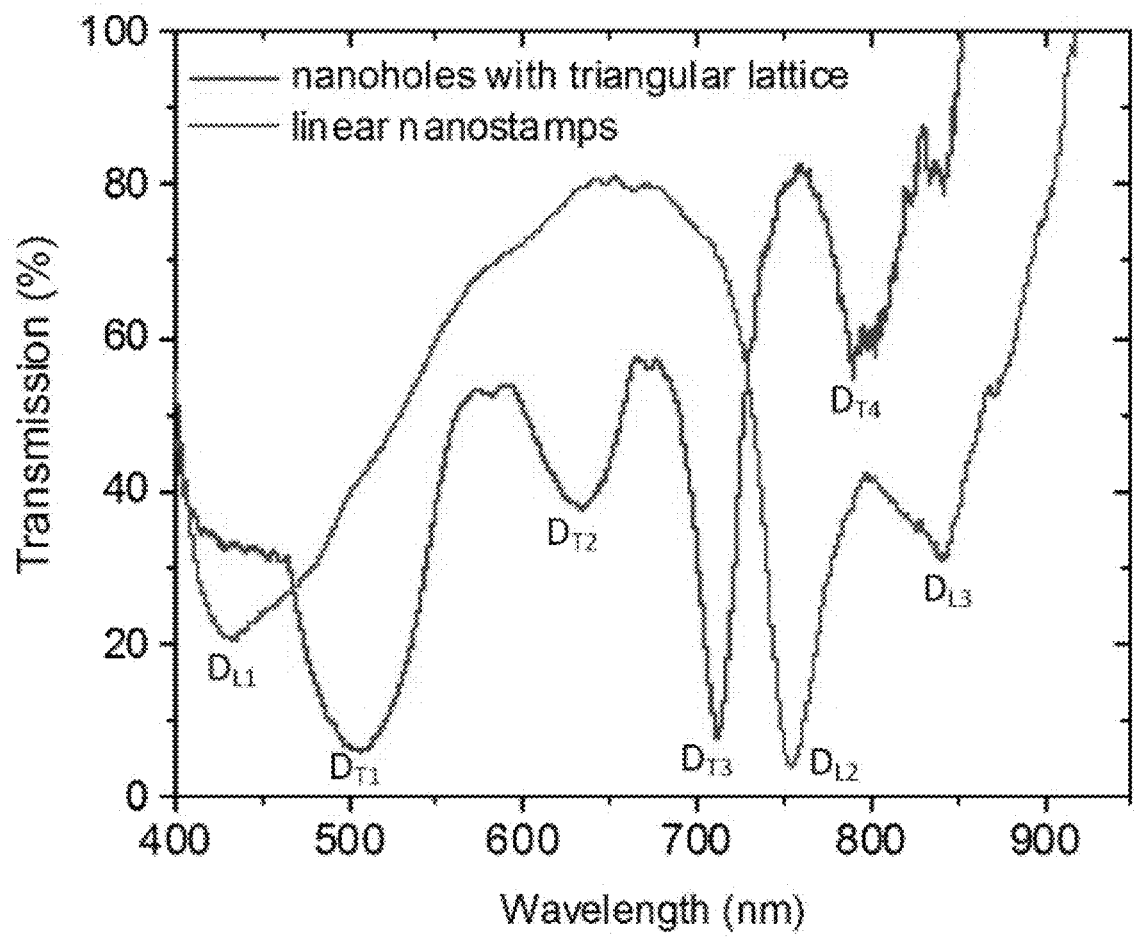

FIG. 13: Characterization of the alternative design structures, namely, transmittance spectra of nanoholes with a 2D triangular lattice and 1D linear nanostamps at the fiber tip coated with 160 nm of $TiO_2$. Notations $D_{T1}$-$D_{T4}$ and $D_{L1}$-$D_{L3}$ represent different modes excited at 2D triangular lattice and 1D linear nanostamps respectively.

Figure 14:
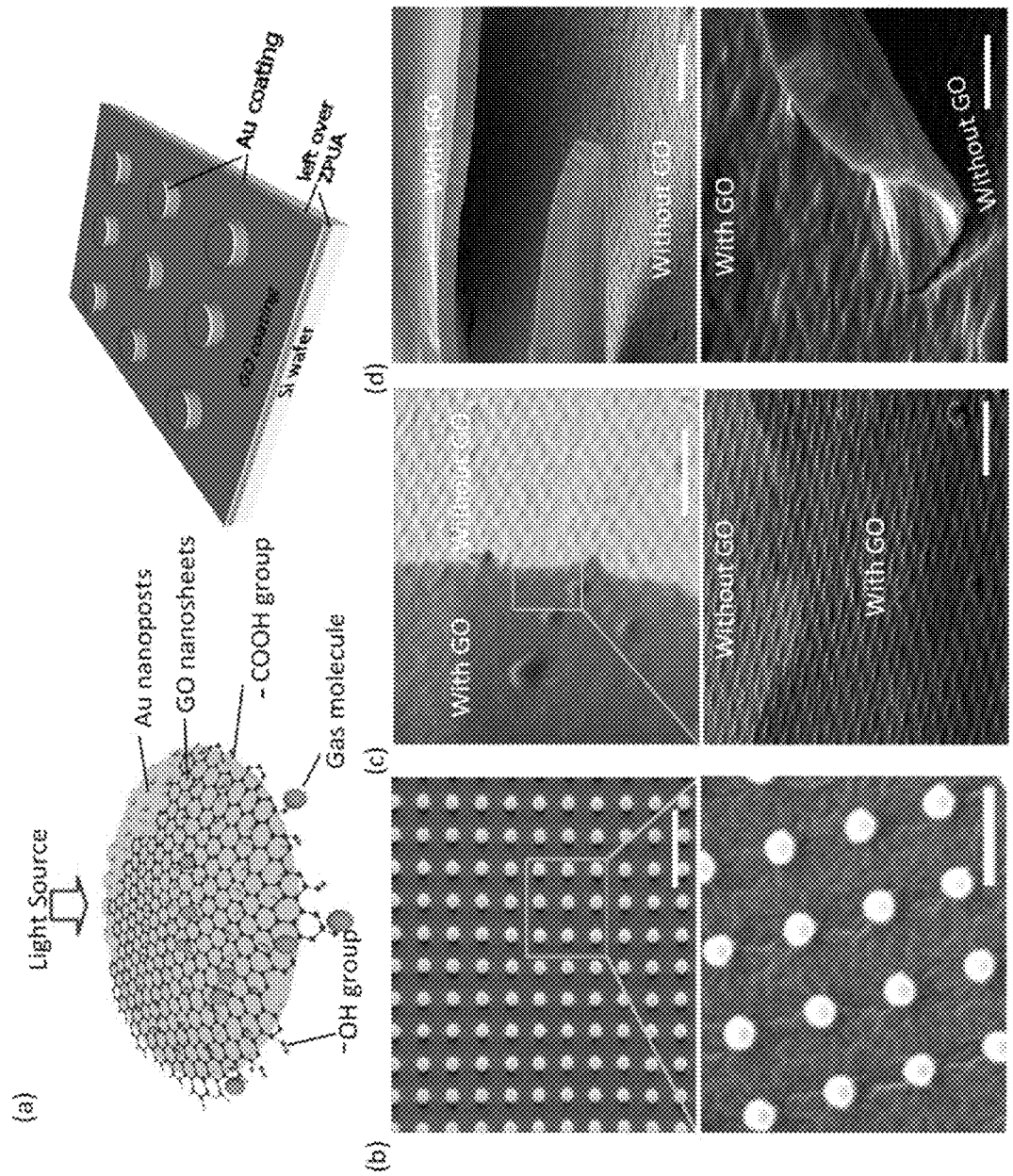

FIG. 14: (a) Schematic illustration of the GO coated plasmonic crystal sensor. (b) Top-view scanning electron microscopy (SEM) images of an array of polymer nanoposts (lattice constant=500 nm, post diameter=250 nm, post height=210 nm) without Au coating. Scale bars represent 1 μm (top panel) and 500 nm (bottom panel). (c) 70° tilt-view of the nanopost array deposited with Au/GO coating. Scale bars represent 2 μm (top panel) and 1 μm (bottom panel). (d) 70° tilt-view of the GO nanosheet separated from the nanopost surface at the edge. Scale bars represent 2 μm (top panel) and 1 μm (bottom panel).

Figure 15:
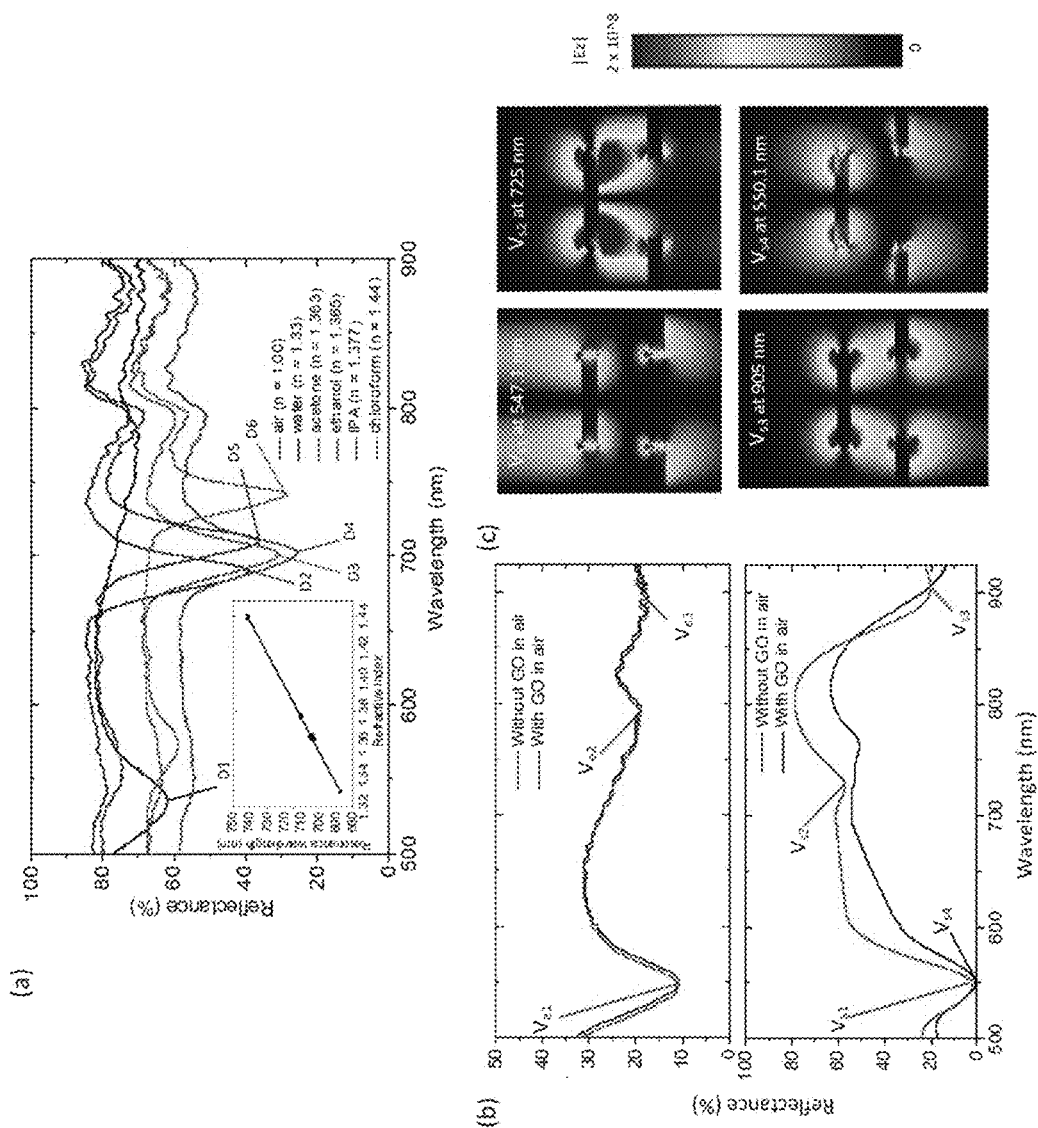

FIG. 15: (a) Reflectance spectra of bare structure (without GO) in response to air ($\lambda_{D1}$=547.1 nm), water ($\lambda_{D2}$=688 nm), acetone ($\lambda_{D3}$=700.8 nm), ethanol ($\lambda_{D4}$=702.5 nm), IPA ($\lambda_{D5}$=710.5 nm) and chloroform ($\lambda_{D6}$=741.5 nm). The inset shows refractive index sensitivity curve. (b) The measured (upper panel) and simulated (lower panel) reflection spectra of the plasmonic nanostructure without and with a 16.3 nm thick GO coating under normal incidence of light. $V_{s1}$, $V_{s2}$, $V_{s3}$ and $V_{s4}$ in the simulated spectra indicate the reflection features of interest. $\lambda_{Vs1}$=547.1 nm, $\lambda_{Vs2}$=725 nm, $\lambda_{Vs3}$=905 nm and $\lambda_{Vs4}$=550.1 nm. (c) Simulated cross-sectional electric field distribution at the SPP resonant wavelength of 547.1 nm, 725 nm and 905 nm without any GO coating, and at the SPP resonance wavelength of 550.1 nm with a 16.3 nm thick GO coating. The color bar shows field intensity.

Figure 16:
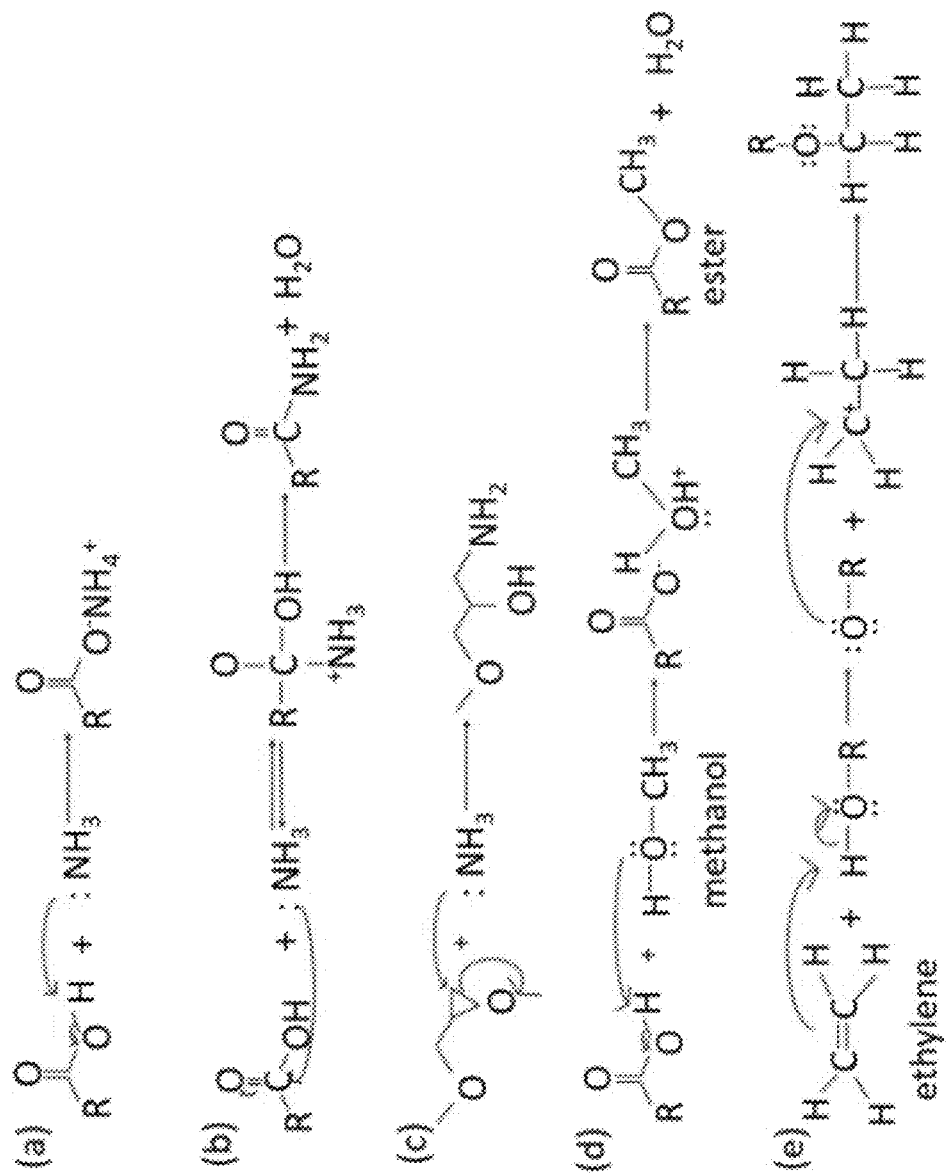

FIG. 16: Mechanism of interaction of $NH_3$ (a,b,c), methanol (d), and ethylene (e) gases with the functional groups present at GO nanosheets.

Figure 17:
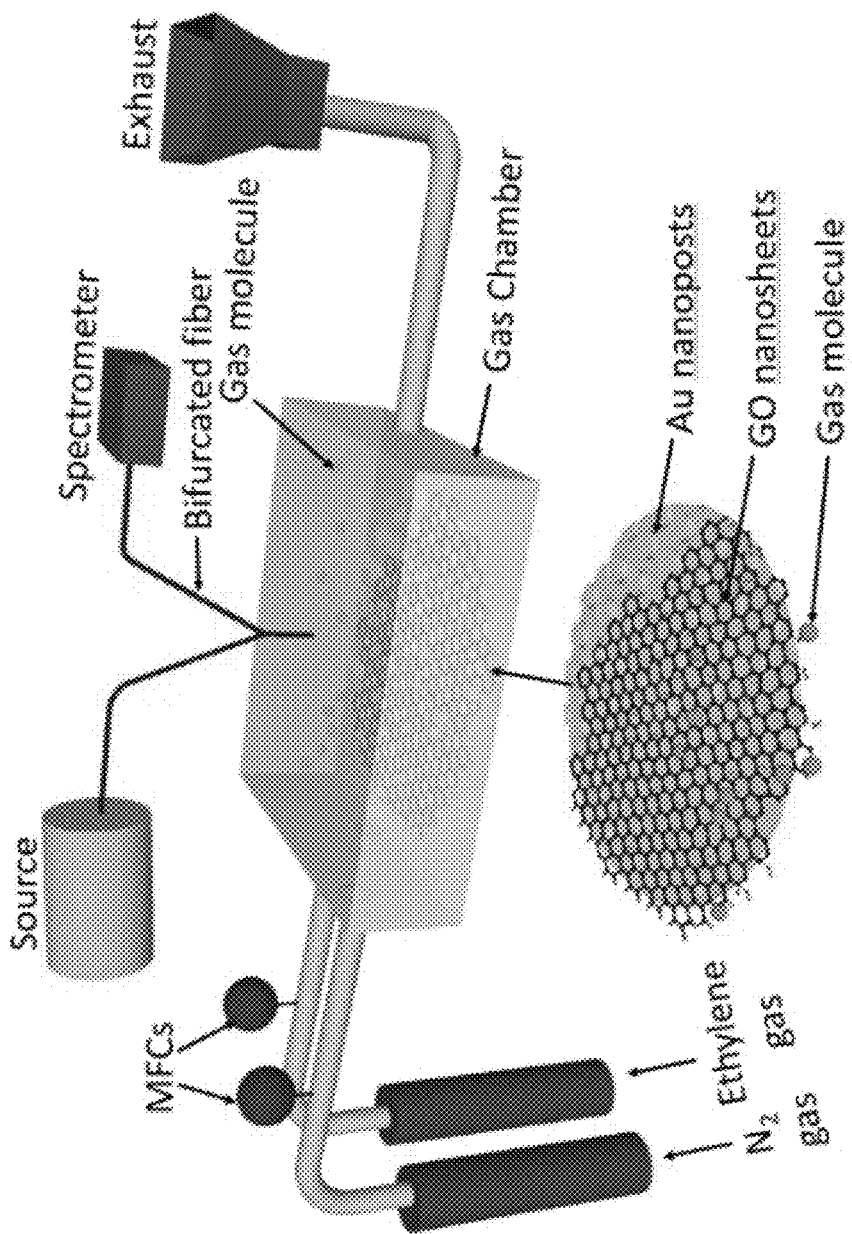

FIG. 17: Schematic illustration of experimental setup for gas sensing using GO coated plasmonic nanostructure.

Figure 18:
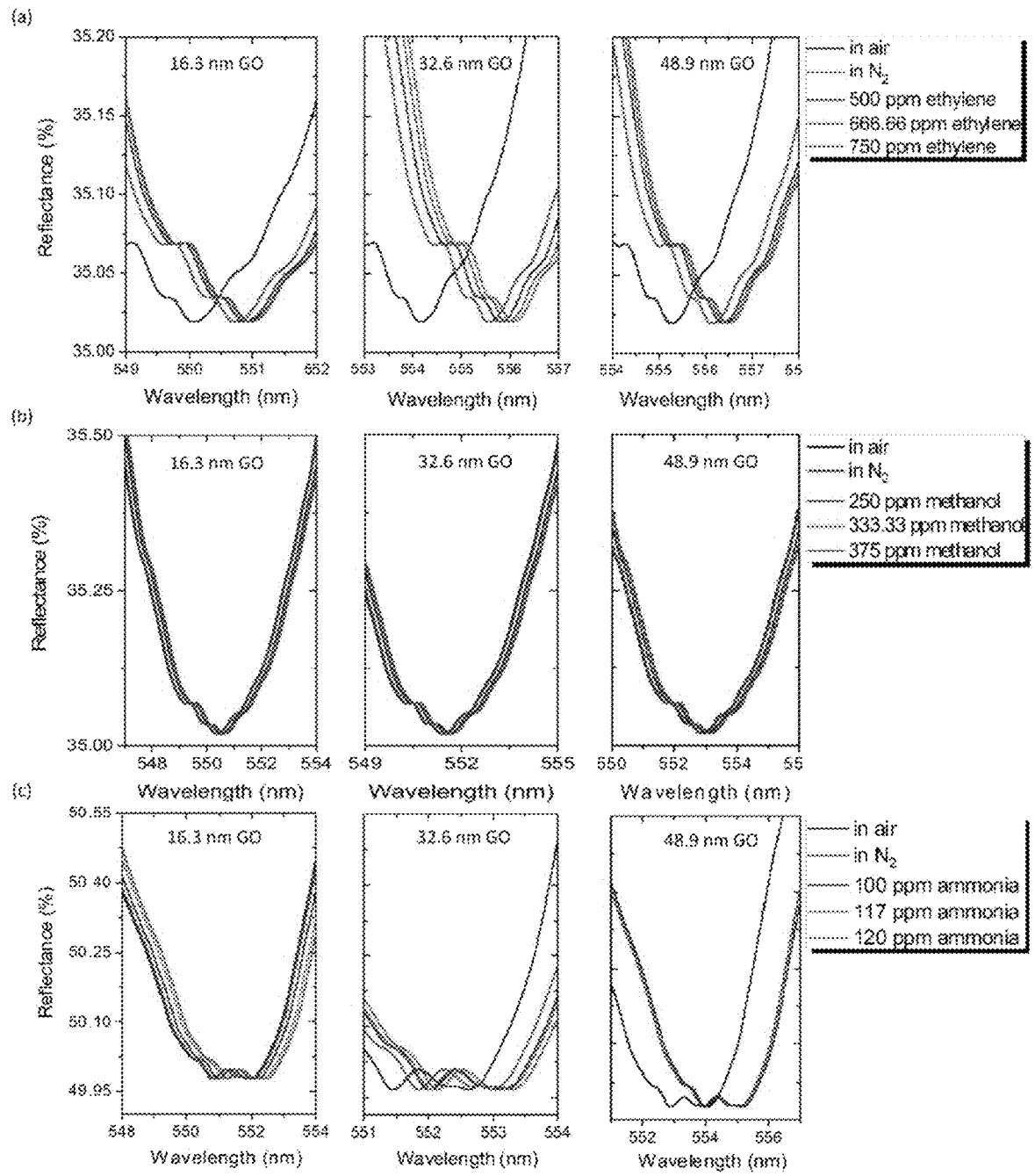

FIG. 18: Reflectance spectra of plasmonic crystal gas sensors with three different thicknesses of GO when exposed to gaseous (a) ethylene, (b) methanol and (c) $NH_3$.

Figure 19:
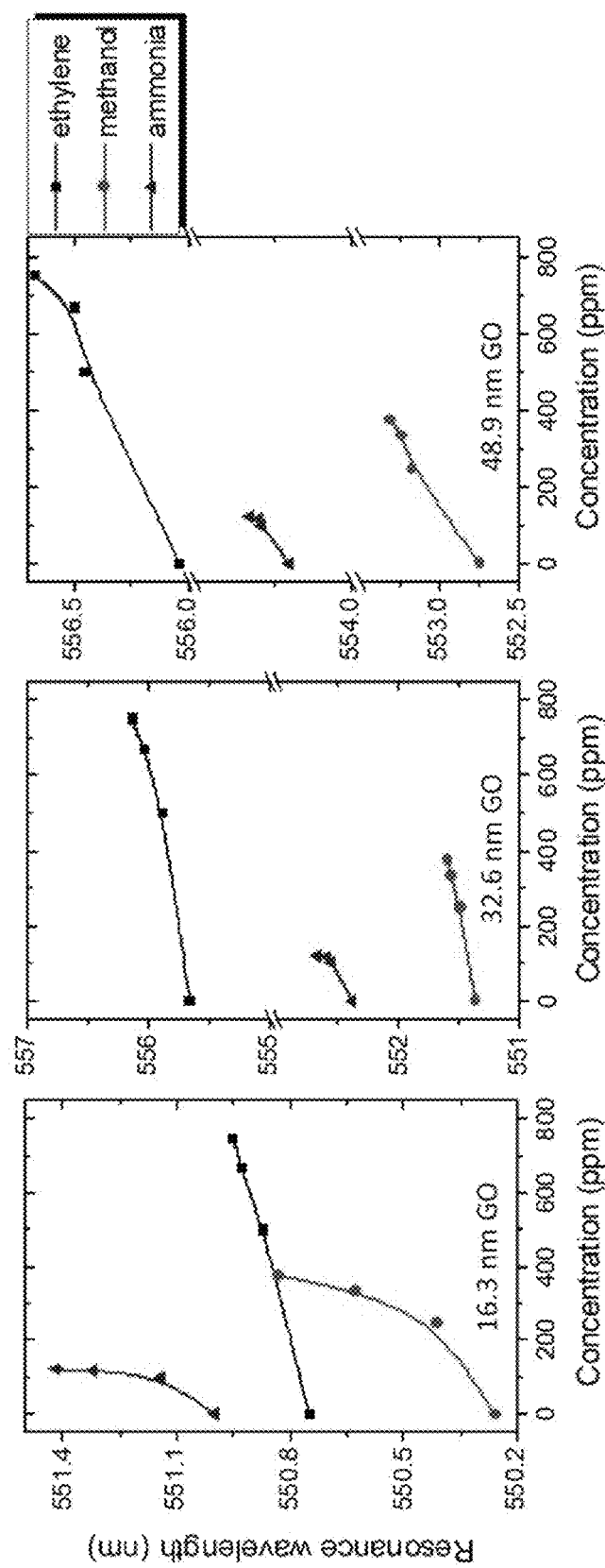
Figure 20:
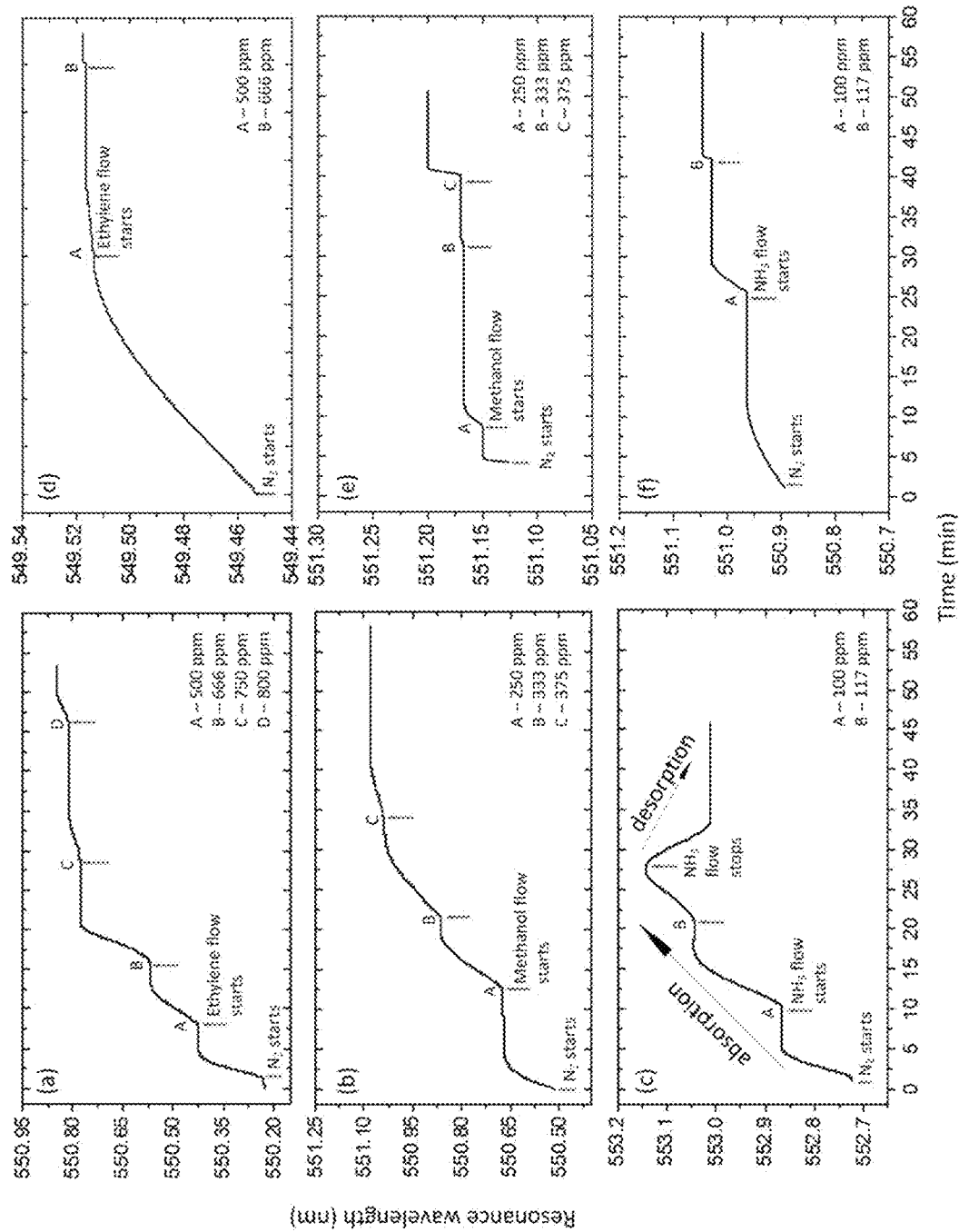

FIG. 19: Resonance wavelength shifts of three plasmonic crystal gas sensors with different thicknesses of GO as a function of concentration of gaseous ethylene, methanol and $NH_3$ FIG. 20: Monitoring the real-time adsorption of (a) ethylene, (b) methanol and (c) ammonia into the plasmonic nanostructure with 32.6 nm thick GO coating. Control dynamic experiments in response to (d) ethylene, (e) methanol and (f) ammonia without any GO coating. A, B, C and D represent the instants at which gas was introduced into the enclosed chamber.

Figure 21:
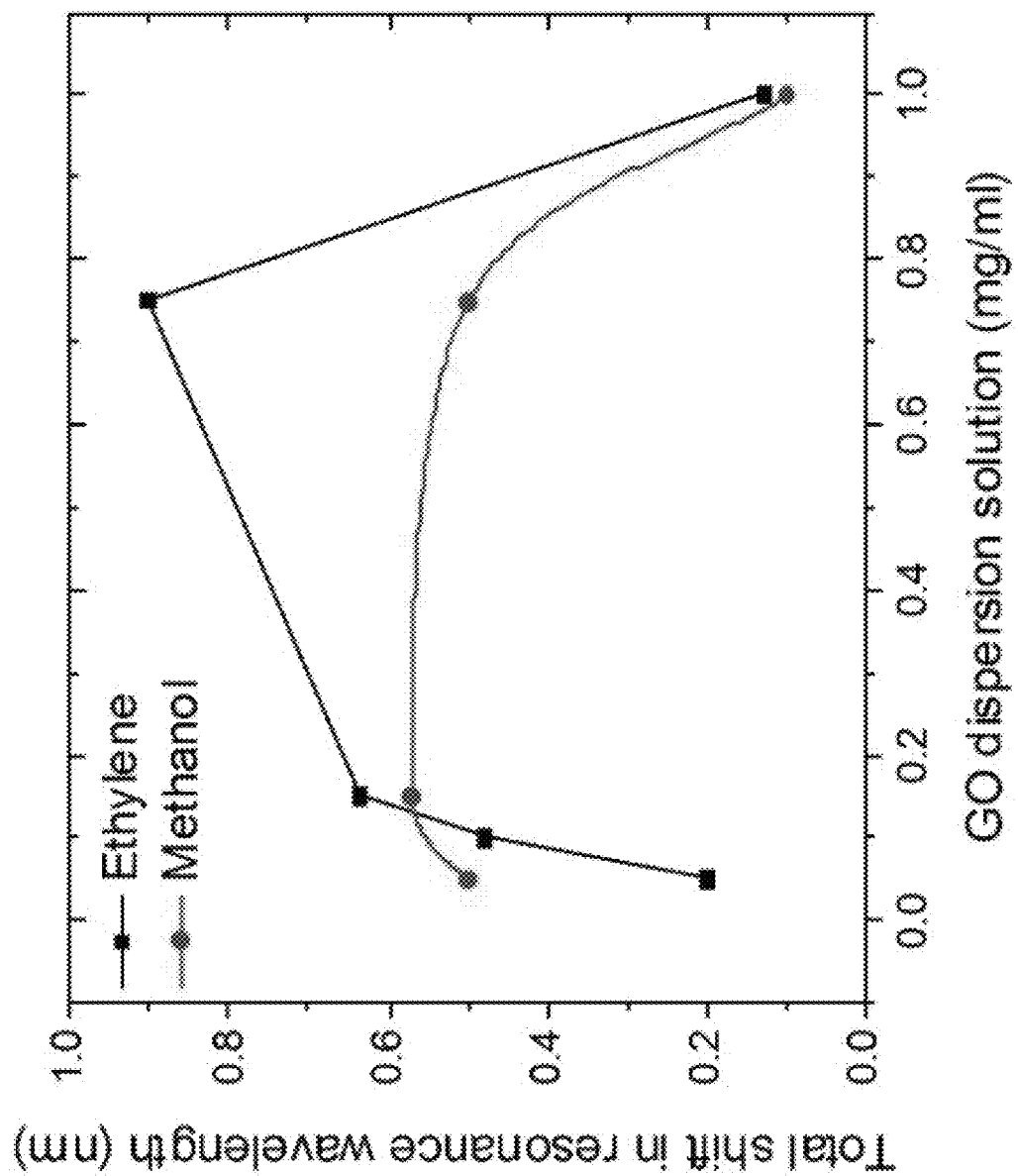

FIG. 21: Variation of total shift in resonance wavelength with the concentration of GO dispersion solution for ethylene gas concentration ranging from 500 ppm to 750 ppm and methanol gas concentration ranging from 250 ppm to 375 ppm.

Figure 22:
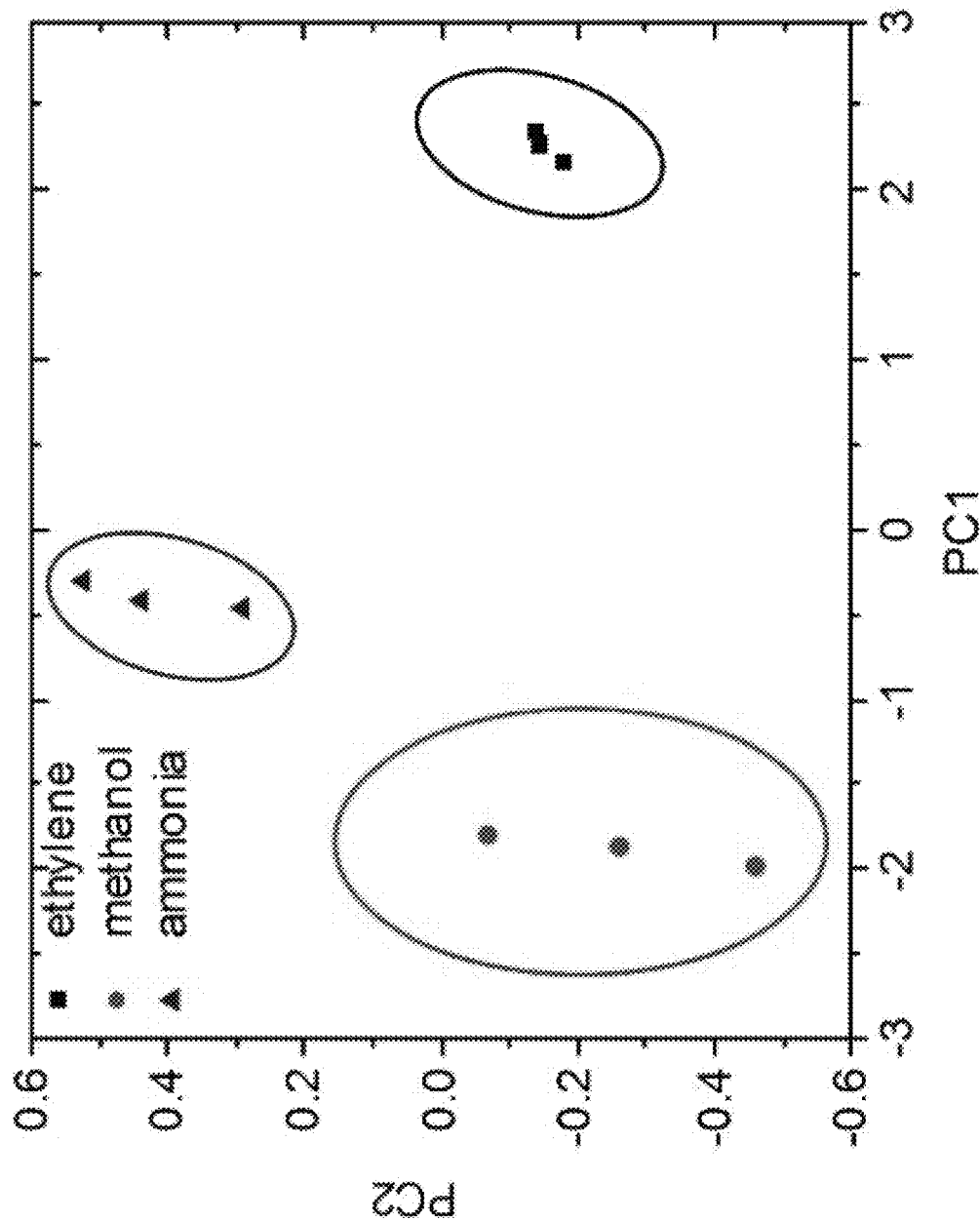

FIG. 22: Pattern analyses based on PCA using three different sensors

Figure 23:
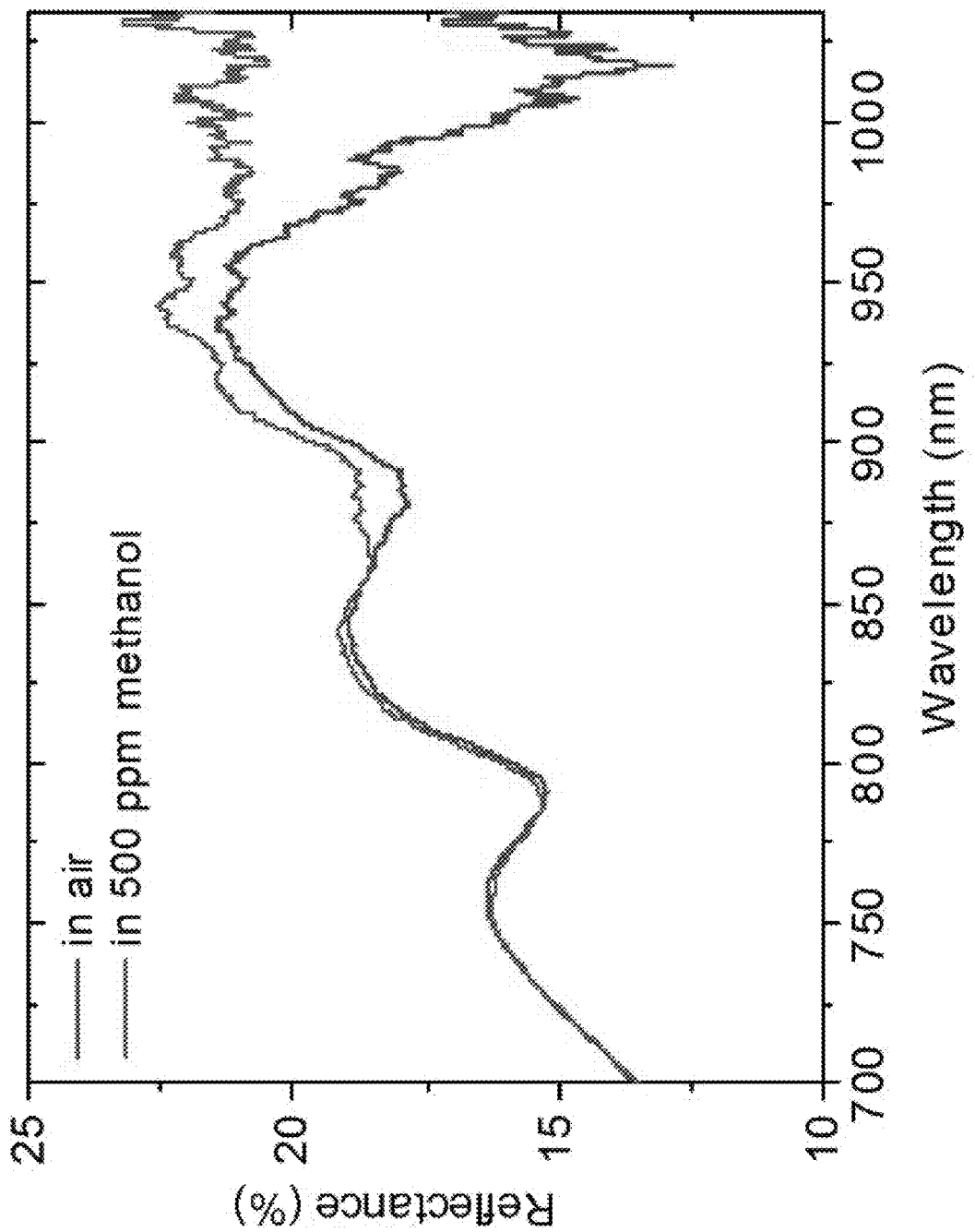

FIG. 23: Measured reflection spectra before and after the GO thin film is exposed to gaseous methanol.

Figure 24:
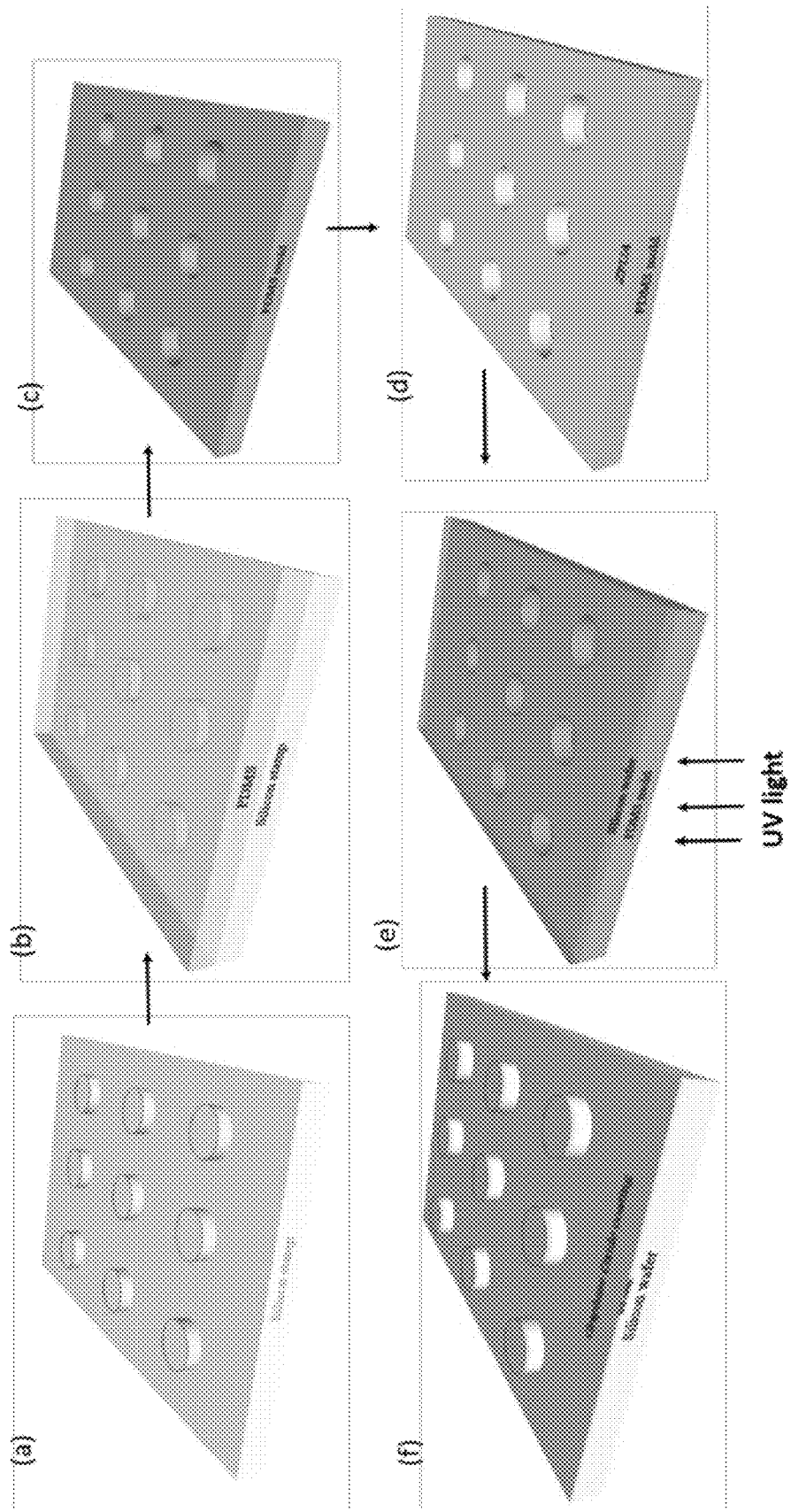

FIG. 24: Fabrication process of GO coated plasmonic crystal sensor. (a) Si master mold carrying nanoposts with period (Λ=500 nm), diameter (d=250 nm), and height (h=210 nm). (b) PDMS is poured on the Si stamp. (c) PDMS is peeled off the stamp. (d) ZPUA is poured on the PDMS mold. (e) The PDMS mold is pressed against the Si wafer and exposed to UV radiation. (f) 50 nm gold coating followed by GO coating on the device.

IV. DETAILED DESCRIPTION OF EXEMPLARY EMBODIMENTS OF THE INVENTION

A. Overview

For better understanding of the invention, a few examples of forms the invention can take will now be described in detail. As will be understood by those of skill in the art, the invention can take a wide variety of forms and embodiments. The following examples are neither exclusive nor inclusive of all possible forms.

For example, the generalized invention can be applied to various functions and in various configurations. Below will be supplied two specific examples. But those skilled in the art will appreciate the invention can be applied in analogous ways to other devices and for other functions.

For further example, specifics regarding form factor, steps, and other aspects of the nanopatterning of a fiber optic tip are given in a specific example below. But variations are possible. The same is true for the second specific example below, the nanopatterning of a surface for purposes of chemical detection.

For example, in chemical detection of VOC's, specifics regarding such things as GO layer thickness, nanopost form factor (e.g. height and diameter), and type and placement of metal for plasmonic response, are set forth for certain target species VOCs. Variations obvious to those skilled in the art will be included within the invention which can be applied and fabricated in analogous ways.

Following will be a generalized discussion of the concept, then a specific discussion of examples of device fabrication and implementation. Thereafter will be a discussion of some examples of alternatives and options.

B. Generalized Concept

In general, aspects of the invention relate to a rapid, simple, and high-resolution technique for nanopatterning functional devices, in comparison to reported techniques. The invention benefits the state of the art in at least these ways.

One skilled in this technical field can appreciate the technique with reference to two demonstrated specific examples of its implementation and subsequent use.

The first specific example, set forth below, relates to patterning the tip of an optical fiber with nanophotonic structures for the purpose of refractive index sensing.

The second specific example, following the first, relates to patterning a surface or device with plasmonic nanostructures that can be used, e.g., in the detection of VOCs.

It is to be understood, however, that the invention can take additional forms and embodiments and is not limited to the specific examples.

C. Specific Example 1

The following specific example relates to FIGS. 1-13 and is also discussed in Shawana Tabassum, Yifei Wang, Jikang Qu, Qiugu Wang, Seval Oren, Robert J. Weber, Meng Lu, Ratnesh Kumar, and Liang Dong, Patterning of nanophotonic structures at optical fiber tip for refractive index sensing, 2016 IEEE SENSORS, Orlando, F L, 2016, pp. 1-3, which is incorporated by reference herein.

The paper extends the conference version [45] (see http://ieeexplore.ieee.org/abstract/document/7808581/) incorporated by reference herein.

See also Article in IEEE Sensors Journal September 2017 DOI: 10.1109/JSEN.2017.2748593, available on-line Oct. 23, 2017 at:
https://www.researchgate.net/profile/Shawana_Tabassum/publication/319349510_Nanopatterned_Optical_Fiber_Tip_for_Guided_Mode_Resonance_and_Application_to_Gas_Sensing/links/59ae3da90f7e9bdd115eb9cd/Nanopatterned-Optical-Fiber-Tip-for-Guided-Mode-Resonance-and-Application-to-Gas-Sensing.pdf and which is incorporated by reference herein.

Nanopatterned Optical Fiber Tip for Guided Mode Resonance and Application to Gas Sensing Abstract—This paper reports on an efficient and convenient method of patterning nanostructures on the cleaved facet of an optical fiber to realize a high-performance fiber-optic gas sensor. The fabrication method utilizes an ultraviolet assisted nanoimprint lithography to transfer nanoscale patterns from a pre-formed stamp to the fiber tip. The novelty of this work lies in utilizing simpler fabrication steps with better control over angle of contact at the fiber tip, which leads to rapid and precise formation of nanostructures with well-defined features. A periodic array of polymer nanoposts are formed at the fiber tip and coated with titanium dioxide to serve as a guided mode resonant (GMR) device. A gas sensor is realized by coating the GMR structure with a thin layer of graphene oxide (GO) nanosheets. We have utilized the resonance sensitivity of the nanopatterned fiber-tip gas sensor to surrounding refractive index. The abundant functional groups available at GO provides an effective adsorption surface for gas molecules. Microscopic imaging and spectroscopic studies are conducted to illustrate the structural and optical properties, and gas-sensing performance of the sensor. Volatile organic compounds such as ethylene and methanol, associated with crop plant health, are detected by the sensor. The sensor provides sensitivities of 0.92 pm/ppm and 1.37 pm/ppm for ethylene and methanol vapors, respectively, with a threefold enhancement in sensitivity and 50% reduction in response time compared to the non-GO coated counterpart. In addition, the sensor demonstrates good stability and reproducibility, thus having a great potential in fiber-optic remote sensing applications.

Keywords—fiber-optic gas sensor; nanoimprint lithography; guided mode resonance; graphene oxide; titanium dioxide.

Introduction

Nanostructuring is one of the most explored platforms in the nanophotonics area due to its light control property at the nanoscale. There are several studies for nanopatterning by incorporating metal or metal oxide to realize sub-wavelength structures for resonant field confinement and enhancement [1], [2]. Some of these structures have been employed for sensing applications such as liquid-phase detection of proteins [3], DNA [4], glucose [5], and cancer biomarkers [6], and gas-phase detection of various molecules [7-9]. However, the relatively large overall device size of these structures and the complex optical coupling systems do not allow them to be easily inserted into remote regions (as in endoscopy). The ability of creating high-resolution nanopatterns on the micron size tip of optical fiber has a potential of remote sensing applications, with different detection devices such as diffraction gratings, photonic crystals, and micro-ring resonators. Yet, the number of studies on patterning the tips of optical fibers and utilizing them as a sensing mechanism is limited. This paper reports on our contributions in the above context.

The implementation of fiber-tip based sensor can offer numerous advantages, especially in terms of elimination of bulky optics and easy insertion of the device to sensing area. The microscopic cross-section size and high mechanical flexibility of optical fibers allow in-vivo, remote diagnostic detection. A number of approaches have been pursued wherein the fiber end facet has been modified to realize structures capable of detecting analyte molecules. For example, localized surface plasmon resonance based fiber-tip probes have been realized for ultrasensitive detection of protein biomarkers [10], [11]. A fiber tip-based Fabry-Perot (FP) gas sensing probe composed of a silver layer and a vapor-sensitive polymer layer has also been developed for detection of methanol, acetone, and hexanol vapors [12]. In addition, a combination of fiber tip-based evanescent field and quartz-enhanced photoacoustic sensor has been recently utilized to detect carbon monoxide [13]. However, due to the lack of suitable absorption materials for detecting gas molecules, the sensitivity to surrounding gas concentrations remains a challenge. Recently, graphene oxide (GO) has been utilized in the development of highly sensitive sensors as it possesses many unique properties such as high surface-area-to-volume ratio [14], [15] and variety of functional groups (e.g., carboxyl, hydroxyl, carbonyl and epoxide) at the GO surface, providing traps for gas species [16]. Although GO and GO-based nanocomposites have been used extensively on conventional planar substrates for sensing gas species [17]-[19], few studies exist on integrating GO nanosheets at the optical fiber tip to explore sensing applications [20]. In this paper we report below our findings on GO-layer induced enhanced sensitivity, towards the fiber-optic measurement of gas concentrations.

Several fabrication processes have been reported to pattern unconventional substrates including optical fiber tips. The standard technologies, such as electron beam lithography (EBL) [10], [21], reactive ion etching [10], [22], and liftoff [11] were utilized to pattern nanostructures on fiber facets. Although these methods can produce repeatable patterns, spin coating resist and etching are challenging on fiber facets because of their small size, non-planarity and mechanical flexibility. An alternative approach used evaporation to deposit resist at the fiber tip, which eliminated the need of spin coating the resist [23]. However, the requirements of specialized vacuum equipment and resist made the process intricate. Obtaining a thin and uniform resist layer for high resolution patterning at fiber tip using EBL remains a challenge. In addition, the focused ion beam (FIB) was employed as a direct writing approach to efficiently mill a regular lattice of nanoholes [24] and microchannels [25] on fiber facets. However, the fabrication process is not defect free due to unwanted ion doping and angled sidewalls of the patterned structure [25]. Moreover, due to the serial FIB milling process, fabricating complex patterns at the fiber tip is time consuming. Furthermore, nanoskiving technique [26] was explored to pattern an array of metallic nanostructures on a fiber tip. However, the mechanical stress and the structural folding induced during nanoskiving make the yield of this process low [26]. Recently, nanoimprint lithography (NIL) [27] emerged as an attractive patterning technique due to its ultrahigh resolutions, simplicity, and cost-effectiveness. Since NIL relies on direct mechanical deformation of resist material, it can achieve resolution limit down to sub-10 nm region. These features of NIL make it a good candidate for fiber tip patterning. An ultraviolet (UV) based NIL method has already been reported for fiber tip patterning, but it requires non-trivial inclined UV incidence making the process tedious [28]. Our paper reports some key improvements, summarized at the end of this section.

In this paper, we demonstrate a simple and efficient method to inscribe high-resolution nanophotonic patterns on the cleaved facets of optical fibers using UV assisted NIL [29], [30]. The nanostructured patterns are made of SU8 photoresist and coated by a thin layer of titanium dioxide ($TiO_2$) in order to form a fiber optic sensor utilizing guided mode resonance (GMR) and its shift when exposed to analytes. The resonance shift is due to the leaky modes of the GMR structure that allows for the interaction with the analyte on its structure surface. The incident light energy is coupled to these radiated leaky modes. Since the deposited $TiO_2$ at the fiber tip acts as a light confinement layer, the device works as a high contrast grating in which the optical field associated with the GMR modes is evanescently confined near the surface. The successful transfer of nanostructures of different forms to the fiber tip is confirmed by scanning electron microscopy (SEM) and optical spectroscopy. A photonic crystal cavity made out of a GaAs membrane with embedded high density InAs quantum dots has earlier been realized at a fiber tip, that works as a biosensor [31]. We, on the other hand, have demonstrated a new fiber-tip GMR structure integrated with GO, toward a first application in gas sensing. This fiber tip patterning technology allows producing fiber-optic sensors for remote in-field measurements in biomedical, environmental, agricultural, and other applications.

Measurements of the GMR resonance shift in the presence of the gas analytes near the fiber tip surface are performed to validate the workability of the nanostructures as a fiber-optic sensor. The GMR device is further coated with a thin layer of GO nanosheets to enhance gas adsorption at the fiber tip. Sensitivity and reproducibility studies are also performed for the proposed sensor. In summary, the contributions of this work are as follows:
  Simple and efficient process for nanopatterning the optical fiber tip.
  A comprehensive physics based explanation of the functioning of the device as the light passes through the fiber and hits the $TiO_2$ coated grated waveguide structure at the fiber tip.
  A complete characterization of $TiO_2$ coated nanopatterns transferred to the fiber tip.
  Utilization of the GO-coated GMR structure to monitor surrounding refractive index changes in response to the changing concentrations of the analytes.
  Application to gas sensing and characterization for methanol and ethylene.

Device Fabrication

The device fabrication process starts from preparing a flat-cleaved fiber tip and a transparent mold with patterns made on a glass wafer. First, an array of nanoposts was formed on a glass wafer using soft lithography based replica nanomolding process. Next, the nanopatterns were transferred from the glass to the fiber tip using a low-viscous UV curable resist. This UV-NIL technique circumvents the need to apply the lithography processes directly to smaller fiber facet. Instead, a larger carrier wafer was processed first, and then using UV-NIL, the nanostructures were transferred from the carrier to the fiber tip.

Mold Preparation

Preparation of a glass wafer mold carrying nanoposts consists of a number of steps depicted in FIG. 1(a-d), followed by their transfer to the fiber tip as in FIG. 1 (e-g).

First, a polydimethylsiloxane (PDMS) mold was formed from a silicon (Si) master mold (LightSmyth Technologies). The Si master mold with nanopatterns was silanized by (tridecafluoro-1, 1, 2, 2-tetrahydrooctyl)-1-trichlorosilane (T2492-KG, United Chemical Technologies) in a desiccator under vacuum condition for 20 min. Subsequently, an s-PDMS precursor solution was prepared by mixing Sylgard 184 (Dow Corning) and curing agent at the weight ratio of 10:1 and degassed in a vacuum desiccator for 20 min. The s-PDMS mixture was then poured onto the top surface of silanized Si mold and cured on a hotplate at 65° C. for 2 hrs (FIG. 1a). After that, the PDMS slab containing a square array of nanoholes was peeled from the Si mold (FIG. 1b). Next, a UV curable polymer (ZIPCONE™ UA or ZPUA) was used to imprint the nanopatterns from the PDMS mold to the glass wafer [FIG. 1(c-d)]. At first, the glass wafer was spin coated with an adhesive layer of Transpin at 3000 rpm for 40 s and subsequently heated at 200° C. for 5 min. This step is required to enhance the adhesion ability of ZPUA to glass wafer resulting in complete transfer of ZPUA nanoposts to the glass. Next, ZPUA was dropped on the PDMS mold (FIG. 1c) and the mold was then placed on top of the glass wafer. Then the wafer was exposed to UV light for 5 min at an intensity of 3.3 mW/cm² (FIG. 1d). Separation of the PDMS mold from the glass resulted in nanoposts transferred to the glass wafer.

Transferring Patterns to Fiber Tip

The first step was to strip the polymer jacket of the fiber with a fiber stripper and to clean the fiber facet using isopropyl alcohol (IPA). The next step was to cleave the stripped multimode fiber (FT200EMT, Thorlabs) using a fiber cleaver to obtain a flat fiber tip. Further, the glass wafer with ZPUA nanoposts was treated with an anti-adhesion coating by salinization in vacuum ($10^{-5}$ mTorr) using trichloro(1H,1H,2H,2H-perfluoro-octyl) silane. The anti-adhesion treatment minimized the adhesion between the glass wafer and the UV-curable resist, thus facilitating easy release of the fiber tip from the mold. The next step was to use a low-viscous UV curable resist (SU8-2000) to transfer the patterns from the ZPUA mold to the fiber tip. For that, the fiber was first dipped into SU8-2000, and then mounted on an XYZ stage (FIG. 1e). It was then gradually approached towards the mold until the tip touched the mold, resulting in filling the grating cavities with the resist (FIG. 1f). Subsequently, the fiber tip was exposed to UV light with the intensity of 14 mW/cm² for 15 min. After the UV irradiation, the fiber tip was lifted from the mold (FIG. 1g).

The critical steps of the process flow include selecting a low viscous UV curable resist and finding the optimum UV intensity and exposure time. Highly viscous resist only partially fills the nanoholes resulting in incomplete pattern transfer to fiber tip. Other reports [28] used an opaque substrate such as Si wafer to form the master mold, which required an oblique UV incidence to polymerize the photoresist. As the UV exposure energy needed is sensitive to the angle between the mold and the fiber tip, the energy-control is relatively poor in that setting. In contrast, the energy is more controllable in our case, owing to a transparent mold and a normal incidence light for polymerization.

Next, to form a fiber-tip GMR device, a 160 nm-thick $TiO_2$ layer was deposited using e-beam evaporation at the nanopatterned fiber tip. The TiO$_2$ coated fiber tip was further coated with GO nanosheets to allow gas adsorption and sensing, by measuring resonance shifts of a GMR mode. The 160 nm-thick TiO$_2$ coating was chosen because through simulation, we found that this thickness concentrates a main electric field inside TiO$_2$, with part of the evanescent field penetrating through the GO layer into the surrounding environment. The field distribution at the resonant mode of the GMR structure is described later in the Results and Discussion section. For thicknesses other than 160 nm, there is little evanescent field penetrating into the surrounding medium, and hence not suitable for probing the surrounding for gas detection. To prepare a GO suspension solution, 2 mg of synthesized GO nanosheets (purchased from Graphene Supermarket) was thoroughly dispersed in 1 ml of deionized (DI) water, followed by sonication at room temperature for 90 min. This solution was then diluted to make a GO dispersion solution with concentration of 0.1 mg/ml (0.1 mg of GO in 1 ml of DI water). The surfaces of three fiber-tip sensors were made hydrophilic using oxygen plasma treatment before drop-coating with different amounts of GO suspension solutions. Three identical fiber-tip sensors were further drop-coated by 0.02 µl/µm$^2$ of 0.1 mg/ml GO suspension solution once, twice, and thrice, respectively. In this way, three different fiber-tip sensors of varying GO thicknesses were formed. These sensors were then dried at room temperature for 2 hr.

Working Principle and Mathematical Characterization

The nanopatterns at the fiber tip were designed to have a period of 500 nm, the hole diameter of 250 nm, and the hole height of 210 nm. The nanoholes coated with the 160 nm-thick TiO$_2$ layer acts as a GMR device as light passes from the fiber to the TiO$_2$ layer and is then detected by the detector. Resonance occurs when there is a phase matching of excitation light with a GMR mode. This significantly enhances the near-field intensity associated with the GMR modes and is also sensitive to the changes in the surrounding refractive index.

As shown in FIG. 2, the present structure is a three-layered dielectric waveguide-grating composed of a polymer layer (SU-8) of refractive index $\eta_{su8}=1.6$, a grated TiO$_2$ layer of average refractive index $\eta_{avg}$, and a surrounding medium (air) of refractive index $\eta_{air}=1$ (air). The grated layer consists of alternating high index ($\eta_H=\eta_{TiO2}=2.49$) and low index ($\eta_L=\eta_{air}=1$) materials. $\eta_{avg}$ can be expressed by the following equation [32]:

$$\eta_{avg}=\sqrt{\eta_L^2+f(\eta_H^2-\eta_L^2)}, \quad (1)$$

where f is the fill actor (fraction of the grating containing the high refractive index material). For the proposed structure, f=0.5 and hence $\eta_{avg}=1.904$. The average refractive index $\eta_{avg}$ of the grating structure must be greater than that of the substrate and the medium above to allow total internal reflection and light confinement. The sub-wavelength grating couples the incident light into a strongly confined mode of the waveguide structure, leading to a guided mode resonance. The resonance wavelength and the angle of total internal reflection due to the guided mode can be obtained by ignoring the material dispersion. For transverse-electric (TE) polarization, the wave propagation in an asymmetric waveguide grating can be expressed by the coupled-wave equation as follows [33]:

$$\frac{d^2 E_i(z)}{dz^2} + \left[\beta^2 \eta_{avg}^2 - \beta^2 \left(\eta_{avg}\sin\theta - i\frac{\lambda}{\Lambda}\right)^2\right]E_i(z) + \frac{1}{2}\beta^2 \Delta\eta^2 [E_{i+1}(z) + E_{i-1}(z)] = 0 \quad (2)$$

where $E_i(z)$ is the electric-field amplitude of the ith space harmonic, $\lambda$ is wavelength of incident light, $\Lambda$ is grating period, $$\beta = \frac{2\pi}{\lambda_{GMR}}$$

is the propagation constant in the waveguide ($\lambda_{GMR}$ the corresponding wavelength), $\theta$ is internal angle of incidence in the waveguide (FIG. 2), and $\Delta\eta=(\eta_H-\eta_L)$ denotes the modulation of the grating structure.

Our goal is to determine the values for $\theta$ and $$\beta = \frac{2\pi}{\lambda_{GMR}}$$

to know the critical angle and the propagation constant in the grated waveguide. We will first find $\theta$, which actually depends on the allowed mode angles within the fiber core, through which the light passes first. Let $\theta_m$ denote the mth mode angle within the fiber core which, in our design, is a multimode fiber (FT200EMT, Thorlabs) with core refractive index, $\eta_{core}=1.45$ and cladding refractive index, $\eta_{clad}=1.39$. This results in a weakly guided fiber with a fractional refractive index change $\Delta$, calculated from the equation in [34], to be:

$$\Delta = \frac{\eta_{core}^2 - \eta_{clad}^2}{2\eta_{core}^2} = 0.04 \ll 1 \quad (3)$$

In such a weakly guided fiber, the grouped-together modes behave as linearly polarized modes, which leads to their following characteristic equation [34]:

$$-\sqrt{1-b}\frac{J_{m-1}(V\sqrt{1-b})}{J_m(V\sqrt{1-b})} = \sqrt{b}\frac{K_{m-1}(V\sqrt{b})}{K_m(V\sqrt{b})}, \quad (4)$$

where $J_m$ is the Bessel function of the first kind, $K_m$ is the modified Bessel function of the second kind, $$V = 2\pi\frac{a}{\lambda}\sqrt{\eta_{core}^2 - \eta_{clad}^2}$$

with the fiber core diameter 2α=200 µm, and $$b = \frac{\eta_{eff}^2 - \eta_{clad}^2}{\eta_{core}^2 - \eta_{clad}^2}$$

with $\eta_{eff}=\eta_{core} \sin \theta_m$.

It can be seen that the only unknown in Eq. (4) is the mode angle $\theta_m$ in the fiber. This equation can be solved graphically by plotting right and left hand sides versus b and finding the intersections. From the value of b, the allowed mode angles $\theta_m$ inside the fiber core can be determined. Next the angle $\theta$ can be found using the following equation, of the grating, that relates the two angles:

$$\eta_H \sin\theta - \eta_{core}\sin\theta_m = i\frac{\lambda}{\Lambda} \quad (5)$$

Note for the ith space harmonic guided wave to exist in the grated waveguide structure, the angle must also satisfy:

$$\max(\eta_{air}, \eta_{su8}) \le \eta_{avg}\sin\theta - i\frac{\lambda}{\Lambda} < \eta_{avg} \quad (6)$$

Once $\theta$ is known by solving (5) and also satisfying the constraint of (6), an eigenvalue equation can be employed to find $\beta$. For the case of TE polarization, the eigenvalue of the modulated waveguide is given by [35]:

$$\tan(k_i d) = \frac{k_i(\gamma_i + \delta_i)}{k_i^2 - \gamma_i \delta_i}, \quad (7)$$

where d is the thickness of the TiO$_2$ layer, $k_i = \sqrt{\beta^2 \eta_{avg}^2 - \beta_i^2}$, $\gamma_i = \sqrt{\beta_i^2 - \beta^2 \eta_{air}^2}$, $\delta_i = \sqrt{\beta_i^2 - \beta^2 \eta_{su8}^2}$, and $$\beta_i = \beta\left(\eta_{avg}\sin\theta - i\frac{\lambda}{\Lambda}\right)$$

denotes the effective propagation constant of waveguide grating. On the other hand, for the transverse-magnetic (TM) polarization, the eigenvalue can be expressed as [35]:

$$\tan(k_i d) = \frac{\eta_{avg}^2 k_i(\eta_3^2 \gamma_i + \eta_1^2 \delta_i)}{\eta_1^2 \eta_3^2 k_i^2 - \eta_{avg}^4 \gamma_i \delta_i} \quad (8)$$

Eq. (7) for TE modes or Eq. (8) for TM modes can be solved numerically to find $\beta$, which is the only remaining unknown in those equations. This in turn can be used to find the guided mode resonance wavelength, $$\lambda_{GMR} = \frac{2\pi}{\beta}.$$

It can be observed that any changes in the surrounding refractive index $\eta_L$ will lead to a change in $\eta_{avg}$, causing a shift of resonant wavelength and establishing our working principle.

Results and Discussion

Characterization of Nanopatterns at Fiber Tip

The fiber tip was observed under a stereomicroscope (Leica, 205FA). The corresponding reflective color patterns from the grating patterned at the fiber tip for different incident angles were observed (FIG. 3).

The SEM analysis was performed to characterize the nanopatterns transferred to the fiber tip (FIG. 4). The square lattice of nanoholes at the fiber tip with pitch of 500 nm and groove depth of 210 nm (FIG. 4b), was used as a gas sensor (described later in the Application to Gas Sensing section). It was also confirmed from this SEM image that full coverage of the nanoholes is achieved when coated with a 160 nm-thick TiO$_2$ layer (FIG. 4c). FIG. 4d shows the TiO$_2$ coated nanoholes further covered with 0.5 mg/ml dispersion solution of GO nanosheets, and verifies the uniformity and adherence of the GO coating on the fiber tip. The reproducibility of our process was confirmed by fabricating TiO$_2$/GO layered nanoholes at the tips of three identical optical fibers, as shown in FIGS. 4d-f. In addition, four other types of nanostructures were transferred to optical fiber tips using the same fabrication steps as illustrated in FIGS. 12a-12d of the Supplementary Materials section presented at the end, in an appendix. FIG. 12a illustrates the nanoposts having pitch of 500 nm and groove depth of 150 nm with triangular lattice, whereas FIGS. 12b, 12c and 12d depict, respectively, the nanoholes (pitch of 700 nm and groove depth of 150 nm) with triangular lattice, nanoposts (pitch of 500 nm and groove depth of 210 nm) with square lattice, and linear nanostamps (pitch of 700 nm and groove depth of 150 nm). To visualize the complete structure transferred to the fiber tip, a 75° tilted view of the linear stamps was captured to reveal the height of the nanostamps at the tip (FIG. 12e). Moreover, the height of remaining polymer beneath the nanoposts was also observed, which was approximately 880 nm (FIG. 12f). This clearly demonstrates the versatility of our pattern transfer process (as explained in the Device Fabrication section) to realize different types of nanostructures at the fiber tip.

For sensing purposes, only the fiber tip patterned with square lattice of nanoholes (FIG. 4) was utilized. Different structures were designed, mainly to establish the fabrication capability of our process, and also to conduct an initial structural optimization with respect to sensor sensitivity.

Further, we conducted Raman spectroscopy to characterize the GO coating at the fiber tip. The Raman spectrum of GO depicts the characteristic peaks of D and G at 1354 cm$^{-1}$ and 1598 cm$^{-1}$ respectively (FIG. 5). The G band is associated with C—C bond stretch in sp$^2$ carbon domains and the D band appears due to the presence of disorders in the GO nanosheets [36].

Bulk Refractive Index Change Characterizations

The optical properties of the GMR structure at the fiber tip were measured by coupling a white light from a halogen light source (150 watt quartz halogen lamp, Luxtec Fiber Optics) into the multimode fiber carrying nanopatterns at the tip. The device fiber was next coupled to another multimode fiber through a slotted mating sleeve (ADAF1, Thorlabs). The transmitted light was collected from the multimode fiber into a spectrometer (USB4000, Ocean Optics) (FIG. 6).

The measured transmission spectrum for a 2D nanohole array, with square lattice at the fiber tip coated with a 160 nm-thick layer of TiO$_2$, is shown in FIG. 7a, where the interaction of light with the grating structure resulted in a dip D$_{e1}$. Note that another dip, D$_{e2}$ occurred in the measured spectra. However, it can be observed that with a change in surrounding refractive index, only the first dip D$_{e1}$ changes significantly compared to D$_{e2}$, meaning that it is the first dip D$_{e1}$ that represents the GMR mode. Next, we performed index sensitivity measurements of the fiber-tip GMR structure in three different liquids. The slotted fiber mating sleeve (FIG. 6) allowed easy exposure of nanopatterned fiber tip to the chemicals. As the surrounding medium of the fiber tip was changed by introducing water ($\eta_{water}$=1.33), acetone ($\eta_{acetone}$=1.36), and IPA ($\eta_{IPA}$=1.38), on the fiber tip, the resonance wavelength shifted to 813 nm, 819 nm and 821.5 nm respectively. The higher the surrounding refractive index, the larger the observed resonance shift. Based on these measurements, the device exhibited an index sensitivity of 183.3 nm/RIU (plotted in FIG. 7b).

Electromagnetic simulations were carried out using commercial software DiffractMOD (RSoft Synopsis) to analyze the optical properties of the fabricated nanopatterns at the fiber tip. The electric field enhancement of the $TiO_2$ coated GMR structure at the resonant wavelength of 810.75 nm (in air) is depicted in the inset of FIG. 7a. The enhancement accounts for the strong confinement of GMR mode by the high-index $TiO_2$ layer (see the field distribution of the GMR mode in the inset of FIG. 7a).

Further, transmittance spectra were measured for a 2D nanohole array with triangular lattice and 1D array with linear nanostamps, transferred to the fiber tip (as shown in FIG. 13 of Supplementary Materials). These 1D and 2D gratings, when coated by $TiO_2$, a high index material, have different resonances, per the GMR theory [37], and also illustrated in FIG. 13. Four transmittance dips at $D_{T1}$=507 nm, $D_{T2}$=634 nm, $D_{T3}$=711.5 nm, $D_{T4}$=797.5 nm and three dips at $D_{L1}$=433.5 nm, $D_{L2}$=754 nm, $D_{L3}$=842.5 nm were observed for the triangular array of nanoholes and linear nanostamps respectively. As 2D GMR structures have higher Q-factor than 1D structures (due to low loss) and 2D square lattice resonances are independent of polarization as compared to 2D triangular lattice that produces highly polarization dependent resonances [37], we used only the 2D square array of nanoholes for gas sensing.

Application to Gas Sensing

In this part of the work, we demonstrated the $TiO_2$ coated nanopatterned fiber tip as a gas sensor. An extra coating of GO was applied at the fiber tip and the sensor performance was recorded with and without the GO coating. Without the presence of any gas, the sensor exhibited a resonance at approximately 810.75 nm.

The gas species (pre-diluted with nitrogen) flowed from cylinders into an aluminum chamber which contained the device fiber. The optical setup as illustrated in FIG. 6 was used to illuminate the sensor at the fiber tip as well as to collect the transmitted light. Inside the chamber, the testing gas was further diluted by the carrier nitrogen gas. The gas flow rate was controlled by a mass flow controller (GFC17, Aalborg). Ethylene with concentrations of 857 ppm, 909 ppm and methanol with concentrations of 428 ppm, 454 ppm were tested. A constant flow rate of dry nitrogen (10 ml/min) was maintained inside the closed chamber and flow rate of ethylene and/or methanol was varied to modify the concentration of the test gases at regular intervals using the mass flow meter. In order to ensure that no false spectral shifts occur due to the presence of moisture, dry nitrogen was used to drive away moisture from the chamber before exposing the sensor to gas species.

At first, we tested without any GO coating on the sensor surface. When only nitrogen was introduced into the chamber, the resonance wavelength was red-shifted to 810.85 nm after an interval of approximately 10 min (FIG. 8). The shift in resonance wavelength can be explained theoretically with the help of eqns. (1)-(8). As the surrounding dielectric medium changes from air to nitrogen, $\eta_{avg}$ in eqn. (1) increases and hence we see an increase in GMR wavelength, $\lambda_{GMR}$. The slower response time of the sensor is attributed to the lack of a gas adsorption layer at the sensor surface leading to slower interaction of gas molecules with the GMR structure. When the sensor response was saturated in the presence of nitrogen gas, ethylene was flown into the chamber. Due to an increase in surrounding refractive index, red-shifts of 0.2 nm and 0.1 nm were observed with 857 ppm and 909 ppm of ethylene respectively as depicted in FIG. 8b. Without any GO coating, the sensor response was quite slow and also there was a very small resonance wavelength shift upon exposure to gases. In order to get a fast, repeatable and more sensitive response, the sensor was further coated with a thin layer of GO nanosheets to form a sensitive surface for adsorbing gas molecules. An array of three sensors was designed wherein each sensor was coated with a different thickness of GO. FIG. 9 shows the resonance spectra of the three sensors with three different thicknesses of GO (48.9 nm, 97.8 nm, and 146 nm) before and after being exposed to ethylene and methanol at different concentrations. With 48.9 nm, 97.8 nm and 146 nm GO coating, the resonance wavelength shifted from 810.75 nm to 811.75 nm, 812 nm and 812.11 nm respectively (FIG. 9). The measurement setup is same as explained above without any GO. However, when a GO coating was used, the sensor response time reduced from 10 min to approximately 5 min. The large number of binding sites available on the GO coating resulted in increased absorption of gas molecules at the sensor surface. As a result, the sensor encountered a higher change in surrounding refractive index and hence a larger resonance wavelength shifts as compared to when there was no GO coating. For example, with 48.9 nm GO coating, resonance wavelength shifts of 0.5 nm and 0.5 nm were observed in response to 857 ppm and 909 ppm ethylene respectively (FIG. 9a) which are approximately 3.3 times higher than the shifts observed without any GO coating. The sensor was further exposed to gaseous methanol, and again large resonance shifts were observed with GO coating as compared to without any GO coating (FIG. 9b). However, too thick a GO coating may result in saturation of binding sites on GO farther from the sensor surface. This may inhibit the gas molecules from coming in contact with the active portion of sensor surface, leading to a reduction in wavelength shift or no response. This effect is depicted in FIG. 9c. With 146 nm GO coating, less resonance wavelength shifts were observed for 909 ppm ethylene and 454 ppm methanol.

Sensitivity, Kinetics and Reproducibility Studies

We measured the sensitivity of our sensor, and compared that with existing studies. The sensitivity of the fiber-tip sensor to gaseous ethylene without any GO coating (FIG. 8) was found to be 0.277 pm/ppm. However, the sensitivities of the same sensor to gaseous ethylene and methanol with GO coating (FIG. 9c) were found to be approximately 0.92 pm/ppm and 1.37 pm/ppm respectively. Hence, the presence of GO coating resulted in a three-fold increase in sensitivity to ethylene. In addition, the response time of the GO coated sensor decreased by half as compared to no GO coating.

A fiber-tip based FP sensor exhibited a sensitivity of 3.53 pm/ppm for methanol vapor [12], which is higher than ours, but our fiber-tip sensor offers other advantages. Firstly, it is superior in terms of fabrication method. The FP sensor is comprised of a silver coating and a vapor sensitive polymer layer. The electroless plating method was used for the silver coating [12], which required precise control of plating parameters such as temperature and concentration of chemicals. In contrast, our sensor employs inexpensive and simple nanomolding and UV-NIL processes to fabricate nanopattern-based GMR structure. Furthermore, in order to selectively identify gas species, different polymer materials were used (PEG 400 and NOA 81) in the FP fiber-tip sensor. But in our work, by simply varying the thicknesses of the GO coatings on the sensing elements in a sensor array, it is possible to differentiate one gas from others in a gas mixture using pattern recognition algorithms. There is no need of changing the structures of nanoposts that otherwise will require costly nanoscale master molds, or varying compositions of gas absorbing materials. In another work, an optical fiber long period grating gas sensor exhibited a sensitivity of 0.2 pm/ppm for methanol gas [38] which is almost 15 fold less than that of our sensor. Finally, to our knowledge, no ethylene detection sensor has been reported so far based on the principle of optical resonance wavelength shift.

We further recorded absorption and desorption kinetics of the sensor with three different thicknesses of GO (48.9 nm, 97.8 nm and 146 nm) as shown in FIG. 10. During each experiment, the sensor was first exposed to 857 ppm and then 909 ppm of gaseous ethylene and after that thermally treated on a hot plate at 70° C. for 2 hrs in order to allow the quick desorption of gas molecules from the GO layer. Thus, thermal treatment of the fiber tip resulted in a return of the resonance wavelength to the baseline value of 812 nm as was also confirmed through experiment and shown in FIG. 10a. For comparison, we also performed the dynamic measurements without any GO coating (FIG. 10d). It is apparent from FIG. 10 that the sensor exhibits a much faster response and a much higher sensitivity when coated with GO nanosheets.

To test the reproducibility of the sensor, we made three identical sensors, each of them coated with 48.9 nm GO nanosheets. The three sensors exhibited resonance at the same wavelength of approximately 810.75 nm (FIG. 11a). Moreover, under the same condition these sensors were used to detect ethylene gas at a given concentration (857 ppm). FIG. 11b shows the resonance shifts obtained with each sensor when exposed to 857 ppm gaseous ethylene. Each sensor was run for three repeated measurements. A standard deviation of 0.1 nm in optical resonance was observed for all the three sensors which indicates that the sensor offered good reproducibility.

Comparison to Existing Fiber-Tip Gas Sensors

We presented a simple and economical method to fabricate high-resolution and repeatable nanopatterns at the optical fiber tip using UV assisted NIL, as well as a fiber-tip based GMR device integrated with GO nanosheets, to act as gas sensors. The integration of periodic nanostructures at the fiber tip facilitates light trapping at nanoscale providing a compact optical system which can be used for various sensing purposes. Previously, gas sensors have been reported at the fiber tip such as a Fabry-Perot (FP) sensor [39]. Generally, the FP sensors incorporate a single or a matrix of gas sensitive polymer layers, wherein vapor absorption at the polymer layer causes spectral shifts in the FP resonance [12], [40]. These FP sensors offer higher sensitivity, but the selective detection of different gas species entails coating the FP chamber atop the fiber tip with a gas-selective composition of polymer materials, adding to fabrication complexity, that our design avoids. Another type of fiber-tip based FP sensor consists of 3D cascade cavities, which usually increases the complications of sensor fabrication [39], [41]. An extrinsic FP cavity made of the cleaved facets of two fibers has also been reported, but the performance of such FP device relies on precise alignment of the fibers [42-43]. In contrast, our sensor deploys the GMR and GO layers over a planar nanohole array, obtained by the inexpensive nanomolding and UV-NIL. Finally, ours is a "label-free" sensor, not needing a gas-selective adsorption material. We simply use varying thicknesses of the GO layer at identical fiber-tips forming an array of sensors. As shown in our prior work [44], pattern classification algorithms can be employed to analyze the measurements from the array of sensors to determine the gas species and their concentrations within a complex mixture of gases. This label-free approach keeps the fabrication process of our sensor simple, economical, yet effective.

Conclusion

In summary, through the current work we simplified the fabrication steps of transferring nanopatterns to an optical fiber tip, eliminating one out of four parameters (the tilt angle), as one of the design parameters. This cuts down the complexity of design space from $O(n^4)$ to $O(n^3)$, where n represents the number of choices per parameter. This can lead to great savings in the time needed to select the parameters of the fabrication process. Also, the non-angled normal patterning permits higher control and uniformity. We also demonstrated a $TiO_2$ coated GMR structure which is sensitive to changes in surrounding refractive index and offers shifts in its resonant wavelength. We provided a comprehensive physics-based explanation of the working principle, and also performed experiments to characterize our GMR device. The mathematical formulation showed clear dependence on the average refractive index of the grated waveguide, which changes as the grating interacts with analytes. Further the mathematical formulation also showed the dependence of the resonant wavelength on the grating period and waveguide thickness, both of which can be controlled to design an array of nanopatterns with varying sensitivities. Their combined response can be analyzed algorithmically (e.g., through pattern recognition [9]) to achieve selectivity to gas species. To enhance sensitivity and response time, the GMR structure was further coated with a thin layer of GO nanosheets to demonstrate the workability of the device as a gas sensor. GO's abundant functional groups contributed to the enhanced capture of gas species resulting in increased resonance wavelength shifts. A threefold increase in sensitivity and 50% reduction in response time to gaseous ethylene as compared to the case of no GO coating were observed. Moreover, the experiments were conducted to exhibit good stability and reproducibility of the sensor. This simplified and rapid nanostructuring at a fiber tip has the potential to be used in remote sensing applications, through the insertion of the nanopatterned fiber tips into aqueous and gaseous analytes which are otherwise inaccessible. Currently, efforts are being made to inscribe gratings around the fiber cladding in order to form brag reflectors.

Supplementary Materials

FIGS. 12 and 13 provide supporting information, as indicated.

REFERENCES (EACH OF WHICH IS INCORPORATED BY REFERENCE HEREIN)

[1] W. L. Barnes, A. Dereux, and T. W. Ebbesen, "Surface plasmon sub-wavelength optics", Nature, vol. 424, pp. 824-830, 2003.

[2] D. A. Genov, A. K. Sarychev, V. M. Shalaev, and A. Wei, "Resonant field enhancements from metal nanoparticle arrays", Nano Lett., vol. 4, pp. 153-158, 2004.

[3] N. F. Chiu, T. Y. Huang, and H. C. Lai, "Graphene oxide based surface plasmon resonance biosensors", Intech, ch. 8, 2013.

[4] J. I. L. Chen, Y. Chen, and D. S. Ginger, "Plasmonic Nanoparticle Dimers for Optical Sensing of DNA in Complex Media", J. AM. Comm. Soc., vol. 132, pp. 9600-9601, 2010.

[5] K. Aslam, J. R. Lakowicz, and C. D. Geddes, "Nanogold Plasmon Resonance-Based Glucose Sensing. 2. Wavelength-Ratiometric Resonance Light Scattering", Anal. Chem., vol. 77, pp. 2007-2014, 2005.

[6] M. A. Ali, S. Tabassum, Q. Wang, Y. Wang, R. Kumar and L. Dong, "Plasmonic-electrochemical dual modality microfluidic sensor for cancer biomarker detection", 2017 IEEE 30$^{th}$ International Conference on Micro Electro Mechanical Systems (MEMS), Las Vegas, pp. 390-393, 2017.

[7] S. K. Mishra, and B. D. Gupta, "Surface plasmon resonance-based fiber optic chlorine gas sensor utilizing indium-oxide-doped tin oxide film", Journal of Lightwave Tech., vol. 33, pp. 2770-2776, 2015.

[8] H. Xu, P. Wu, Zhu, A. Elbaz, and Z. Z. Gu, "Photonic crystal for gas sensing", Journal of Mat. Chem. C, vol. 1, pp. 6087, 2013.

[9] S. Tabassum, Q. Wang, W. Wang, S. Oren, M. A. Ali, R. Kumar, and L. Dong, "Plasmonic crystal gas sensor incorporating graphene oxide for detection of volatile organic compounds", 2016 IEEE International Conference on Micro Electro Mechanical Systems (MEMS), Shanghai, pp. 913-916, 2016.

[10] Y. Lin, Y. Zou, and R. G. Lindquist, "A reflection-based localized surface plasmon resonance fiber-optic probe for biochemical sensing", Biomed. Opt. Express, vol. 2, pp. 478-484, 2011.

[11] M. Sanders, Y. Lin, J. Wei, T. Bono, and R. G. Lindquist, "An enhanced LSPR fiber-optic nanoprobe for ultrasensitive detection of protein biomarkers", Biosens. Bioelectron, vol. 61, pp. 95-101, 2014.

[12] J. Liu, Y. Sun, and X. Fan, "Highly versatile fiber-based optical Fabry-Perot gas sensor", Opt. Express, vol. 17, pp. 2731-2738, 2009.

[13] Z. Li, Z. Wang, C. Wang, and W. Ren, "Optical fiber tip-based quartz-enhanced photoacoustic sensor for trace gas detection", Appl. Phys. B, vol. 122, num. 5, pp. 1, 2016.

[14] J. T. Robinson, F. K. Perkins, E. S. Snow, Z. Wei, and P. E. Sheehan, "Reduced graphene oxide molecular sensors", Nano Lett., vol. 8, pp. 3137-3140, 2008.

[15] X. Li, W. Cai, J. An, S. Kim, J. Nah, D. Yang, R. Piner, A. Velamakanni, I. Jung, E. Tutuc, S. K. Banerjee, L. Colombo, and R. S. Ruoff, "Large-area synthesis of high-quality and uniform graphene films on copper foils", Sci. vol. 306, 2004.

[16] S. S. Nanda, D. K. Yi, and K. Kim, "Study of antibacterial mechanism of graphene oxide using Raman spectroscopy", Sci. Reports, vol. 6, pp. 28443, 2016.

[17] G. Lu, L. E. Ocola, and J. Chen, "Gas detection using low-temperature reduced graphene oxide sheets", Appl. Phys. Lett., vol. 94, pp. 083111, 2009.

[18] J. T. Robinson, F. K. Perkins, E. S. Snow, Z. Wei, and P. E. Sheehan, "Reduced graphene oxide molecular sensors", Nano Lett., vol. 8, pp. 3137-3140, 2008.

[19] P. A. Pandey, N. R. Wilson, and J. A. Covington, "Pd-doped reduced graphene oxide sensing films for $H_2$ detection", Sens. Actuators, vol. 183, pp. 478-487, 2013.

[20] M. A. A. Rosli, P. T. Arasu, A. S. M. Noor, H. N. Lim, and N. M. Huang, "Reduced graphene oxide nano-composites layer on fiber optic tip sensor reflectance response for sensing of aqueous ethanol", Journal of the European optical society, vol. 12, 2016.

[21] M. Consales, A. Ricciardi, A. Crescitelli, E. Esposito, A. Cutolo, and A. Cusano, "Lab-on-fiber technology: Toward multifunctional optical nanoprobes", ACS Nano, vol. 6, pp. 3163-3170, 2012.

[22] W. Jung, B. Park, J. Provine, R. T. Howe, and O. Solgaard, "Highly sensitive mobolithic silicon photonic crystal fiber tip sensor for simultaneous measurement of refractive index and temperature", J. Lightwave Technol., vol. 29, pp. 1367-1374, 2011.

[23] P. S. Kelkar, and J. Beauvais, "Nano patterning on optical fiber and laser diode facet with dry resist", J. Vac. Sci. Technol. A vol. 22, pp. 743-746, 2004.

[24] Micco, A. Ricciardi, M. Pisco, V. La Ferrara and A. Cusano, "Optical fiber tip templating using direct focused ion beam milling", Nature, 2015.

[25] S. Kang, H. E. Joe, J. Kim, Y. Jeong, B. K. Min, and K. Oh, "Subwavelength plasmonic lens patterned on a composite optical fiber facet for quasi-one-dimensional bessel beam generation", Appl. Phys. Lett., vol. 98, pp. 241103, 2011.

[26] D. J. Lipomi, R. V. Martinez, M. A. Kats, S. H. Kang, P. Kim, J. Aizenberg, F. Capasso, and G. M. Whitesides, "Patterning the tips of optical fibers with metallic nanostructures using nanoskiving", Nano Lett., vol. 11, pp. 632-636, 2011.

[27] S. Y. Chou, P. R. Krauss, and P. J. Renstrom, "Imprint of sub-25 nm vias and trenches in polymer", Appl. Phys. Lett., vol. 67, pp. 3114-3116, 1995.

[28] S. Scheerlinck, P. Bienstman, E. Schacht, and D. V. Thourhout, "Metal grating patterning on fiber facets by UV-based nano imprint and transfer lithography using optical alignment", IEEE Journal of Lightwave Technology, vol. 27, pp. 10, 2009.

[29] S. Scheerlinck, D. V. Thourhout, and R. Baets, "Nano imprint lithography for photonic structure patterning", Proceedings Symposium IEEE/LEOS Benelux Chapter, 2005.

[30] J. Viheriala, T. Niemi, J. Kontio, T. Rytkonen, and M. Pessa, "Fabrication of surface reliefs on facets of single-mode optical fibres using nanoimprint lithography", Electron. Lett., vol. 43, pp. 150-152, 2007.

[31] G. Shambat, S. R. Kothapalli, A. Khurana, J. Provine, T. Sarmiento, K. Cheng, Z. Cheng, J. Harris, H. D.-Link, S. S. Gambhir, and J. Vučković, "A photonic crystal cavity-optical fiber tip nanoparticle sensor for biomedical applications", Appl. Phys. Lett., vol. 100, pp. 213702, 2012.

[32] M. S. Amin, "Design, fabrication and characterization of guided-mode resonance transmission filters", (Doctoral dissertation) ProQuest Dissertations And Theses, 2014.

[33] T. K. Gaylord, and M. G. Moharam, "Analysis and applications of optical diffraction by gratings", Proc. IEEE, vol. 73, pp. 894-937, 1985.

[34] B. E. A. Saleh, and M. C. Teich, "Fundamentals of photonics", Wiley series in pure and applied optics; $2^{nd}$ ed., Chap. 9, pp. 330-335.

[35] D. Marcuse, "Theory of dielectric optical waveguides", Academic, New York, 1991; $2^{nd}$ ed., Chap. 1, pp. 7.

[36] R. Ramachandran, M. Saranya, P. Kollu, B. P. C. Raghupathy, S. K. Jeong, and A. N. Grace, "Solvothermal synthesis of Zinc sulfide decorated graphene (ZnS/G) nanocomposites for novel supercapacitor electrodes", Elect. Acta, vol. 178, pp. 647-657, 2015.

[37] S. Boonruang, "Two-dimensional guided mode resonant structures for spectral filtering applications", University of Central Florida, 2007.

[38] J. Hromadka, B. Tokay, S. James, R. P. Tatam, and S. Korposh, "Optical fibre long period grating gas sensor modified with metal organic framework thin films", Sens. Actuators B: Chem., vol. 221, pp. 891-899, 2015.

[39] M. Quan, J. Tian, and Y. Yao, "Ultra-high sensitivity Fabry-Perot interferometer gas refractive index fiber sensor based on photonic crystal fiber and Vernier effect", Opt. Lett., vol. 40, pp. 4891-4894, 2015.

[40] Z. Opilski, T. Pustelny, E. Maciak, M. Bednorz, A. Stolarczyk, and M. Jadamiec, "Investigations of optical interferometric structures applied in toxic gas sensors", Bull. Pol. Ac.: Tech., vol. 53, pp. 151-156, 2005.

[41] P. Jia, G. Fang, T. Liang, Y. Hong, Q. Tan, X. Chen, W. Liu, C. Xue, J. Liu, W. Zhang, and J. Xiong, "Temperature-compensated fiber-optic Fabry-Perot interferometric gas refractive-index sensor based on hollow silica tube for high-temperature application", Sens. Actuators B: Chem., vol. 244, pp. 226-232, 2017.

[42] G. Z. Xiao, A. Adnet, Z. Zhang, F. G. Sun, and C. P. Grover, "Monitoring changes in the refractive index of gases by means of a fiber optic Fabry-Perot interferometer sensor", Sens. Actuators A, vol. 118, pp. 177-182, 2005.

[43] R. S.-Gelais, G. Mackey, J. Saunders, J. Zhou, A. L.-Hotte, A. Poulin, J. A. Barnes, H.-P. Loock, R. S. Brown, and Y.-A. Peter, "Gas sensing using polymer-functionalized deformable Fabry-Perot interferometers", Sens. Actuators B: Chem., vol. 182, pp. 45-52, 2013.

[44] S. Tabassum, R. Kumar, and L. Dong, "Plasmonic crystal based gas sensor towards an optical nose design", IEEE Sensors Journal, vol. PP, no. 99, pp. 1-1, doi: 10.1109/JSEN.2017.2740176, 2017.

[45] S. Tabassum, Y. Wang, J. Qu, Q. Wang, S. Oren, R. J. Weber, M. Lu, R. Kumar and L. Dong, "Patterning of nanophotonic structures at optical fiber tip for refractive index sensing", 2016 IEEE Sensors, Orlando, Fl, pp. 1-3, 2016.

D. Specific Example 2

The following more specific example relates to FIG. 14-24 and is discussed at Shawana Tabassum; Qiugu Wang; Wentai Wang; Seval Oren; Md. Azahar Ali; Ratnesh Kumar; Liang Dong. "Plasmonic crystal gas sensor incorporating graphene oxide for detection of volatile organic compounds," 2016 *IEEE 29th International Conference on Micro Electro Mechanical Systems (MEMS)*, Shanghai, 2016, pp. 913-916, which is incorporated by reference herein.

See also, Tabassum, et al., Plasmonic Crystal based Gas Sensor towards an Optical Nose Design, IEEE Sensors Journal, Vol. 17, No. 19, Oct. 1, 2017, pp. 6210-6223, incorporated by reference in its entirety herein.

Plasmonic Crystal Based Gas Sensor Towards an Optical Nose Design

Abstract—This paper presents a high-sensitivity gas sensor based on plasmonic crystal incorporating a thin layer of graphene oxide (GO). The plasmonic crystal consists of a periodic array of polymeric nanoposts with gold (Au) disks at the top and nanoholes in an Au thin film at the bottom. The thin GO layer coated atop the plasmonic crystal is the gas absorbent material for the sensor. Gas adsorption of GO modifies the refractive index of the plasmonic structure and returns a shift in the resonance wavelength of the surface plasmon polariton (SPP) excited at the GO coated Au surface. The differences in target gas species and their adsorption in GO lead to a difference in the resonance shift. To identify the gas species in a complex gas mixture, a sensor array is designed with different sensing elements coated with different thicknesses of GO. The optical responses of the different sensing elements to a gas mixture are analyzed using principal component analysis (PCA) based pattern recognition algorithm. The PCA separates the sensor responses to different species of gases, providing specificity of the device. The proposed sensor demonstrates a refractive index sensitivity of 449.63 nm/RIU. In addition, volatile organic compounds (VOCs) such as ethylene, methanol that serve as plant health indicators and ammonia that plays a key role in the ecosystem, are detected by the sensor. A change in a gas concentration results in a differing amount of adsorbate and correlated shift in the resonance wavelength of the device. The GO coated sensor exhibits sensitivities of 0.6 pm/ppm to gaseous ethylene, 3.2 pm/ppm to methanol, and 12.84 pm/ppm to ammonia. The integration of plasmonic sensing element arrays with varying GO thicknesses to modulate the gas adsorption, offers a promising approach to detect different gas species in a single test.

Keywords—gas sensing; surface plasmon resonance; graphene oxide; principal component analysis.

Introduction

We present an "optical nose" for sensing gases, especially the ones useful as plant health indicators such as ethylene, methanol, and ammonia. Plant growth and development are profoundly influenced by several chemical substances including ethylene and methanol. Ethylene regulates cell size and cell division, initiates the fruit ripening process and accelerates senescence of leaves [1, 2]. Methanol, on the other hand, is responsible for early stages of plant leaf development [3]. Plants emit ethylene and/or methanol during different stages of development as well as when plants respond to environmental stimuli from biotic and/or abiotic stresses [4]. Measuring the presence and concentration of these gases released by plants is of utmost importance to carefully monitor the condition of fruits and vegetables, and significantly prevent their wastage due to over-ripening. Furthermore, gaseous ammonia ($NH_3$) emission from plant's foliage and shoots bears a measurable impact on the biotic as well as abiotic components of our ecosystem. Exchange of ammonia between the atmosphere and plants plays a significant role in flora decline due to for example excessive nitrogen deposition. Thus, detecting concentrations of $NH_3$ can help monitor environmental health. The importance of ethylene and methanol in plant development and of ammonia in healthy ecosystem makes it imperative to develop highly sensitive and selective gas sensors for their monitoring.

An ethylene gas sensor utilizing carbon nanotube [1] and an indium tin oxide (ITO) thin film based methanol gas sensor [5] have been reported. These sensors work on the basis of the conductance/resistance variation upon the adsorption of gas species on their surface. A number of surface plasmon resonance (SPR) based optical sensors have been reported for the detection of ammonia [6]-[8]. Numerous optical gas sensors have also been reported by integrating optical resonators and gas absorption materials, or using optical resonators alone. Polymers such as silicone rubber, polyvinylchloride (PVC), and polytetrafluoroethylene with immobilized gas sensitive chemical reagents were used in optical sensors to detect various gases [9]. Localized surface plasmon resonance (LSPR) at the surface of gold (Au) and silver nanoparticles, and gold nanoshells allowed the detection of gas-molecular-binding-induced changes of refractive index [10]. Au nanoparticles were also coupled with reduced graphene oxide (rGO) to generate LSPR for gas sensing [11]. Fiber-optic sensors that eliminate bulky optics and offer easy insertion of device into the sensing area have also been reported: An SPR based chlorine gas sensor was realized by applying indium oxide doped tin oxide to the surface of silver-coated optical fiber core [12]. In addition, an SPR based fiber-optic ammonia gas sensor was designed using a tin-oxide ($SnO_2$) layer over the silver-coated unclad core of the fiber [6]. Other works studied nanocomposite films of poly (methyl methacrylate) (PMMA), rGO and PMMA/rGO [7], polyaniline coated ITO thin film [8], graphene-carbon nanotubes-poly(methyl methacrylate) hybrid nanocomposite [13], and ITO thin film and nanoparticles [14] to develop SPR based fiber-optic gas sensors. Also, various photonic crystal (PC)-based resonators were developed for the detection of volatile organic compounds (VOCs) [15], under the principle of index modulation upon vapor adsorption and condensation inside the PCs. The extremely high quality factor of whispering gallery mode (WGM) was also utilized to generate resonance shift caused by specific binding of gas molecules through enhanced photon-gas molecule interactions [16]. Furthermore, chalcogenide glass waveguides have been used for gas detection due to their very high refractive index (2.0-4.0) and transparency in the mid-infrared spectral regime [17]. Notably, resonant characteristics of surface plasmon polariton (SPP)-based nanostructures are sensitive to subtle changes in surrounding refractive index, and thus, are finding sensor applications for the detection of chemical and biological species [18]. These nanostructures are mostly limited to liquid-phase detection of biomolecules such as protein [19], DNA [20], cancer biomarkers [21] and glucose [22]. However, due to the lack of suitable absorption materials for detecting gas molecules, it remains challenging to generate a large output signal in response to minute concentration of gas. Recently, GO has led to the development of many ultrasensitive sensors owing to high surface-area-to-volume ratio [23] and sufficient functional groups (e.g., carboxyl, hydroxyl, carbonyl and epoxide) at the surface of GO nanosheets providing effective trap centers for various gas species [24]. Several electronic gas sensors have used GO and GO-based nanocomposites for gas detection [25]-[26], where their electrical conductivities change upon exposure to gases. To date, there are limited reports on integrating GO as a sensing material with SPP-based nanostructures for the detection of gas molecules [27]. In addition, the utilization of principal component analysis (PCA) to separate the gas species and improve specificity is an integral feature in our sensing approach.

In this paper, we report an optical gas sensor utilizing enhanced gas adsorption ability of GO and the strong light-matter interaction at the surface of lithographic plasmonic nanoposts. The plasmonic nanostructures are composed of an array of nanoposts with Au disks at the top and perforated nanoholes in an Au thin film at the bottom. The nanostructures are coated with a thin layer of GO nanosheets to form a sensitive adsorption surface for gas molecules, and support the excitation of SPPs at the dielectric/Au interface with a high refractive index sensitivity. More importantly, to distinguish different types of gaseous species, an array of nanostructured sensors is designed, where the surface of each individual sensor is coated with a different thickness of GO. Depending on the GO coating thickness, the amount of gas molecules absorbed by GO varies, leading to a different modulation for the effective refractive index of GO at different sensing elements when responding to a specific gas species. This allows for the selective identification of gas species by integrating a pattern recognition algorithm such as PCA algorithm [28].

Sensor Design and Working Principle

The GO coated plasmonic crystal sensor is shown in FIG. 14a. The nanoposts made of a ZPUA (ZIPCONE™ UA) polymer have a square lattice with the period of 500 nm, the diameter of 250 nm, and the height of 210 nm. The surface of the sensor is coated by 5 nm thick titanium and 50 nm thick Au. The device was formed using soft lithography based replica nanomolding process. The details of fabrication processes appear in Supplementary Materials. To enhance the specificity of this sensor to different gas species, an array of three sensors was formed on the same substrate, by coating with three different thicknesses of GO: 16.3 nm, 32.6 nm, and 48.9 nm. This sensor array was used to examine the response of the sensors to gaseous ethylene, methanol and ammonia.

Working Principle

When gas molecules are adsorbed at the surface of GO nanosheets, the hydroxyl and carboxyl groups at the basal planes and edges of GO form oxo- or hydroxo-bridges with the gas molecules. This results in free electron transfers between the GO nanosheets and gas molecules. The change in conductivity of GO in response to its interaction with gas molecules can be written as [29], $$\Delta \sigma_{GO}(t) = \Delta \sigma_{max,GO} \frac{cK}{1+cK}\left[1 - \exp\left(-\frac{1+cK}{K}kt\right)\right] \quad (1)$$

where $\Delta\sigma_{GO}$ is the change in conductivity of GO, $\Delta\sigma_{max,GO}$ is the maximum change in conductivity with sufficient gas exposure, K is binding equilibrium constant, k is surface reaction rate constant, c is the concentration of gas and t is the time for gas exposure. The refractive index of GO, $\eta_{GO}$ is calculated from the following equation [30], [31], $$\eta_{GO} = \left(\frac{1}{2\omega\varepsilon_0 t_{GO}}\right)^{1/2}\left(-\sigma_{GO,i} + \sqrt{4\sigma_{GO,r}^2 + \sigma_{GO,i}^2}\right)^{1/2} \quad (2)$$

where, $\omega$ is the angular frequency, $\varepsilon_0 = 8.85\times10^{-12}$F/m and $t_{GO}$ is thickness of the GO nanosheet. It can be observed from (1) and (2) that $\eta_{GO}$ is related to gas concentration c, and higher the value of c, higher the value of $\eta_{GO}$. These equations explain how $\eta_{GO}$ varies when the GO nanosheet is exposed to gases of varying concentrations. The variation in $\eta_{GO}$ causes shifts in the resonance wavelengths of surface plasmons, as explained below, and that shift is what we measure experimentally.

Under normal incidence, the free space light to excite a SPP at the dielectric/metal interface for a square lattice is given by the following equation [32]:

$$\lambda_{SPP} = \frac{\Lambda}{\sqrt{i^2 + j^2}} \sqrt{\frac{\varepsilon_d \varepsilon_m}{\varepsilon_d + \varepsilon_m}}, \quad (3)$$

where $\varepsilon_d$ and $\varepsilon_m$ are the dielectric constants of the dielectric and the metal (Au in our work), respectively, $\Lambda$ is the lattice period, and (i, j) is the order of SPP. For the proposed structure, $\Lambda=500$ nm and when the Au nanostructures are coated with a thin layer of GO nanosheets, $\varepsilon_d=(\eta_{GO})^2$. Hence, in presence of adsorbed gases with concentration c, $\eta_{GO}$ varies according to the Equations (1) and (2), causing Ed to vary, which in turn causes $\lambda_{SPP}$ to shift. On the other hand, the relative permittivity of Au, $\varepsilon_m \equiv \varepsilon_m(\lambda)$ depends on wavelength and is taken from the experimental data [33]. Equation (3) can be used to determine the resonance wavelength $\lambda_{SPP}$ under the influence of index modulation of the surrounding medium. The equation cannot be solved directly because relative permittivity of Au is a function of wavelength, and so the wavelength appears on both sides of the equation. In order to compute the SPP resonance wavelength, left and right hand sides of (3) are plotted as a function of wavelength. From the intersection of the two curves, the calculated SPP resonance $\lambda_{SPP}$ for (i, j)=(1, 0) at the air/Au interface is 546.7 nm.

Experimental Results and Analysis

Characterization of Au GO Coated Nanopatterns

A schematic of the GO coated sensor is given in FIG. 14a. The scanning electron microscopy (SEM) analysis was performed to provide a comprehensive characterization of the GO coated plasmonic nanostructure (FIG. 14b-d). The top-view SEM image of the bare nanopatterns (without Au or GO coating) is shown in FIG. 14b. After coating the device with a 50 nm thick Au layer followed by a coating of 0.2 mg/ml GO dispersion solution (0.2 mg GO in 1 ml DI water, preparation of which is given in the Supplementary Materials in an appendix at the end), a 70° tilt-view SEM image of the device was taken (FIG. 14c). The boundary between GO coated and uncoated device is clearly visible in FIG. 14c. It is also confirmed from the SEM image that the GO nanosheet is conforming to the structure beneath it. In order to reveal the thickness of the GO nanosheets, a 70° tilt-view SEM image was captured at the edge of the device where GO nanosheets got detached from the device surface (FIG. 14d).

Bulk Refractive Index Change Characterization

A bifurcated optical fiber (BIF 400-VIS-NIR, Ocean Optics) was used to illuminate the sensor from a white light source (150 watt quartz halogen lamp, Luxtec Fiber Optics) through a collimator (F220SMA-A, Thorlabs), and collect the reflected light from the sensor into a spectrometer (USB-4000, Ocean Optics). We measured the reflectance spectra with normal incident light. When the bare (without GO coating) plasmonic nanostructure was exposed to air, a reflectance dip appeared at 547.1 nm (FIG. 15a, D1), close to what was calculated using (3). Next, we performed the bulk refractive index sensitivity measurement of the Au-coated nanoposts without GO coating (FIG. 15a). Water ($\eta$=1.33), acetone ($\eta$=1.363), ethanol ($\eta$=1.365), isopropyl alcohol (IPA) ($\eta$=1.377), and chloroform ($\eta$=1.44) were dropped on the top of the device and covered with a glass coverslip (FIG. 15a). As the surrounding medium changed from air to water, acetone, ethanol, IPA or chloroform, the resonance wavelength shifted from 547.1 nm (D1) to 688 nm (D2), 700.8 nm (D3), 702.5 nm (D4), 710.5 nm (D5) or 741.5 nm (D6) respectively (FIG. 15a). Thus, the sensor exhibited a refractive index sensitivity of 449.63 nm/RIU, shown in FIG. 15a inset.

Optical Simulations

Finite element analysis method was used to carry out full wave numerical simulations with the commercial COMSOL software. FIG. 15b shows the experimental and simulated reflection spectra of the plasmonic nanostructure with and without the GO coating. A certain thickness (300 nm) of left-over ZPUA polymer beneath the nanoposts (FIG. 14a) was also incorporated in order to simulate the actual device. The resonance dip at $\lambda_{Vs1}=547.1$ nm for the bare structure (without GO) corresponds to the excitation of (1,0) SPP at the air/Au interface. This is confirmed by the standing wave feature above the Au nanodisk and below the Au film as can be seen in the simulated electric field distribution (FIG. 15c). Moreover, it can be observed that the resonant field penetrates approximately 100 nm to the surrounding dielectric (e.g. air), which helps determine the thickness of GO coating to be used for gas adsorption and its interaction with the electric field distribution. Accordingly, the maximum thickness of the GO coating that we used was 48.9 nm, well below the observed field penetration depth into air of 100 nm. The strong interaction between the LSPRs at the Au nanodisk and Au film results in a Fabry-Pérot (FP) resonance at $\lambda_{Vs2}=725$ nm (FIG. 15c). Such FP resonance has also been observed in [34]-[36]. The dip at $\lambda_{Vs3}=905$ nm is due to a relatively weaker coupling between the LSPRs mentioned above (FIG. 15c). The three reflectance dips in the simulated spectrum ($\lambda_{Vs1}$, $\lambda_{Vs2}$, and $\lambda_{Vs3}$) correspond to the three dips ($\lambda_{Ve1}$, $\lambda_{Ve2}$, and $\lambda_{Ve3}$) in the experimental reflectance spectrum (FIG. 15b). However, the simulated reflectance dip $\lambda_{Vs2}$ is slightly blue shifted with respect to the experimentally observed dip $\lambda_{Ve2}$. This may be attributed to the unknown thickness of left-over ZPUA in real device below the nanoposts. Because of the enhanced penetration of (1, 0) SPP resonant field into the surrounding dielectric compared to the LSPR fields, the shift in (1, 0) SPP resonance wavelength was measured in response to changes in surrounding refractive indices. After coating the device with a 16.3 nm thick GO layer, the (1, 0) SPP resonance wavelength of the device shifted from $\lambda_{Vs1}=547.1$ nm (bare structure without any GO coating) to $\lambda_{Vs4}=550.1$ nm (with GO coating) as shown in FIG. 15b. The figure also confirms that the measured and simulated results agree well with each other.

Application to Gas Sensing

The GO coated plasmonic nanostructure was demonstrated to function as a gas sensor. To achieve selectivity, a combination of GO layer thickness variations together with a PCA based pattern recognition was employed. Varying the thickness provided varying reflection spectra responses that contained the signature of the gas species, whose extraction was achieved via the PCA. An array of three sensors was designed to have different response characteristics to gases owing to different thicknesses of the GO coating, namely, 16.3 nm, 32.6 nm, and 48.9 nm.

Chemical Interaction of Gases with GO

The hydroxyl, carboxyl and the epoxy groups present at the basal planes and edges of GO play a significant role in capturing gas molecules. The binding mechanism of $NH_3$, methanol and ethylene gases at GO nanosheets is illustrated in FIG. 16. $NH_3$ interacts with carboxyl groups as either Bronsted (FIG. 16a) or Lewis (FIG. 16b) acids [37]. $NH_3$ also reacts with the epoxy groups via nucleophilic substitution (FIG. 16c) and forms amide [37]. In a moist environment, water molecules form hydrogen bonds with the hydroxyl and epoxy groups present between GO layers leading to less amount of $NH_3$ adsorption. In dry condition (in the absence of $H_2O$ molecules), $NH_3$ binding with the hydroxyl and epoxy groups is significantly enhanced. Methanol also works as a nucleophile that attacks the carboxyl groups at GO and forms ester (FIG. 16d) [38]. When the GO nanosheets are exposed to ethylene, it attacks the hydroxyl groups at GO via nucleophilic substitution (FIG. 16e) [39].

Experimental Setup

The experimental setup for gas sensing using the GO coated plasmonic sensor is shown in FIG. 17. The gas species (pre-diluted with nitrogen) flowed from cylinders into an aluminum gas chamber which contained the sensor. The sensor was illuminated from a white light source through a bifurcated fiber and the reflected light was collected by a spectrometer. Inside the chamber, the testing gas was further diluted by the carrier nitrogen gas. The gas flow rate was controlled by a mass flow controller (MFC) (GFC17, Aalborg). Ethylene with concentrations of 500 ppm, 666.66 ppm and 750 ppm, methanol with concentrations of 250 ppm, 333.33 ppm and 375 ppm and $NH_3$ with concentrations of 100 ppm, 117 ppm and 120 ppm were tested. A constant flow rate of dry nitrogen (10 ml/min) was maintained inside the closed chamber and flow rate of ethylene, methanol and/or $NH_3$ was varied to modify the concentration of the test gases at regular intervals using the MFCs. The main purpose of using dry nitrogen is to drive away moisture from the chamber, so that moisture does not produce any false spectral shifts of the sensor.

Gas Sensing Results

FIG. 18 shows the reflection spectra of the three sensors array before and after being exposed to ethylene, methanol and $NH_3$ at different concentrations. As captured in (3) above, with a change in local dielectric environment and hence Ed, a shift in resonant wavelength ($\lambda_{SPP}$) was observed. The thicker the GO coating, the higher the dielectric permittivity $\varepsilon_d$ in the vicinity of the metal surface, and hence the higher the resonance wavelength shift. With 16.3 nm, 32.6 nm, and 48.9 nm GO coatings, resonance wavelength red-shifted from 547.1 nm to 550.1 nm, 554.2 nm and 555.25 nm respectively (FIG. 18a).

When only nitrogen was introduced into the chamber, the resonance wavelength red-shifted to 550.7 nm, 555.66 nm, and 556.1 nm for 16.3 nm, 32.6 nm, and 48.9 nm GO coatings respectively (FIG. 18a). When the sensor response was saturated in presence of nitrogen, ethylene was flown into the chamber. In the presence of ethylene gas, a red shift of the SPR wavelength occurred for all the three sensing elements. For example, with 48.9 nm GO coating, resonance wavelength shifts of 0.42 nm, 0.1 nm, and 0.17 nm were observed when the sensor was exposed to 500 ppm, 666.66 ppm, and 750 ppm of gaseous ethylene respectively. Similarly, results were obtained for methanol and $NH_3$ gases (FIG. 18b-c).

Sensitivity Studies

Sensitivity of the sensor is defined as the shift in resonance wavelength per unit change in the gas concentration. FIG. 19 shows resonance wavelength shifts with a change in gas concentration for three different thicknesses of GO coating. The sensitivities of the sensor to gaseous ethylene, methanol and $NH_3$ with 16.3 nm GO coating (FIG. 19) were found to be approximately 0.6 pm/ppm, 3.2 pm/ppm and 12.84 pm/ppm respectively.

A fiber-tip based FP sensor reported in literature exhibits a sensitivity of 3.53 pm/ppm to methanol vapor [40] which is close to ours. In another work, an optical fiber long-period-grating gas sensor exhibited a sensitivity of 0.2 pm/ppm for methanol gas [41] which is almost 16 fold less compared to our sensor. Also, several SPR based fiber-optic ammonia gas sensors have been reported using $Ag/SnO_2$ thin films with a sensitivity of 2.15 nm/ppm [6], using PMMA/rGO nanocomposite with sensitivity of 1 nm/ppm [7], using Indium tin oxide (ITO) and bromocresol purple (BCP) with sensitivity of 1.891 nm/ppm [42]. The sensitivities of these sensors are higher than ours, but our plasmonic sensor offers other advantages. Firstly, it is superior in terms of fabrication methods: It employs inexpensive and simple nanomolding process to fabricate the nanopattern-based SPR structure. Moreover, in order to selectively identify gas species, by simply varying the thicknesses of the GO coatings on the sensing elements in a sensor array, it is possible to differentiate a gas from the others in a gaseous mixture, by applying pattern recognition algorithms. There is no need of changing the structures of the nanoposts that otherwise will require costly nanoscale master molds, or varying compositions of gas absorbing materials. In contrast, in the aforementioned fiber-optic SPR based sensors [6, 7, 42], different composition of coating materials needs to be employed in order to selectively detect different gas species, requiring additional fabrication steps. Finally, to our knowledge, no ethylene detection sensor has been reported based on the principle of optical resonance wavelength shift.

Control and Reversibility Studies

We further studied the dynamic response of the sensor coated with 32.6 nm of GO nanosheets (FIG. 20a-c). During the entire experiment, dry nitrogen was kept flowing at a constant rate into the enclosed chamber. First, when nitrogen was introduced into the chamber, the sensor response became saturated at a resonance shift of 0.2 nm (FIG. 20a). After that, the sensor was exposed to varying concentrations of ethylene gas. We observed resonance shifts of 0.15 nm and 0.23 nm for 500 ppm and 666 ppm of ethylene gas respectively (FIG. 20a). With 750 ppm and 800 ppm of gaseous ethylene, resonance shifts of 0.05 nm and 0.05 nm were observed, respectively (FIG. 20a). As the gas concentration increased to 750 ppm, less amount of resonance shift was exhibited as compared to the shift observed for 500 ppm and 666 ppm of ethylene, perhaps because the gas molecules already remaining in the GO layer inhibited further interaction and hence adsorption of newer gas molecules. Hence, at higher concentration of ethylene gas no resonance shift will be observed which implies that the sensor has a fixed operation range. With 32.6 nm GO coating, the total shifts in resonance in response to gaseous ethylene, methanol and ammonia were found to be 0.45 nm, 0.45 nm and 0.3 nm respectively (FIG. 20a-c). For comparison, we also performed the control dynamic measurements of the bare substrate (without any GO coating) (FIG. 20d-f). It is apparent from FIG. 20d that the bare sensor exhibits a much smaller total resonance shift of 0.01 nm in response to ethylene (which is 45 times smaller compared to that with GO coating). FIGS. 20e-f also show smaller resonance shifts in response to methanol (which is 10 times smaller compared to that with GO coating) and ammonia gases (which is 5 times smaller compared to that with GO coating). These measurements demonstrate a much higher sensitivity when coated with the GO nanosheets, thereby justifying our use of GO coating as a gas adsorption layer. The response time of the GO coated sensor, when exposed to certain concentrations (500 ppm, 666 ppm, 750 ppm, and 800 ppm) of ethylene, was approximately 40 s. The response time is mainly determined by the adsorption of gas molecules at the low or high-energy binding sites of GO nanosheets. The low energy $sp^2$ carbon domains lead to faster adsorption of molecules, while the vacancies, defects, and oxygen-containing functionalities act as high-energy binding sites with slower adsorption rate [26]. Also, the diffusion of the gas molecules to reach the active portion of the plasmonic nanostructure adds to the delay [43]. Weak dispersive forces allow the adsorption of gas molecules on $sp^2$-bonded carbon atoms of the GO layer. However, single and double hydrogen bonds are formed when gas molecules are captured at defect sites such as carboxylic acid group, requiring binding energies of several hundred meV/molecule [26]. When the gas flow (ethylene, methanol or $NH_3$) was turned off and the chamber was purged with dry $N_2$ gas, a partial recovery of the sensor was observed. This is likely because only the gas molecules bound to the low-energy binding sites of GO nanosheets are released during the purging with dry $N_2$, while the gas molecules captured by the high-energy binding sites remain adsorbed at the GO nanosheets. This is also confirmed by noting that the resonance wavelength did not return to the baseline upon turning off the gas flow as shown in FIG. 20c. This is not unexpected, and indeed a similar behavior was observed for GO covered optical nano-antenna structure exposed to gaseous analytes in [43]. A complete release of the bounded gases from the sensor surface requires a moderate heating. In our case, to prepare for a new cycle of the dynamic response, the device was thermally treated on a hot plate at 70° C. for 4 hours, allowing for a complete desorption of the gas molecules from the GO layer, as was confirmed experimentally by the return of the resonance wavelength to its baseline level.

Optimization of GO Thickness

We performed gas sensing experiments for different concentrations of GO dispersion solution in order to find an optimum GO solution providing maximum shift in resonance wavelength. It can be observed from FIG. 21 that with an increase in the concentration of GO dispersion solution, the resonance wavelength increases until a certain value of GO solution concentration, and then decreases. Experiments were conducted for gaseous ethylene in the concentration range of 500 ppm to 750 ppm and gaseous methanol in the concentration range of 250 ppm to 375 ppm. The maximum value of total shift in resonance wavelength was found to be 0.9 nm for ethylene with 0.75 mg/ml GO dispersion solution and 0.56 nm for methanol with 0.15 mg/ml GO dispersion solution.

Specific Gas Identification Using PCA Based Separation

The plasmonic nanostructure has been demonstrated to be sensitive to different gases such as ethylene, methanol and $NH_3$, but selectivity between different gases remains to be addressed owing to the interaction of GO nanosheets with all the gases which results in corresponding resonance wavelength shifts as shown in FIG. 18. This may be addressed either through modifying the sensor materials, or by applying some intelligent data analysis. Modifying the composition of gas-absorbing materials in the sensor certainly adds fabrication complexities. Hence, a multivariate analysis named PCA was used to extract selective response out of the SPR spectra of three identical sensors coated with three different thicknesses of GO. The responses of all the three sensors were collected, and a PCA method was applied to transform the data, allowing the separation of different gases, as the data corresponding a specific gas appeared in a single cluster upon the PCA based transformation. In our case, the PCA takes a multidimensional dataset and reduces it into a two-dimensional dataset, without crucial loss of information. For our experiments, the data matrix contained the response of each sensor with a different GO thickness to a certain gas and concentration, as shown in Table I. Utilizing the PCA (see details in the PCA algorithm section of the Supplementary Materials provided at the end in an appendix), the data matrix was reduced to two principal components PC1, PC2, as plotted in FIG. 22. This figure demonstrates a clear separation of the three gas species in the three clusters, indicating the individual gases without overlap. Therefore, the PCA algorithm allows the identification of analytes with a set of three sensors with three different thicknesses of GO coated on the sensor surface. Certainly, other thickness levels can be introduced to be able to separate a larger number of species of gases. Thus, in our setting there is no need to change the compositions of the gas-absorbing films, only different GO thicknesses were needed, obtained via varying the concentrations of GO dispersion solutions using simple dip coating method.

TABLE I

DATA MATRIX INPUT TO PCA ALGORITHM

| Concentration/<br>Gas species | Optical Resonance Wavelength (nm) | | |
|---|---|---|---|
| | 16.3 nm-thick GO | 32.6 nm-thick GO | 48.9 nm-thick GO |
| 250 ppm/ Methanol | 550.41 | 551.50 | 553.17 |
| 333.33 ppm/ Methanol | 550.63 | 551.57 | 553.24 |
| 375 ppm/ Methanol | 550.83 | 551.60 | 553.31 |
| 500 ppm/ Ethylene | 550.87 | 555.80 | 556.40 |
| 666.66 ppm/ Ethylene | 550.93 | 556.00 | 556.50 |
| 750 ppm/ Ethylene | 550.95 | 556.20 | 556.75 |
| 100 ppm/ Ammonia | 551.14 | 552.55 | 554.29 |
| 117 ppm/ Ammonia | 551.31 | 552.59 | 554.30 |
| 120 ppm/ Ammonia | 551.42 | 552.68 | 554.33 |

Refractive Index of GO with and without Gas

When gas molecules are adsorbed by the GO nanosheets, the refractive index of GO increases. In order to substantiate this claim, the refractive index of GO thin film was measured with and without gas, using the method developed by Minkov [44]. This method makes use of the interference effects that occur due to the reflections from the air/thin film and thin film/substrate interfaces. These dual reflections produce interference in the reflection spectrum of the film from which the refractive index of the film can be calculated [44].

We started with 2 mg of GO powder dispersed in 1 ml de-ionized water. The GO dispersion solution was then sprayed onto a microscope glass slide using an airbrush (Badger 350, Badger Air-Brush Co) [45]. The substrate was next dried at room temperature for 6 hrs, which let the remaining GO sheets to form a uniform thin film on the glass slide. Next, the reflectance spectra of the GO film with and without the gaseous methanol were measured (FIG. 23). Using the method provided in [44], Table II was obtained, showing the values of the refractive indices of the GO film at different wavelengths, with and without the presence of gaseous methanol. It was observed that the refractive index of GO increases by 7.4% on average in presence of 500 ppm methanol, demonstrating the effect of gas adsorption on refractive index of GO. Similar values of refractive index of GO in air were reported using standard spectroscopic ellipsometry [46].

Comparison to Related Optical Sensors

We presented a periodic nanopatterns based plasmonic gas sensor exhibiting spectral resonance shift in response to a change in surrounding refractive index in presence of gases, as well as a sensor array with varying thicknesses of GO layers to enable selective identification of gas species, aided by the PCA method. The sensor leverages the striking properties of GO nanosheets and plasmonic nanoposts to transduce gas molecule binding events into optical responses. Previously, sensors have been reported that work based on the principle of LSPR [10]. Generally, LSPR sensors display less sensitivity to changes in the bulk refractive index compared to the propagating SPR sensors [47]. The performance of the LSPR sensors also depends greatly on the nanoparticle composition, size, shape and orientation. A variety of chemical syntheses and lithographic techniques have also been adopted to manipulate these parameters with relatively complex and expensive fabrication methods. On the other hand, most of the existing SPR based sensors with GO layers are dedicated to biomolecules detection in liquids [19], [21]. Our sensor employs the SPR principle to probe gaseous species using a nanopost-based plasmonic structure obtained by an inexpensive nanomolding process. Our device allows for easy excitation of surface plasmons without using complex optics as in [48]. Moreover, by simply varying the thicknesses of GO layer on identical sensing elements in a sensor array, it is possible to differentiate a gas from the others in a gas mixture, using a PCA algorithm. There is no need of varying the structures of nanoposts as such that otherwise will require costly nanoscale master molds. Similarly, there is also no need of varying compositions of gas absorbing materials that are commonly used in electronic nose devices [49]-[51]. Only different concentrations of GO dispersion solutions are required to obtain different GO thicknesses via a simple dip coating. This makes the device fabrication process simpler, cost effective, yet functional.

TABLE II

CALCULATED VALUES OF THE REFRACTIVE INDICES OF A THIN GO FILM WITHOUT AND WITH METHANOL GAS CONCLUSION

| λ (nm) | $\eta_{Go}$ in air | $\eta_{Go}$ in 500 ppm methanol gas |
|---|---|---|
| 982.9 | 2.60 | 2.91 |
| 939.5 | 2.57 | 2.82 |
| 886.0 | 2.39 | 2.55 |
| 832.4 | 2.09 | 2.19 |
| 792.3 | 1.19 | 1.18 |

This paper presented a gas sensor using nanoposts-based plasmonic nanostructures coated with a thin GO layer as a resonance tuning in the presence of subtle concentration changes of gas molecules. The sensor exhibits sensitivities of 0.6 pm/ppm to gaseous ethylene, 3.2 pm/ppm to methanol and 12.84 pm/ppm to $NH_3$ gases respectively. An array of sensors was built with the same nanoposts structure but with varying thicknesses of the GO coating. The different responses of the sensors to a gas mixture were collected and a PCA based pattern recognition algorithm was applied to generate a distinct signal cluster for each gas analyte in the mixture. The gas sensor technology reported in this paper will support detection of various gases released from a multitude of sources in the agricultural, biomedical, environmental, and manufacturing fields.

Future work will mainly focus on improving the sensor selectivity to a specific gas by coating the nanoposts based sensor array with different thicknesses of semiconducting oxides, such as $ZnO_2$, $In_2O_3$, $SnO_2$, etc., that show gas-specific adsorption rates. The sensing mechanism of these oxides is based on a change in electrical conductivity caused by trapping of electrons at the adsorbed gas molecules and band bending caused by these charges [52].

Appendix: Supplementary Materials

Fabrication of Plasmonic Nanopost Array

The sensor fabrication steps [53] are shown in FIG. 24. The fabrication starts with a silicon (Si) master mold (FIG. 24a). In order to form a PDMS mold from Si master mold we followed two steps. At first the Si master mold carrying the nanopatterns was silanized with (tridecafluoro-1, 1, 2, 2-tetrahydrooctyl)-1-trichlorosilane (T2492-KG, United Chemical Technologies) in a desiccator under active vacuum for 20 min. Then, a mixture of poly (7-8% vinylmethyl-siloxane)-(dimethylsiloxane) (Gelest #VDT-731), (1, 3, 5, 7-tetravinyl-1, 3, 5, 7-tetramethylcyclotetrasiloxane) (Gelest #SIT7900.0), platinum catalyst Xylene (Gelest #SIP6831.2) and poly (25-30% methylhydro-siloxane)-(dimethylsi-loxane) (Gelest #HMS-301) at the weight ratio of 3.4:0.1: 0.05:1 was prepared that worked as an h-PDMS precursor solution. Next, the mixture was put in a degassing chamber for 10 min to remove the air bubbles and was then spin-coated onto the Si mold at 1000 rpm for 40 s and cured at 70° C. for 10 min. Subsequently, an s-PDMS precursor solution was prepared by mixing Sylgard 184 (Dow Corning) and curing agent at the weight ratio of 10:1 and degassed in a vacuum desiccator for 20 min. After that, the s-PDMS mixture was poured onto the top surface of h-PDMS and cured on a hotplate at 65° C. for 2 hrs (FIG. 24b). Finally, the PDMS slab containing a square array of nanoholes was peeled from the Si mold (FIG. 24c).

The next step was to use a UV curable polymer (ZIP-CONE™ UA or ZPUA) to imprint the nanoposts from the PDMS mold to a Si wafer [FIG. 24(d-e)]. At first, the Si wafer was spin coated with an adhesive layer of Transpin at 3000 rpm for 40 s and subsequently heated at 200° C. for 5 min. This step is required to enhance the adhesion ability of ZPUA to Si wafer resulting in complete transfer of ZPUA nanoposts to the Si wafer. The ZPUA was dropped on the PDMS mold (FIG. 24d) and the mold was then placed on top of the Si wafer. Then the wafer was exposed to ultraviolet light for 5 min at an intensity of 3.3 mW/cm$^2$ (FIG. 24e). Separation of the PDMS mold from the Si wafer resulted in nanoposts transferred to the Si wafer which was further coated with a 50 nm Au layer using e-beam evaporation.

Aqueous suspensions of GO nanosheets (2 mg/mL) were prepared by thoroughly dispersing 2 mg of the synthesized GO nanosheet flakes (purchased from Graphene Supermarket) in 1 mL of deionized water, followed by sonication at room temperature for 90 min. This solution was then diluted to make three different GO dispersion solutions (0.05 mg/ml, 0.1 mg/ml and 0.15 mg/ml). The surfaces of the three sensors were made hydrophilic by using oxygen plasma treatment before drop-coating with different amounts of GO solutions. For each coating, 100 µL/cm² of GO suspensions were drop coated over the sensor surface. These sensors were then dried at room temperature for one hour. The final structure is shown in FIG. 24f.

PCA Algorithm

The PCA algorithm was employed to find clusters in a given dataset by projecting a feature space onto a smaller subspace with minimal loss of information [54], [55]. The steps for performing PCA are listed below:

1. The entire dataset consisting of an m×n matrix is taken as input for the PCA analysis. In our case, we had a 9×3 matrix consisting of the values of resonance wavelengths for three different concentrations of ethylene, methanol and $NH_3$ vapors and three different thicknesses of GO as given in Table 1.
2. The mean values are computed for each row of the entire dataset. Suppose for the m×n dataset, the $i^{th}$ row is given by, $x_{i1}, x_{i2}, x_{i3}, \ldots x_{ij}, \ldots, x_{in}$. Then, the mean value along the $i^{th}$ row is calculated as follows:

$$\mu_i = \frac{1}{n}\sum_{j=1}^{n} x_{ij}.$$

3. The row mean value is subtracted from all values in the row. i.e., each $x_{ij}$ is replaced with $x_{ij}-\mu_i$. Suppose we thus get a new m×n matrix, denoted D.
4. The covariance matrix of the whole dataset is computed. The samples for the m observations (the concentrations) for the n variables (the thicknesses) are used to compute an n×n covariance matrix C, whose $jk^{th}$ entry is given by, $$c_{jk} = \frac{1}{m-1}\sum_{i=1}^{m}(D_{ij} - \overline{D}_j)(D_{ik} - \overline{D}_k).$$

Here $D_{ij}$ is the $ij^{th}$ element of matrix, and $\overline{D}_j$ is the mean value of matrix D along the $j^{th}$ column.

5. The eigenvectors and the corresponding eigenvalues of the covariance matrix, C are computed.
6. The eigenvectors are sorted by decreasing eigenvalues. Let, W be an n×n matrix wherein the columns represent eigenvectors, sorted in the descending order of eigenvalues.
7. The matrix W is used to transform the samples using, $$y = WD^T,$$

where y is the transformed n×m dimensional sample in the new space.

8. Finally, the first k rows of the matrix y are chosen that correspond to first k eigenvectors with the largest eigenvalues. (For our case k=3 since three gases in the mixture.) Following the steps 1-8 described above, the matrix in Table 1 was reduced to the two principal components PC1, PC2 as plotted in FIG. 22. The plot clearly shows three different separated clusters for the three gas species.

REFERENCES (EACH OF WHICH IS INCORPORATED BY REFERENCE HEREIN)

[46] B. Esser, J. M. Schnorr, and T. M. Swager, "Selective detection of ethylene gas using carbon nanotube-based devices: utility in determination of fruit ripeness", Angew. Chem. Int. Ed., vol. 51, pp. 5752-5756, 2012.

[47] G. E. Schaller, "Ethylene and the regulation of plant development", BMC Biology, vol. 9, 2012.

[48] R. Fall, and A. A. Benson, "Leaf methanol—the simplest natural product from plants", Trends in Plant Sci., vol. 1, pp. 296-301, 1996.

[49] W. Jud, E. Vanzo, Z. Li, A. Ghirardo, I. Zimmer, T. D. Sharkey, A. Hansel, and J.-P. Schnitzler, "Effects of heat and drought stress on post-illumination bursts of volatile organic compounds in isoprene-emitting and non-emitting poplar", Plant, Cell and Environ., vol. 39, pp. 1204-1215, 2016.

[50] N. G. Patel, P. D. Patel, and V. S. Vaishnav, "Indium tin oxide (ITO) thin film gas sensor for detection of methanol at room temperature", Sens. Actuators: B, vol. 96, pp. 180-189, 2003.

[51] A. Pathak, S. K. Mishra, and B. D. Gupta, "Fiber-optic ammonia sensor using Ag/$SnO_2$ thin films: optimization of thickness of $SnO_2$ film using electric field distribution and reaction factor", Appl. Optics, vol. 54, pp. 8712-8721, 2015.

[52] S. K. Mishra, S. N. Tripathi, V. Choudhary, and B. D. Gupta, "SPR based fibre optic ammonia gas sensor utilizing nanocomposite film of PMMA/reduced graphene oxide prepared by in situ polymerization", Sens. Actuators: B Chem., vol. 199, pp. 190-200, 2014.

[53] S. K. Mishra, D. Kumari, and B. D. Gupta, "Surface plasmon resonance based fiber optic ammonia gas sensor using ITO and polyaniline", Sens. Actuators: B Chem., vol. 171-172, pp. 976-983, 2012.

[54] T. E. Brook, and R. Narayanaswamy, "Polymeric films in optical gas sensors", Sens. Actuators: B, vol. 51, pp. 77-83, 1998.

[55] C.-S. Cheng, Y.-Q. Chen, and C.-J. Lu, "Organic vapour sensing using localized surface plasmon resonance spectrum of metallic nanoparticles self assemble monolayer", Talanta, vol. 73, pp. 358-365, 2007.

[56] M. Cittadini, M. Bersani, F. Perrozzi, L. Ottaviano, W. Wlodarski, and A. Martucci, "Graphene oxide coupled with gold nanoparticles for localized surface plasmon resonance based gas sensor", Carbon, vol. 69, pp. 452-459, 2014.

[57] S. K. Mishra, and B. D. Gupta, "Surface plasmon resonance-based fiber optic chlorine gas sensor utilizing indium-oxide-doped tin oxide film", J. of Lightwave Tech., vol. 33, pp. 2770-2776, 2015.

[58] S. K. Mishra, S. N. Tripathi, V. Choudhary, and B. D. Gupta, "Surface plasmon resonance-based fiber optic methane gas sensor utilizing graphene-carbon nanotubes-poly(methyl methacrylate) hybrid nanocomposite", Plasmonics, vol. 10, pp. 1147-1157, 2015.

[59] S. K. Mishra, S. P. Usha, and B. D. Gupta, "A lossy mode resonance-based fiber optic hydrogen gas sensor for room temperature using coatings of ITO thin film and nanoparticles", Meas. Sci. Technol., vol. 27, pp. 045103, 2016.

[60] H. Xu, P. Wu, C. Zhu, A. Elbaz, and Z. Z. Gu, "Photonic crystal for gas sensing", J. of Mater. Chem. C, vol. 1, pp. 6087-6098, 2013.

[61] N. A. Yebo, P. Lommens, Z. Hens, and R. Baets, "An integrated optic ethanol vapor sensor based on a silicon-on-insulator microring resonator coated with a porous ZnO film", Opt. Express, vol. 18, pp. 11859-11866, 2010.

[62] Z. Han, P. Lin, V. Singh, L. Kimerling, J. Hu, K. Richardson, A. Agarwal, and D. T. H. Tan, "On-chip mid-infrared gas detection using chalcogenide glass waveguide", Appl. Phys. Lett., vol. 108, pp. 141106, 2016.
[63] J. N. Anker, W. P. Hall, O. Lyandres, N. C. Shah, J. Zhao, and R. P. V. Duyne, "Biosensing with plasmonic nanosensors", Nat. Mater., vol. 7, pp. 442-453, 2008.
[64] N.-F. Chiu, T.-Y. Huang, and H.-C. Lai, "Graphene oxide based surface plasmon resonance biosensors", InTech, ch. 8, 2013.
[65] J. I. L. Chen, Y. Chen, and D. S. Ginger, "Plasmonic nanoparticle dimers for optical sensing of DNA in complex media", J. AM. Chem. Soc., vol. 132, pp. 9600-9601, 2010.
[66] M. A. Ali, S. Tabassum, Q. Wang, Y. Wang, R. Kumar, and L. Dong, "Plasmonic-electrochemical dual modality microfluidic sensor for cancer biomarker detection", 2017 IEEE 30$^{th}$ International Conference on Micro Electro Mechanical Systems (MEMS), Las Vegas, pp. 390-393, 2017.
[67] K. Aslan, J. R. Lakowicz, and C. D. Geddes, "Nanogold plasmon resonance-based glucose sensing. 2. Wavelength-ratiometric resonance light scattering", Anal. Chem., vol. 77, pp. 2007-2014, 2005.
[68] D. Chen, H. Feng, and J. Li, "Graphene oxide: preparation, functionalization, and electrochemical applications", Chem. Rev., vol. 112, pp. 6027-6053, 2012.
[69] S. S. Nanda, D. K. Yi, and K. Kim, "Study of antibacterial mechanism of graphene oxide using Raman spectroscopy", Sci. Rep., vol. 6, pp. 28443, 2016.
[70] G. Lu, L. E. Ocola, and J. Chen, "Gas detection using low-temperature reduced graphene oxide sheets", Appl. Phys. Lett., vol. 94, pp. 083111, 2009.
[71] J. T. Robinson, F. K. Perkins, E. S. Snow, Z. Wei, and P. E. Sheehan, "Reduced graphene oxide molecular sensors", Nano Lett., vol. 8, pp. 3137-3140, 2008.
[72] S. Tabassum, Q. Wang, W. Wang, S. Oren, M. A. Ali, R. Kumar, and L. Dong, "Plasmonic crystal gas sensor incorporating graphene oxide for detection of volatile organic compounds", 2016 IEEE 29th International Conference on Micro Electro Mechanical Systems (MEMS), Shanghai, pp. 913-916, 2016.
[73] N. A. Joy, M. I. Nandasiri, P. H. Rogers, W. Jiang, T. Varga, S. V. N. T. Kuchibhatla, S. Thevuthasan, and M. A. Carpenter, "Selective plasmonic gas sensing: $H_2$, $NO_2$, and CO spectral discrimination by a single Au—$CeO_2$ nanocomposite film", Anal. Chem., vol. 84, pp. 5025-5034, 2012.
[74] C. Y. Lee, and M. S. Strano, "Understanding the dynamics of signal transduction for adsorption of gases and vapors on carbon nanotube sensors", Langmuir, vol. 21, pp. 5192-5196, 2005.
[75] A. Vakil, and N. Engheta, "Transformation optics using graphene", Science, vol. 332, pp. 1291-1294, 2011.
[76] B. Yao, Y. Wu, Y. Cheng, A. Zhang, Y. Gong, Y.-J. Rao, Z. Wang, and Y. Chen, "All-optical Mach-Zehnder interferometric $NH_3$ gas sensor based on graphene/microfiber hybrid waveguide", Sens. Actuators B: Chem., vol. 194, pp. 142-148, 2014.
[77] H. F. Ghaemi, T. Thio, and D. E. Grupp, "Surface plasmons enhance optical transmission through subwavelength holes," Phys. Rev. B, vol. 58, pp. 6779-6782, 1998.
[78] E. D. Palik, "Handbook of optical constants of solids", New York, NY, USA: Academic, 1985.
[79] Y. Shen, J. Zhou, T. Liu, Y. Tao, R. Jiang, M. Liu, G. Xiao, J. Zhu, Z.-K. Zhou, X. Wang, C. Jin, and J. Wang, "Plasmonic gold mushroom arrays with refractive index sensing figures of merit approaching the theoretical limit", Nat. Commun., vol. 4, pp. 2381, 2013.
[80] J. Xu, P. Kvasnicka, M. Idso, R. W. Jordan, H. Gong, J. Homola, and Q. Yu, "Understanding the effects of dielectric medium, substrate, and depth on electric fields and SERS of quasi-3D plasmonic nanostructures", Opt. Express, vol. 19, pp. 20493-20505, 2011.
[81] Q. Wang, W. Han, P. Liu, and L. Dong, "Electrically tunable quasi-3-D mushroom plasmonic crystal", J. of Lightwave Tech., vol. 34, pp. 2175-2181, 2016.
[82] M. Seredych, and T. J. Bandosz, "Mechanism of ammonia retention on graphite oxides: role of surface chemistry and structure", J. Phys. Chem. C, vol. 111, pp. 15596-15604, 2007.
[83] D. R. Dreyer, S. Park, C. W. Bielawski, and R. S. Ruoff, "The chemistry of graphene oxide", Chem. Soc. Rev., vol. 39, pp. 228-240, 2010.
[84] A. J. Roche, "Ch08 Reacns of alkenes (landscape).doc", Rutgers University.
[85] J. Liu, Y. Sun, and X. Fan, "Highly versatile fiber-based optical Fabry-Pérot gas sensor", Opt. Express, vol. 17, pp. 2731-2738, 2009.
[86] J. Hromadka, B. Tokay, S. James, R. P. Tatam, and S. Korposh, "Optical fibre long period grating gas sensor modified with metal organic framework thin films", Sens. Actuators B: Chem., vol. 221, pp. 891-899, 2015.
[87] S. K. Mishra, S. Bhardwaj, and B. D. Gupta, "Surface plasmon resonance-based fiber optic sensor for the detection of low concentrations of ammonia gas", IEEE Sens. Journal, vol. 15, pp. 1235-1239, 2015.
[88] B. Mehta, K. D. Benkstein, S. Semancik, and M. E. Zaghloul, "Gas sensing with bare and graphene-covered optical nano-antenna structures", Sci. Rep., vol. 6, pp. 21287, 2016.
[89] D. A. Minkov, "Calculation of the optical constants of a thin layer upon a transparent substrate from the reflection spectrum", J. Phys. D: Appl. Phys., vol. 22, pp. 1157-1161, 1989.
[90] S. H. Fei, W. Can, S. Z. Pei, Z. Y. Liang, J. K. Juan, and Y. G. Zhen, "Transparent conductive reduced graphene oxide thin films produced by spray coating", Sci. China-Phys. Mech. Astron., vol. 58, pp. 014202, 2015.
[91] V. G. Kravets, O. P. Marshall, R. R. Nair, B. Thackray, A. Zhukov, J. Leng, and A. N. Grigorenko, "Engineering optical properties of a graphene oxide metamaterial assembled in microfluidic channels", Opt. Express, vol. 23, pp. 1265-1275, 2015.
[92] A. J. Haes, and R. P. V. Duyne, "A unified view of propagating and localized surface plasmon resonance biosensors", Anal. Bioanal. Chem., vol. 379, pp. 920-930, 2004.
[93] E. Kretschmann, and H. Raether, "Radiative decay of non radiative surface plasmons excited by light", Z. Naturforsch, vol. 23, pp. 2135-2136, 1968.
[94] A. Berna, "Metal oxide sensors for electronic noses and their application to food analysis", Sens., vol. 10, pp. 3882-3910, 2010.
[95] N. E. Barbri, A. Amari, M. Vinaixa, B. Bouchikhi, X. Correig, and E. Llobet, "Building of a metal oxide gas sensor-based electronic nose to assess the freshness of sardines under cold storage", Sens. Actuators B: Chem., vol. 128, pp. 235-244, 2007.
[96] M. O'Connell, G. Valdora, G. Peltzer, and R. M. Negri, "A practical approach for fish freshness determinations using a portable electronic nose", Sens. Actuators B: Chem., vol. 80, pp. 149-154, 2001.

[97] C. Wang, L. Yin, L. Zhang, D. Xiang, and R. Gao, "Metal oxide gas sensors: sensitivity and influencing factors", Sens., vol. 10, pp. 2088-2106, 2010.

[98] S. Tabassum, Y. Wang, J. Qu, Q. Wang, S. Oren, R. J. Weber, M. Lu, R. Kumar, and L. Dong, "Patterning of nanophotonic structures at optical fiber tip for refractive index sensing", 2016 IEEE Sensors, Orlando, Fl, 2016.

[99] J. E. Jackson, "A user's guide to principal components", John Wiley & Sons: Hoboken, N J, 2003.

[100] I. T. Jolliffe, "Principal component analysis", Springer: New York, 2002.

E. Options and Alternatives

As previously mentioned, variations obvious to those skilled in the art will be included with the invention. Some of those have been mentioned above. Further examples regarding Specific Example 1 are set forth below. Those skilled in the art will appreciate that at least some of these options and alternatives can be relevant to Specific Example 2 in analogous ways.

Underlying plasmonic crystal

The description above gives the example of an array of nanoposts with some metallization as the basis structure of the plasmon crystal for each sensor. It is to be understood that other form factors for the crystal are possible. A few non-limiting examples are:

a. Square lattice nanoposts;
b. Hexagonal lattice nanoposts;
c. Circle-shaped nanoposts;
d. Square-shaped nanoposts.

Nanoposts

The description above gives examples of form factors if nanoposts are used. This includes such things as:

a. diameter;
b. height;
c. periodicity.

Non-limiting examples of possible ranges for these factors are:

a. Diameter—5 to 5000 nm;
b. Height—5 to 5000 nm;
c. Periodicity—10 to 10000 nm.

The designer can select nanopost form factor (e.g. height and diameter), and other parameters of the array to produce various effects for the sensor.

Sensor substrate and nanopost material

In one form the sensor substrate is silicon and the replica molded nanoposts of polymeric solution are attached by an adhesive layer. The master mold is inverted and essentially stamps out the nanoposts from the globs of polymeric solution. The process then includes a UV lithography step to cure the molded nanoposts in place. Alternatives are possible. Examples are to use thermal treatment to cure the molded nanoposts in place.

a. Nanopost Metallization

As described above, one way of producing a plasmonic structure is simply layering the entire array of nanoposts (including all exposed portion tops, sides, and areas in-between) as well as exposed parts of top surface of the substrate with a metal layer. Gold is mentioned. It is possible that other metals could be used. Silver is one example, but other metals including alloys and perhaps even some semiconductor material are possible.

Additionally, as indicated, the metallization can vary. For example, having a complete metallized coating over the array of nano posts or just metallizing the very top of the posts can simplify number of optical resonance modes.

Techniques for metallizing just the tops include e-beam evaporation, thermal evaporation, and sputtering.

Another alternative described above is metallizing the tops of the posts with a metal disk to produce almost a mushroom form factor.

Master mold

As described in the specific example, PDMS is utilized for the master mold. Alternatives are possible. Examples are Polyurethane and Poly(methyl methacrylate). PDMS is a well-known material which can be produced with highly precise and accurate features, including nanoholes to produce a negative for the end-product nanoposts. It also is robust enough for use to produce multiple positive images.

Graphene Oxide (GO)

GO will adhere to at least most of the types of materials mentioned for the nanoposts and substrate.

The master mold could have separated areas of subsets of nanoposts. Each area could represent a separate sensor surface or area. By techniques such as are within the skill of those skilled in the art, a GO coating could be placed over each of those separate areas. It also could be varied in thickness as discussed above.

Alternatively, single sets of nanoposts on separate substrates could be produced by a similar process. Each of those separate sensors could then be placed in an integrated, overall sensor.

Variation of GO thickness

Examples of GO thicknesses have been given. Variations are possible of course. An aspect of the invention is the insight that GO's properties include the ability to coat a thin layer on metal or polymeric materials, the ability to absorb minute quantities of VOCs, and the ability to allow sensing of plasmonic effect via the underlying plasmonic topology. By empirical methods, the designer could select GO thickness options for a given application. In the above example, four thicknesses are described. There could be more or less, including just one.

One way to vary GO thickness described earlier is to prepare solutions of GO flakes, and vary the concentration of the GO flakes in the different solutions. Then the solution can be deposited over the selected portions of the underlying plasmon crystal structure and dried to leave a layer or coating of GO with thickness modulated by the beginning concentration in solution.

Alternatives for varying GO thickness are: varying period, height, diameter of nanoposts.

Use of the sensor element in an integrated sensor assembly

As will be appreciated by those skilled in the art, current MEMS techniques can be used to not only fabricate the sensors with their nanoscale features, but also apply the layers of metal and GO. MEMS can also be used to assembly the needed components in a small form factor housing or platform including multiple sensors and a base. This includes integration of an illumination source, optics, and translation or positioner for movement between sensors. Data channels or communication paths between or from those components to the appropriate processor are well known. Thus, the sensor assembly, including plural sensors, optics, etc. can at least be micronized on a chip by known MEMS techniques. The processor and display can be off-chip. Communication between the processor and chip can be by well-known techniques.

The designer can manipulate the morphology of the nanostructure. Here they are generically shown as rectangular nanoposts. They could have other form factors including nanocones, nanorods, or other.

At such a small form factor, processes known in the art can allow the accurate reproducible metal coating. Targeted partial coating is also possible.

Hagleitner, A. Hierlemann, D. Lange, A. Kummer, N. Kerness, O. Brand, and H. Baltes, "smart single-chip gas sensor microsystem", Nature, Vol. 404, pp. 293, 2001, incorporated by reference herein, gives details about integrated and small form factor MEMS-type systems.

Pattern Recognition

Previously cited and incorporated by reference Tabassum, et al., "Plasmonic crystal gas sensor incorporating graphene oxide for detection of volatile organic compounds," 2016 *IEEE 29th International Conference on Micro Electro Mechanical Systems (MEMS)*, Shanghai, 2016, pp. 913-916 give details about how the analysis could include pattern recognition and multi component analysis of sensor measurements. It includes details of how the sensor might be integrated into a chip. It includes an analysis of how absorption of an analyte in gas phase in a chemically sensitive polymer causes shifts in resonance frequency. The shifts can be recognized by the pattern recognition algorithm and correlated to a given chemical species.

References [28], [54] and [55] from Specific Example 2, above, also give examples of use of principal component analysis.

Plasmonic Effect

J. N. Anker, W. P. Hall, O. Lyandres, N. C. Shah, J. Zhao, and R. P. Van Duyne, "Biosensing with plasmonic nanosensors", Nature Materials, Vol. 7, pp. 442, 2008, incorporated by reference herein, gives more details of how plasmonic nanosensors can be utilized to analyze reflected light, including plasmon resonance and shifts to distinguish between chemical species.

See also References [9], [11], [13], [18]-[23], [27], [28], [32], [34], [42] and [47] of Specific Example 2, supra.

GO absorption of VCOs

Zöpfl A, Lemberger M M, Konig M, Ruhl G, Matysik F M, Hirsch T., Reduced graphene oxide and graphene composite materials for improved gas sensing at low temperature. Faraday Discuss. 2014; 173:403-14, incorporated by reference herein, gives more details how graphene oxide absorbs chemical species and can be evaluated using pattern recognition based on principal commercial component analysis to discriminate between different absorbed chemical species.

VOCs

The description above gives a few examples of VOCs that have been tested with the sensor apparatus and method according to the invention. It is to be understood that the techniques of the invention can could be applied in analogous ways to other VOCs. It may even be possible to apply these techniques to detect gaseous hormone species.

The invention claimed is:

1. A sensor for sensing for presence of concentrations of molecules of interest in an analyte based on measuring shift in resonant wavelength of incident light from refractive index modulation at the sensor comprising:
   a. a sensing element adapted for exposure to an analyte comprising:
      i. a cured or hardened array of nano-molded polymeric nanostructures of tunable refractive index by nanopatterning of form factor and periodicity adhered to a substrate, wherein the polymeric nanostructures have a regular periodicity and each have a relatively similar height and diameter;
      ii. an overlayer or deposit of optical resonance material over at least a portion of the polymeric nanoscale structures to produce a shift in resonance wavelength of incident light by guided mode resonance (GMR) or by plasmonic response, wherein the optical resonance material is overlaid on at least the tops of the polymeric nanostructures to achieve optical resonances over the nanopattern in the presence of illumination; and
      iii. an overlayer or deposit of graphene oxide (GO) or graphene composite material adhered over at least some of the optical resonance material to effectively absorb an analyte to be sensed;
   b. an illumination source to illuminate the sensing element, and
   c. a detector to receive and compare light from the sensing element to a reference to suggest the presence of the molecules of interest in an absorbed analyte based on measuring resonance shifts related to refractive index changes to the illumination from guided mode resonance or plasmonic response through the array and graphene oxide (GO) or graphene composite material.

2. The sensor of claim 1 wherein the sensing element is integrated with the substrate, the substrate comprising a cleaved tip of an optical fiber for a tunable guided mode resonant (GMR) waveguide.

3. The sensor of claim 1 wherein the sensing element is integrated with the substrate, the substrate comprising for a tunable plasmonic response surface.

4. The sensor of claim 1 wherein the optical resonance material comprises:
   a. gold (Au);
   b. gold (Au) over either titanium (Ti) or titanium nitride (TiN);
   c. a noble metal or alloy thereof;
   d. titanium or titanium dioxide ($TiO_2$);
   e. silver (Ag);
   f. metal alloys; or
   g. semiconductor material.

5. The sensor of claim 4 wherein:
   a. if the optical resonance material is gold or a noble metal or alloy thereof, a thickness is on the order of 50 nm;
   b. if the optical resonance material is gold over titanium or over titanium nitride; a thickness of gold is on the order of 50 nm and a thickness of titanium or titanium nitride is on the order of 5 nm.

6. The sensor of claim 1 wherein the graphene oxide (GO) or graphene composite material thickness is varied to promote absorption of different concentrations of the molecules of the analyte of interest and modulate refractive index of the sensing element for selective detection of different species of the analyte of interest.

7. The sensor of claim 6 wherein the graphene oxide (GO) or graphene composite material has a thickness on the order of 16.3 nm to 146 nm.

8. The sensor of claim 1 used for VOC detection, wherein for a VOC comprising acetone:
   a. the periodicity of the nanostructures of the array comprises on the order of 500 nm;
   b. the height of the nanostructures of the array comprises on the order of 210 nm; and
   c. the diameter of the nanostructures of the array comprises on the order of 250 nm.

9. The sensor of claim 1 further comprising plural said sensing elements, each said sensing element having the graphene oxide (GO) or graphene composite material of a different thickness to modulate a different refractive index for each of the plural sensing elements.

10. The sensor of claim 1 in combination with:
a. a processor operative connected to the detector of light to compare light from guided mode resonance (GMR) or plasmonic effect using a pattern recognition algorithm to discern patterns indicative of;
i. the presence of the molecules of the analyte of interest;
ii. different concentrations of the molecules of the analyte of interest; or
iii. different species of the molecules of the analyte of interest.

11. A system for sensing for presence of concentrations of molecules of interest in an analyte based on measuring shift in resonant wavelength of incident light from refractive index modulation comprising:
a. a sensor with a sensor surface capable of being exposed to the analyte, each sensor surface comprising:
a cured or hardened array of nano-molded polymeric nanostructures of tunable refractive index by nanopatterning of form factor and periodicity adhered to a substrate, the polymeric nanostructures comprising a material with refractive index control, wherein the polymeric nanostructures have a regular periodicity and each have a relatively similar height and diameter, the polymeric nanostructures coated at least in part with an optical resonance material to produce a shift in resonance wavelength of incident light by guided mode resonance (GMR) or by plasmonic response, wherein the optical resonance material is overlaid on at least the tops of the polymeric nanostructures to achieve optical resonances over the nanopattern in the presence of illumination, the optical resonance material coated at least in part with a graphene oxide (GO) or graphene composite material to effectively absorb the analyte to be sensed, wherein the graphene oxide (GO) or graphene composite material is overlaid on at least a portion of the optical resonance material;
b. a light source adapted to illuminate the sensor surface;
c. a light detector adapted to collect light from at the sensor surface;
d. an intelligent device to compare collected light to stored references and determine a correlation indicating presence of the molecules of interest based on measuring resonance shifts related to refractive index changes to the illumination from guide mode resonance or plasmonic response through the array, the optical resonance material, and the graphene oxide (GO) or graphene composite material.

12. The system of claim 11 wherein the sensor surface is integrated with the substrate, the substrate comprising a cleaved end of a fiber optic in a manner effective to generate a guided mode resonance (GMR) response.

13. The system of claim 11 wherein the sensor surface is integrated with the substrate in a manner effective to generate a plasmonic response.

* * * * *